US010683976B2

(12) United States Patent
Fukushima et al.

(10) Patent No.: US 10,683,976 B2
(45) Date of Patent: Jun. 16, 2020

(54) ILLUMINATION DEVICE AND ATTACHMENT MEMBER

(71) Applicants: KILT PLANNING OFFICE INC., Kawasaki-shi, Kanagawa (JP); KANEKA CORPORATION, Osaka-shi, Osaka (JP)

(72) Inventors: Koichi Fukushima, Iruma-gun (JP); Shozo Toyohisa, Kawasaki (JP); Harunobu Izumo, Kawasaki (JP); Youichi Yamaguchi, Tokyo (JP); Akira Nishikawa, Kamikita-gun (JP)

(73) Assignees: KILT PLANNING OFFICE INC., Kawasaki-Shi, Kanagawa (JP); KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 16/086,938

(22) PCT Filed: Mar. 13, 2017

(86) PCT No.: PCT/JP2017/009879
§ 371 (c)(1),
(2) Date: Sep. 20, 2018

(87) PCT Pub. No.: WO2017/187819
PCT Pub. Date: Nov. 2, 2017

(65) Prior Publication Data
US 2019/0104592 A1 Apr. 4, 2019

(30) Foreign Application Priority Data

Apr. 28, 2016 (JP) .................................. 2016-091938
Apr. 28, 2016 (JP) .................................. 2016-091939

(51) Int. Cl.
*F21V 21/02* (2006.01)
*F21S 8/00* (2006.01)
(Continued)

(52) U.S. Cl.
CPC ............... *F21S 8/024* (2013.01); *F21S 8/033* (2013.01); *F21V 19/04* (2013.01); *F21V 21/02* (2013.01);
(Continued)

(58) Field of Classification Search
CPC .......... F21V 19/042–047; F21V 19/003–0055; F21V 21/02; F21S 8/033; F21S 8/024
See application file for complete search history.

(56) References Cited

U.S. PATENT DOCUMENTS 9,307,585 B2 * 4/2016 Miura ..................... F21S 2/005
9,874,336 B2 * 1/2018 Kotera ................... F21V 19/003
(Continued)

FOREIGN PATENT DOCUMENTS

EP    2565532 A2 * 3/2013 ............. F21V 15/01
JP    2007250302 A    9/2007
(Continued)

OTHER PUBLICATIONS

International Bureau of WIPO, International Preliminary Report on Patentability Issued in Application No. PCT/JP2017/009879, dated Oct. 30, 2018, WIPO, 8 pages.
(Continued)

*Primary Examiner* — Mariceli Santiago
(74) *Attorney, Agent, or Firm* — Alleman Hall Creasman & Tuttle LLP

(57) ABSTRACT

The present invention provides an illumination device in which an organic EL panel is detachable from a mounting member; the panel has a panel body and a fixing member. The panel body has an emission surface on its front and a
(Continued)

circuit board on its rear. The fixing member has a main body and a raised part that is disposed on a rear of the panel and raised with respect to the main body to circumvent the circuit board and to protect the circuit board. The raised part includes a raised-side engagement part protruding in a direction crossing a raised direction. The mounting member has an attachment side main body and an attachment side engagement part. The attachment side engagement part extends from the attachment side main body to form a step. The engagement parts engage together when the panel is attached to the mounting member.

14 Claims, 41 Drawing Sheets

(51) Int. Cl.
| | | |
|---|---|---|
| *F21V 19/04* | (2006.01) | |
| *F21S 8/02* | (2006.01) | |
| *H01L 51/50* | (2006.01) | |
| *F21V 23/00* | (2015.01) | |
| *F21V 21/04* | (2006.01) | |
| *H05B 45/00* | (2020.01) | |
| *F21Y 105/00* | (2016.01) | |
| *F21Y 115/15* | (2016.01) | |

(52) U.S. Cl.
CPC .......... *F21V 21/047* (2013.01); *F21V 23/006* (2013.01); *F21Y 2105/00* (2013.01); *F21Y 2115/15* (2016.08); *H01L 51/5036* (2013.01); *H01L 2251/5361* (2013.01); *H05B 45/60* (2020.01)

(56) References Cited

U.S. PATENT DOCUMENTS

| | | |
|---|---|---|
| 2011/0248627 A1 | 10/2011 | Fukano et al. |
| 2013/0051078 A1* | 2/2013 | Kotera .................... F21V 27/00 |
| | | 362/631 |
| 2013/0279181 A1 | 10/2013 | Kawachi et al. |
| 2013/0329438 A1* | 12/2013 | Wakahara ............. F21V 19/003 |
| | | 362/396 |
| 2014/0009924 A1 | 1/2014 | Kotera et al. |
| 2015/0137710 A1 | 5/2015 | Miura |
| 2015/0230317 A1 | 8/2015 | Hayashi et al. |

FOREIGN PATENT DOCUMENTS

| | | | |
|---|---|---|---|
| JP | 2009037998 A | | 2/2009 |
| JP | 2011222223 A | | 11/2011 |
| JP | 2013051044 A | * | 3/2013 |
| JP | 2014149972 A | | 8/2014 |
| JP | 2015022932 A | | 2/2015 |

OTHER PUBLICATIONS

European Patent Office, Supplementary European Search Report Issued in Application No. 17789108, dated Feb. 7, 2019, Germany, 2 pages.

ISA Japan Patent Office, International Search Report Issued in Application No. PCT/JP2017/009879, dated Apr. 25, 2017. WIPO, 3 pages.

* cited by examiner

T REGION

ILLUMINATION DEVICE AND ATTACHMENT MEMBER

TECHNICAL FIELD

The present invention relates to an illumination device provided with an organic EL panel and to be attached to a wall surface. The present invention also relates to a mounting member for attaching an organic EL panel to a wall surface.

BACKGROUND ART

Since an organic EL panel has a surface emitting structure and a wide illuminating range, it is widely used from the past as an illumination device. This organic EL panel typically has an organic EL element laminated on a substrate such as a glass substrate, and includes a sealing structure to seal the organic EL element and a power supply structure to supply power to the organic EL element. Further, the organic EL element is made by opposing two electrodes one or both of which have a light transmittance, and laminating a light-emitting layer containing an organic compound between these electrodes.

In an illumination device using an organic EL panel, there are cases where a used organic EL panel is replaced with a new organic EL panel in performing maintenance or the like. In such a case, it is preferable that the organic EL panel can be easily replaced. Therefore, Patent Document 1 discloses a structure capable of replacing a used illumination unit with a new illumination unit.

PRIOR ART DOCUMENTS

Patent Documents

Patent Document 1: JP 2014-149972 A
Patent Document 2: JP 2007-250302 A

DISCLOSURE OF INVENTION

Technical Problem

In recent years, there have been developed illumination devices capable of implementing color tuning control to adjust color temperature and dimming control to adjust brightness by mounting a circuit board on an organic EL panel. In such an organic EL panel with such a circuit board mounted on a rear face side of the organic EL panel, it is necessary to form a mounting part on a rear face side of the circuit board such that the circuit board is not compressed or the like. Therefore, there has been a problem that a thickness of the organic EL panel increases by a thickness of the circuit board, which impairs an advantage of thinness of the organic EL panel.

Therefore, it is an object of the present invention to provide an illumination device that allows replacement of an organic EL panel, includes an organic EL panel mounted with a circuit board, and is made thinner than those by the conventional arts.

Solution to Problem

In order to solve the problems described above, one aspect of the present invention is an illumination device including: an organic EL panel; and a mounting member configured to attach the organic EL panel to a wall surface, the organic EL panel being attachable to and detachable from the mounting member, wherein the organic EL panel includes: a panel body having an emission surface on its front face side and a circuit board on its rear face side; and a fixing member having a main body and a raised part, wherein the raised part is disposed on a rear face side of the organic EL panel and raised from the main body to circumvent the circuit board and to protect a part or whole of the circuit board, wherein the raised part includes a raised-side engagement part protruding in a direction crossing a raised direction, wherein the mounting member includes: an attachment side main body; and an attachment side engagement part extending from the attachment side main body to form a step with respect to the attachment side main body, and wherein the raised-side engagement part is engaged with the attachment side engagement part when the organic EL panel is attached to the mounting member.

The term "wall surface" as used herein means a wall surface of a fixed structure, an article, or the like, for example, a wall surface forming an outer surface of a ceiling, a wall, a floor, a desk, and the like.

According to this aspect, since the raised part protrudes to circumvent the circuit board, and the raised part protects the circuit board, the circuit board is unlikely to be damaged by an external factor such as pressure. According to this aspect, since attachment is performed by engaging the attachment side engagement part with the raised-side engagement part provided on the raised part that protects the circuit board, a thickness of the illumination device is reduced as compared with the related art.

Here, in a lighting fixture described in Patent Document 1, in replacing a used illumination unit, a bolt fixing a diffusion cover is loosen with a screwdriver or the like, and then the used illumination unit is detached and replaced with a new illumination unit. Then, after replacement, the bolt must be fixed again with a screwdriver to assemble. For this reason, there has been a problem that replacement of the illumination unit is troublesome.

Therefore, in order to enable easy replacement of the organic EL panel, a preferable aspect derived is that the raised part includes at least two of the raised-side engagement parts protruding in the direction crossing the raised direction, the two raised-side engagement parts protruding in a direction away from each other, the mounting member includes at least two of the attachment side engagement parts, the two attachment side engagement parts having a step with respect to the attachment side main body and extending in a direction approaching each other, and when the organic EL panel is attached to the mounting member, the organic EL panel is slid relatively to the mounting member in a spreading direction of the emission surface, with the raised part between the two attachment side engagement parts, to engage the two raised-side engagement parts with the two attachment side engagement parts.

According to this aspect, it is possible to attach the organic EL panel to the mounting member without attaching a fastening element such as a screw with a jig including a screwdriver.

Installation of an illumination device is not limited to a case where the illumination device is installed on a wall surface substantially without unevenness, but there is a case where the illumination device is installed on a wall surface having an opening such as a duct rail (e.g., Patent Document 2). In such a case, in accordance with a type of the wall surface to be installed with, a mounting member to install an organic EL panel on the wall surface has been separately formed and used. This has caused a problem of requiring a plurality of metal molds, and increasing manufacturing cost of the mounting member.

Therefore, in order to enable a mounting member configured to attach the organic EL panel to correspond to a plurality of types of wall surfaces and wall environments, a preferable aspect derived is that the mounting member includes: the attachment side main body; and at least two of the attachment side engagement parts, the two attachment side engagement parts including a first and a second attachment side engagement parts, the first attachment side engagement part extending from the attachment side main body to form a step on a first main surface side of the attachment side main body, the second attachment side engagement part extending from the attachment side main body to form a step on a second main surface side of the attachment side main body, and the mounting member engages the raised-side engagement part with the first attachment side engagement part to fix the organic EL panel to the first main surface side whereas the mounting member engages the raised-side engagement part with the second attachment side engagement part to fix the organic EL panel to the second main surface side.

According to this aspect, the mounting member fixes the organic EL panel to a first main surface side of the main body by engaging the raised-side engagement part provided on the raised part of the organic EL panel with a first attachment side engagement part, and the mounting member fixes the organic EL panel to a second main surface side of the main body by engaging the raised-side engagement part provided on the raised part of the organic EL panel with the second attachment side engagement part. That is, according to this aspect, since the organic EL panel is attachable to either of both main surface sides of the mounting member, it is possible to correspond to two installation environments with one mounting member. Therefore, for example, by forming a first main surface side of the mounting member in a shape to conform to a wall surface not having an opening portion, and forming a second main surface side of the mounting member in a shape to conform to a wall surface having an opening portion, it is possible to correspond to both wall surfaces regardless of the presence or absence of the opening portion. Therefore, it is unnecessary to form the mounting member in conformity with each of wall surfaces, enabling reduction of manufacturing cost as compared with the related art.

Further, according to this aspect, since it is possible to appropriately correspond to both wall surfaces of a wall surface not having an opening portion and a wall surface having an opening portion, it is unnecessary to select the mounting member at an installation site according to a wall surface to be attached with the organic EL panel, providing excellent workability as compared with the related art.

As described above, according to this aspect, it is possible to correspond to a plurality of types of wall surfaces and wall environments, and to install according to the environment of the wall to be installed with, providing excellent environmental adaptability.

In a preferred aspect, the raised part includes: a first and a second raised parts; and a slide groove, the first raised part being stepwise continuous with the second raised part, the slide groove being at a boundary portion between the first and the second raised parts, the two raised-side engagement parts project from the second raised part toward the slide groove, and when the organic EL panel is attached to the mounting member, a part of the attachment side engagement part is disposed in the slide groove to move along the slide groove.

According to this aspect, since the first raised part and the second raised part have a step, and a part of the attachment side engagement part is disposed in the slide groove and moves along the slide groove in attaching the organic EL panel to the mounting member, the organic EL panel is guided by the slide groove to easily match a proper attachment position even if the position is misaligned to some extent.

In a preferable aspect, when the organic EL panel is fixed to the first main surface side of the attachment side main body, the organic EL panel is slid relatively to the mounting member in a spreading direction of the emission surface to engage the raised-side engagement part with the first attachment side engagement part.

According to this aspect, even if a force is applied in a direction orthogonal to the emission surface of the organic EL panel, the raised-side engagement part is unlikely to be disengaged from the first attachment side engagement part.

In a preferable aspect, the mounting member includes an attachment side locking piece, the raised part includes a slide groove having a panel side locking piece that extends in a direction crossing an extending direction of the slide groove, and the attachment side locking piece engages with the panel side locking piece to regulate a movement of the organic EL panel in the extending direction of the slide groove.

According to this aspect, a position of the organic EL panel is unlikely to be displaced from a state in which the organic EL panel is attached to the mounting member, and the organic EL panel is unlikely to come off due to gravity or the like.

In a preferred aspect, the circuit board includes a control switching part having a function of switching at least two types of control signals, the raised part includes a switching through hole, and the control switching part is in an exposed location from the switching through hole to allow switching of the two types of control signals from outside the organic EL panel.

According to this aspect, it is possible to perform operation for switching at least two types of control signals from outside the organic EL panel, so that one type of organic EL panel can deal with a plurality of control signals.

In a preferred aspect, the raised part includes at least two of the raised-side engagement parts, the mounting member includes at least two of the attachment side engagement parts, the attachment side main body includes a first through hole, the two attachment side engagement parts are provided along an opening of the first through hole, and extend from the opening of the first through hole to an inside thereof when the opening of the first through hole is viewed in a plan view, and the raised part is inserted into the first through hole while the two attachment side engagement parts are engaged with the two raised-side engagement parts.

According to this aspect, the two attachment side engagement parts are engaged with the two raised-side engagement parts in a state in which the raised part is fitted into the through hole, enabling further reduction of a projecting length (thickness) of the organic EL panel from the wall surface. Therefore, it is possible to further utilize the advantage of thinness of the organic EL panel.

In a preferred aspect, the raised part includes at least two of the raised-side engagement parts, the two raised-side engagement parts being parallel to the emission surface.

According to this aspect, the organic EL panel is unlikely to incline in a thickness direction.

In a preferable aspect, the fixing member has an electrical insulation property.

The "electric insulating property" as used herein means that the electric resistivity is 1 Ω·cm or more.

According to this aspect, since the circuit board is covered and protected by the raised part having an electrical insulation property, electrical safety is high.

In the above-described aspect, the organic EL panel has an organic EL element; the circuit board has a connector portion and a constant current generating element; and the connector portion may be electrically connected to the organic EL element via the constant current generating element.

According to this aspect, a constant current flows through the organic EL element.

In the above-described aspect, the organic EL panel has an organic EL element; the circuit board has at least two connector portions; the two connector portions each are electrically connected to the organic EL element independently; and further, the two connector portions may bypass the organic EL element to be electrically connected.

According to this aspect, power is supplied to the organic EL element regardless of which connector portion is connected to the cable or the like. According to this aspect, for example, when an external connector is connected to one of the connector portions, and a cable or the like connected to a connector portion of another organic EL panel is connected to another one of the connector portions, it is possible to use its own organic EL panel as a connection cable to supply power to another organic EL panel.

In a preferable aspect, the organic EL panel includes an organic EL element, the circuit board includes a connector portion electrically connected to the organic EL element, the raised part includes a connector notch or a connector through hole, and the connector portion is in an exposed location from the connector notch or an opening of the connector through hole, the connector notch or the opening of the connector through hole being located on the raised part.

In the above-described aspect, the raised part has a connector notch or a connector through hole, and the two connector portions may be in an exposed location from the raised part via an opening of the connector notch or the connector through hole.

According to the above aspect, it is easy to connect a cable or the like to each of the connector portions.

In the above-described aspect, the organic EL panel has a light-emitting region that emits light during lighting and a casing region that surrounds a periphery of the light-emitting region in a front view, and the mounting member has an opening portion through which the raised part is insertable. When a length of the organic EL panel in the sliding direction of the organic EL panel is W (mm), each length of the casing region is w (mm), and a length of the opening portion is P (mm), then the following Expression (1) may be satisfied.

$$-10 < W - 2w - P < 10 \tag{1}$$

According to this aspect, a difference between the length (W−2w) of the light-emitting region and the opening portion P is ±10 mm or less, providing a stylish illumination device with little spatial waste.

In a preferred aspect, the attachment side main body has two sides, the two sides facing to each other in a sliding direction of the organic EL panel, and when the organic EL panel is viewed in a front view with the raised-side engagement part engaged with the attachment side engagement part, the two sides overlap with the organic EL panel.

According to this aspect, since the two opposing sides of the main body are concealed by the organic EL panel in a front view, the mounting member is hard to see from a user, providing high design property.

In a preferred aspect, the mounting member includes: the attachment side main body; a vertical wall part; and a fixing wall part, the attachment side main body has a plate shape, the fixing wall part is provided on a first main surface side of the attachment side main body, the fixing wall part being continuous with the attachment side main body through a step composed of the vertical wall part, and when the organic EL panel is fixed to the first main surface side, the fixing wall part forms a virtual plane identical to a surface on a side of the emission surface of the organic EL panel.

According to this aspect, the surface on the side of the emission surface of the organic EL panel does not project from the fixing wall part of the mounting member, providing high design property.

In one aspect of the present invention, a mounting member for attaching an organic EL panel to a wall surface detachably and attachably, wherein the organic EL panel includes: a panel body having an emission surface on its front face side and a circuit board on its rear face side; and a fixing member having a main body and a raised part, the fixing member having a plate shape, wherein the raised part is disposed on a rear face side of the organic EL panel and raised from the main body to avoid the circuit board, wherein the raised part includes a raised-side engagement part protruding in a direction crossing a raised direction, wherein the mounting member includes: an attachment side main body having a plate shape; and a first and a second attachment side engagement parts, the first attachment side engagement part extending from the attachment side main body to form a step on a first main surface side of the attachment side main body, the second attachment side engagement part extending from the attachment side main body to form a step on a second main surface side of the attachment side main body, and wherein the mounting member engages the raised-side engagement part with the first attachment side engagement part to fix the organic EL panel to the first main surface side whereas the mounting member engages the raised-side engagement part with the second attachment side engagement part to fix the organic EL panel to the second main surface side.

According to this aspect, since the organic EL panel is attachable to both main surface sides of the mounting member, it is possible to correspond to two installation environments with one mounting member. Therefore, for example, by forming a first main surface side of the mounting member in a shape to conform to a wall surface not having an opening portion, and forming a second main surface side of the mounting member in a shape to conform to a wall surface having an opening portion, it is possible to correspond to both wall surfaces. Therefore, it is unnecessary to form the mounting member in conformity with each of wall surfaces, enabling reduction of manufacturing cost as compared with the related art.

According to this aspect, since it is possible to appropriately correspond to both wall surfaces of a wall surface not having opening portion and a wall surface having an opening portion, it is unnecessary to select a mounting member at an installation site according to a wall surface to be attached with the organic EL panel, providing excellent workability as compared with the related art.

Effect of Invention

According to the present invention, an organic EL panel is replaceable, mounted with a circuit board and thinner than those by the related art.

BRIEF DESCRIPTION OF DRAWINGS

FIGS. 20A to 20C are explanatory views focusing on a relationship of a main part of FIG. 19, wherein FIG. 20A is a perspective view of the main part as viewed from the rear face side, FIG. 20B is a cross-sectional view of the main part, and FIG. 20C is a cross-sectional view of the main part, different from FIG. 20B.

FIGS. 25A and 25B are explanatory views showing attachment of the illumination device of FIG. 23 to a wall surface, wherein FIG. 25A is a perspective view showing attachment of a holder member to the wall surface, and FIG. 25B is a perspective view showing attachment of an organic EL panel to the holder member.

FIGS. 33A and 33B are explanatory views showing attachment of the illumination device of FIG. 29 to a wall surface, wherein FIG. 33A is a perspective view showing attachment of a holder member to the wall surface, and FIG. 33B is a perspective view showing attachment of an organic EL panel to the holder member.

FIGS. 34A and 34B are explanatory views focusing on a relationship of a main part of FIG. 29, wherein FIG. 34A is a cross-sectional view of the main part, and FIG. 34B is a cross-sectional view of the main part, different from FIG. 34A.

FIGS. 38A and 38B are explanatory views showing attachment of the illumination device of FIG. 29 to another wall surface different from that of FIGS. 33A and 33B, wherein FIG. 38A is a perspective view showing attachment of a holder member to the wall surface, and FIG. 38B is a perspective view showing attachment of an organic EL panel to the holder member.

FIGS. 43A and 43B are perspective views showing an application example of another embodiment of the present invention, wherein FIG. 43A is a view of attachment to a wall surface, and FIG. 43B is a view in attaching an illumination device to a decorative plate.

BEST MODE FOR CARRYING OUT THE INVENTION

Hereinafter, embodiments of the present invention will be described in detail. In the following description, a posture is based on that in FIG. 1 unless otherwise noted.

Figure 1:
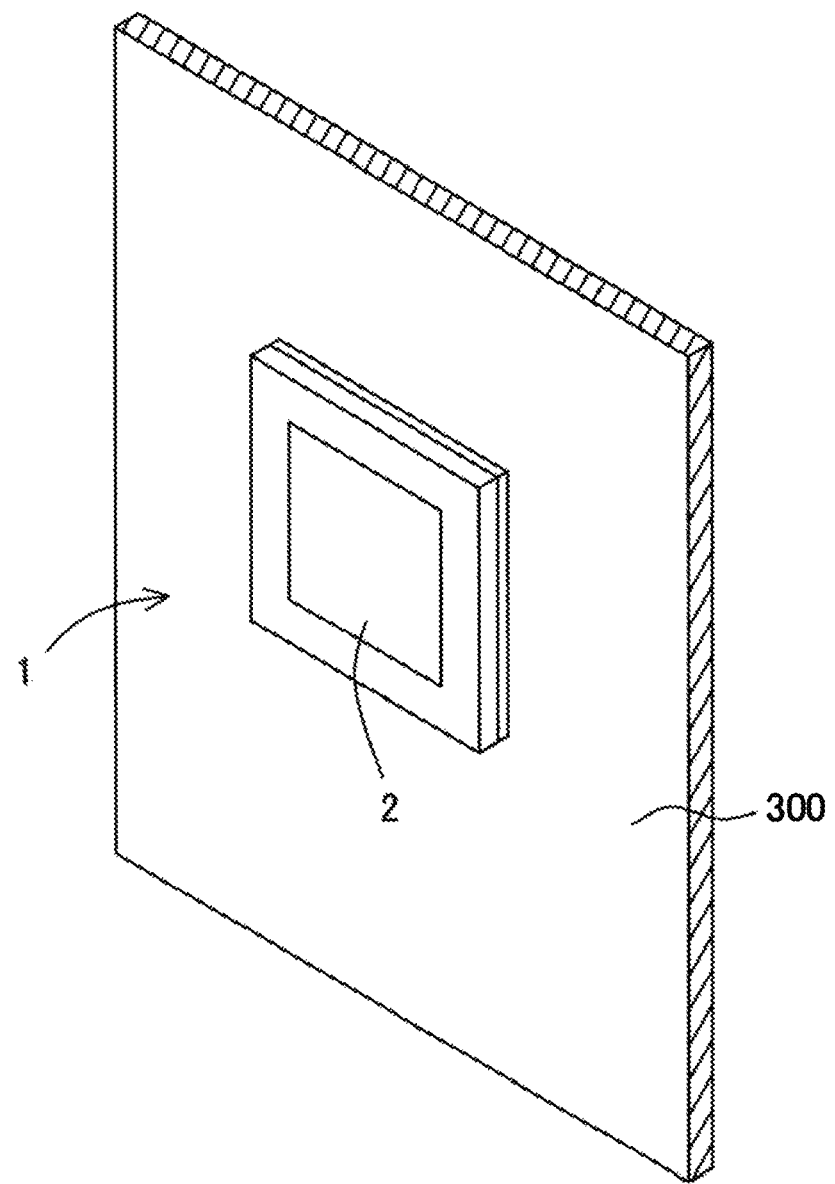
FIG. 1 is a perspective view schematically showing an application example of an illumination device of the present invention.
Figure 2:
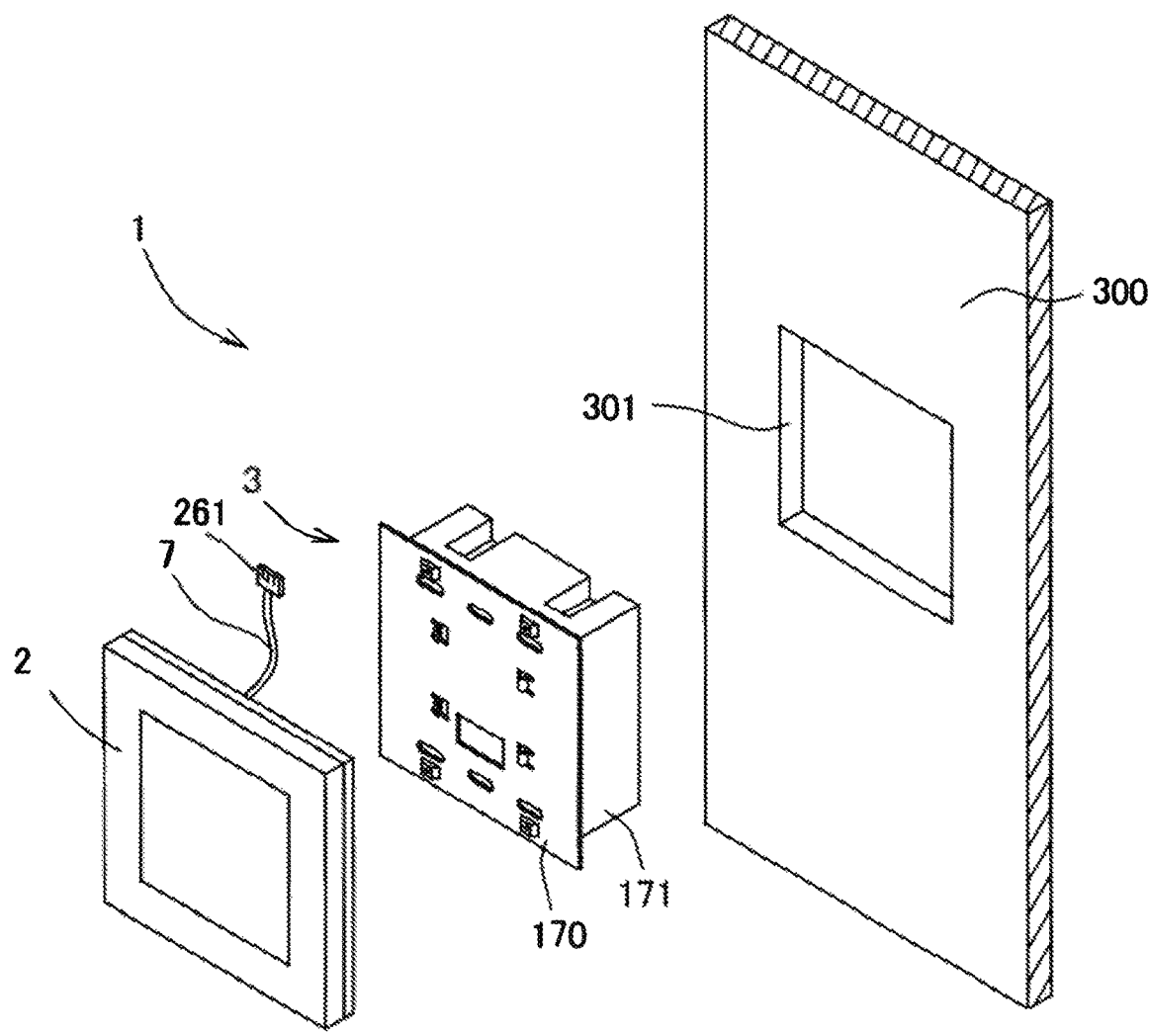
FIG. 2 is an exploded perspective view of the illumination device of FIG. 1.

As can be seen from FIGS. 1 and 2, an illumination device 1 according to a first embodiment of the present invention is to be attached to an opening portion 301 of a wall surface 300 standing upright with respect to a floor surface.

As shown in FIG. 2, the illumination device 1 of this embodiment includes an organic EL module 2 and an attachment unit 3, and the organic EL module 2 and the attachment unit 3 are detachable from each other by sliding the organic EL module 2 relatively to the attachment unit 3 attached to the wall surface 300.

Figure 3:
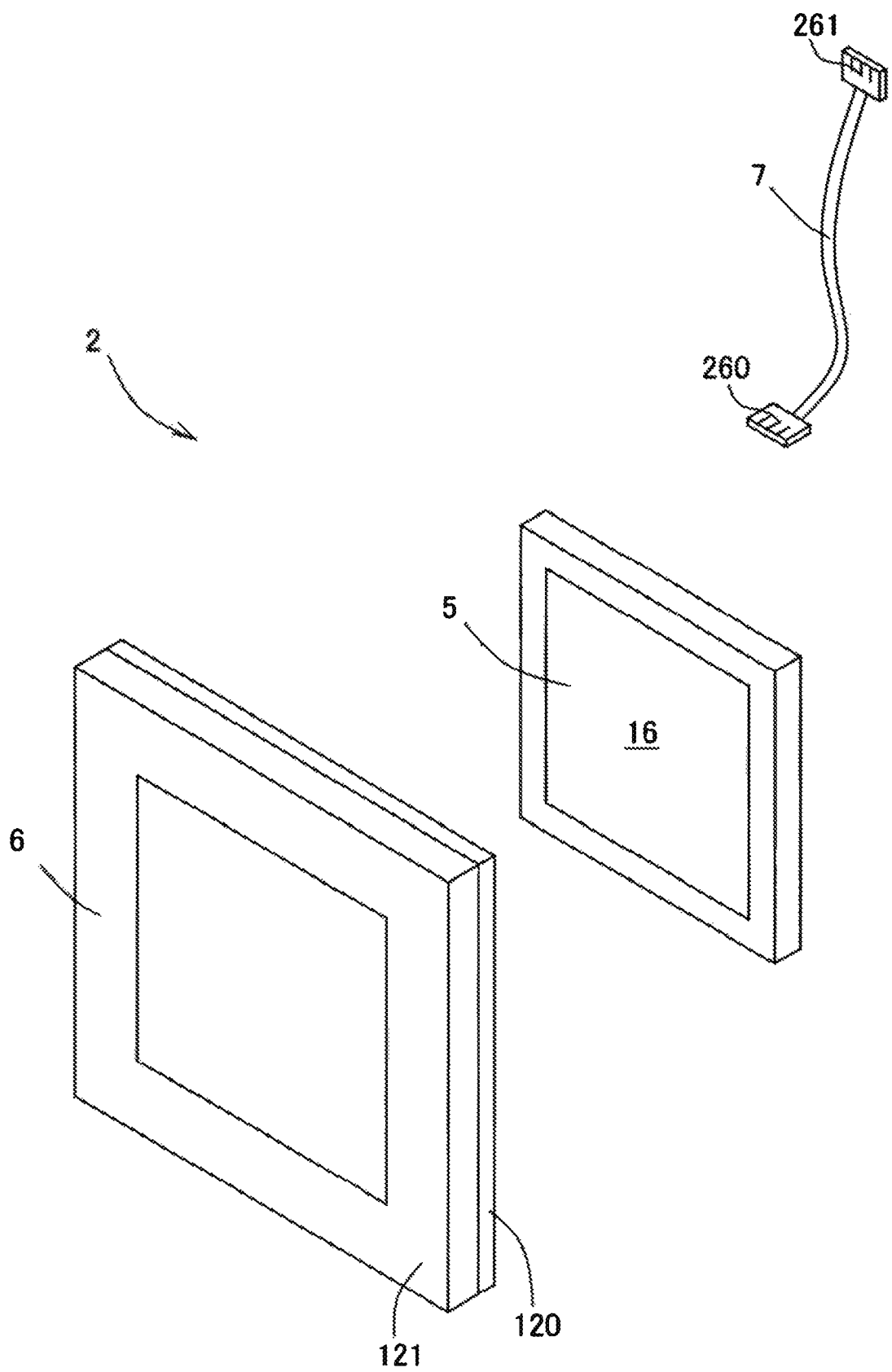
FIG. 3 is an exploded perspective view of an organic EL module of FIG. 2.

As shown in FIG. 3, the organic EL module 2 has an organic EL panel 5, a decorative member 6, and a cable member 7, and is an illumination module capable of emitting desired light from the organic EL panel 5 by supplying power from the cable member 7 to the organic EL panel 5.

Figure 4:
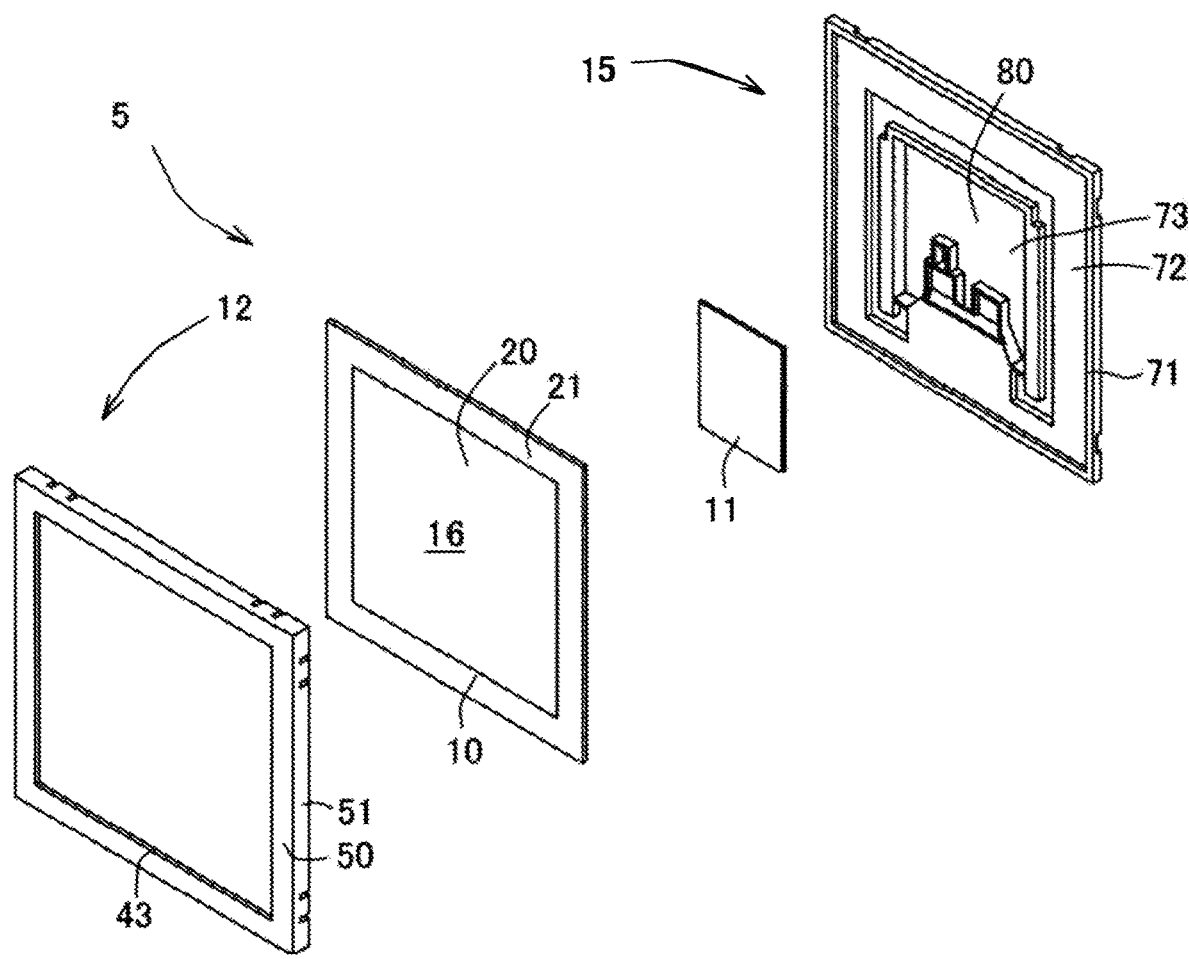
FIG. 4 is an exploded perspective view of an organic EL panel of FIG. 3.

As can be seen from FIG. 3, the organic EL panel 5 is a quadrangular plate-shaped panel in a front view, and is a light-emitting panel having an emission surface 16 having a rectangular shape. As shown in FIG. 4, the organic EL panel 5 includes a panel body 10, a circuit board 11, a protective member 12, and a fixing member 15.

The panel body 10 is an organic EL device incorporating an organic EL element, and the organic EL element can emit light when energized. In this organic EL element, an organic light-emitting layer including an organic compound layer is sandwiched between two opposing electrode layers.

Figure 7:
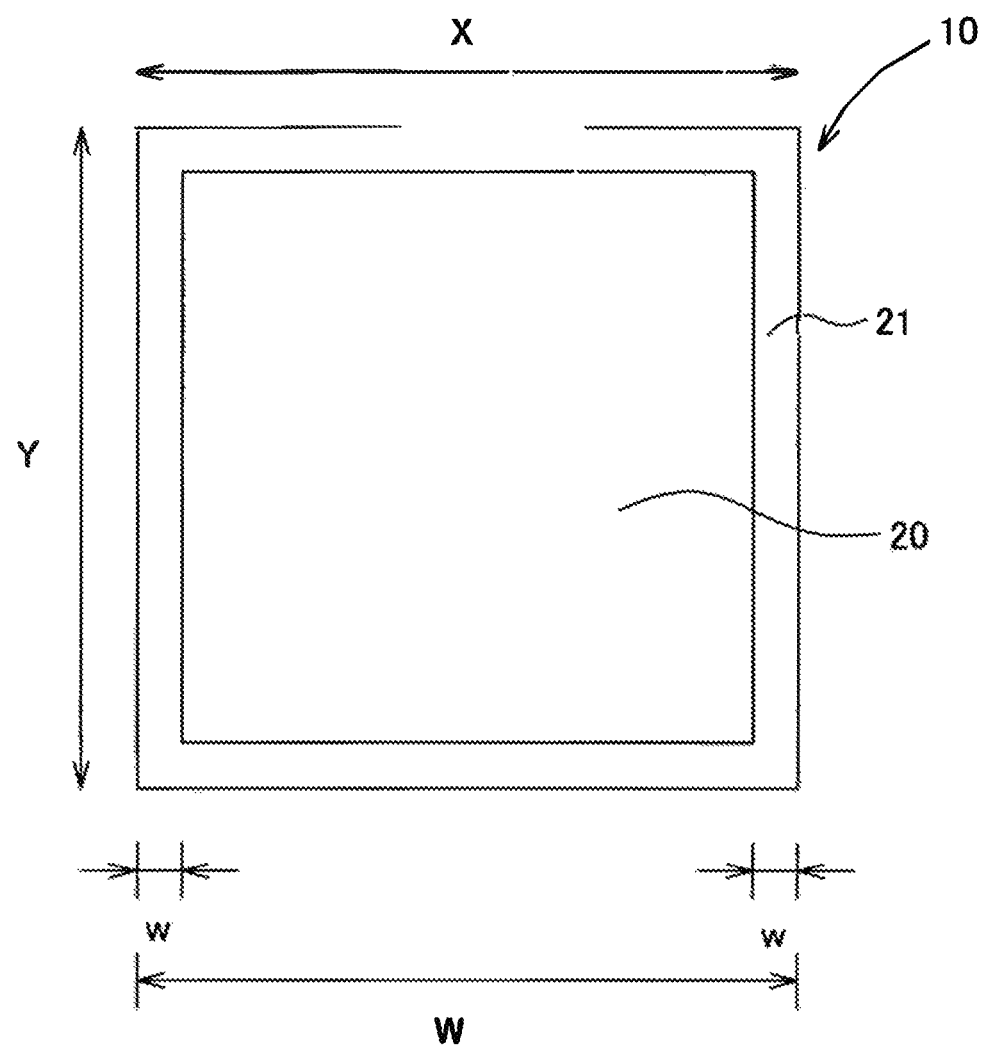
FIG. 7 is a front view of a panel body of FIG. 4.

As shown in FIG. 7, in the panel body 10 in a front view, a light-emitting region 20 is disposed in a central portion, and a casing region 21 is disposed so as to surround a periphery of the light-emitting region 20.

The light-emitting region 20 is a light-emitting region that emits light during lighting, and can emit light with a desired emission color. The casing region 21 is a region other than the light-emitting region 20, and is a non-light-emitting region that emits no light during lighting. The casing region 21 is annularly continuous around the light-emitting region 20.

Figure 5:
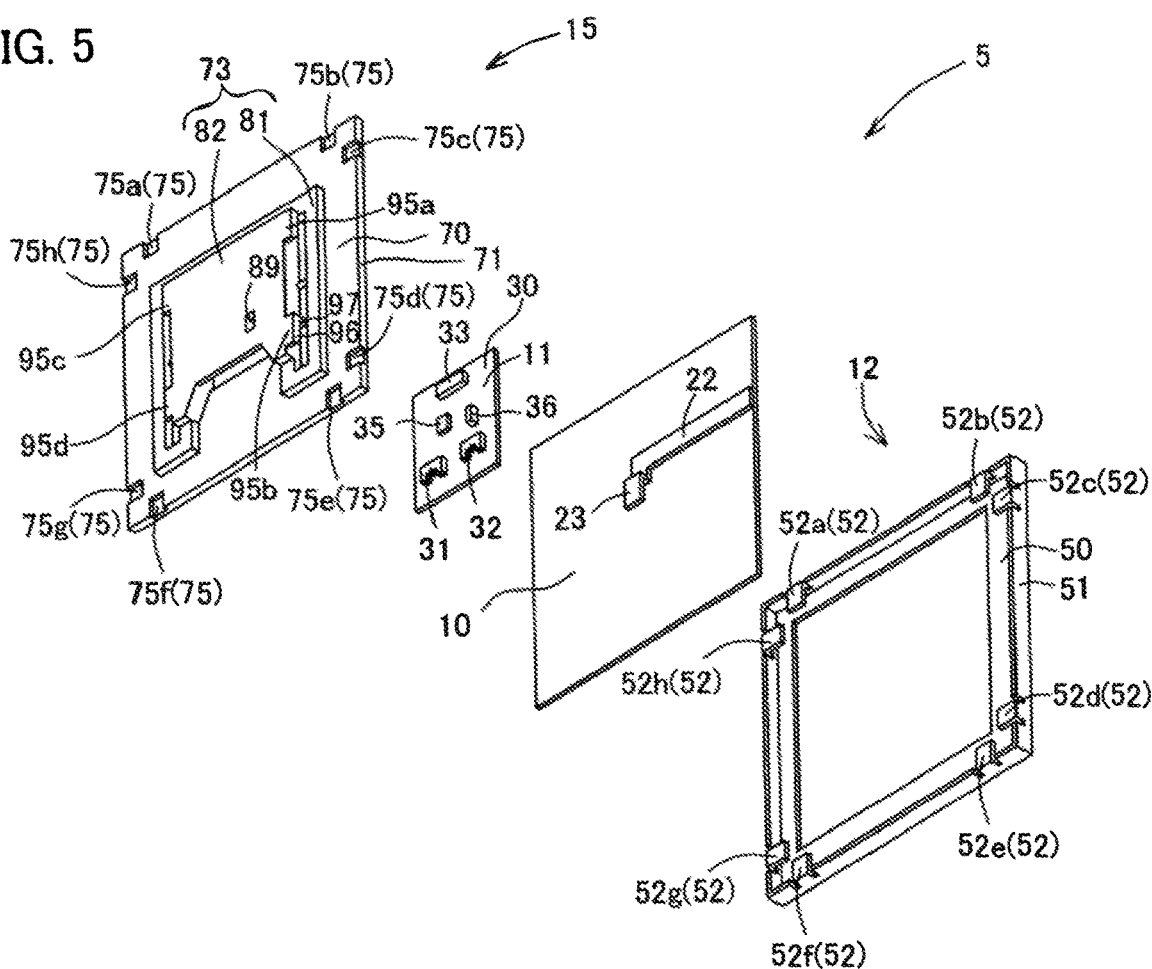
FIG. 5 is an exploded perspective view of the organic EL panel of FIG. 3, as viewed from a rear face side.
Figure 6:
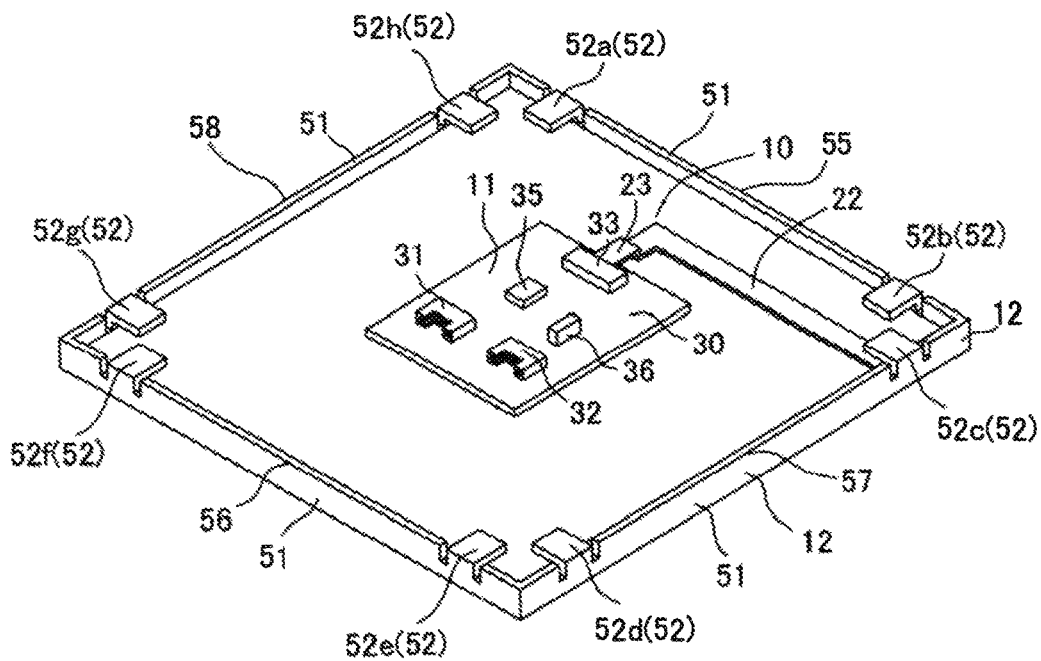
FIG. 6 is a perspective view of the organic EL panel of FIG. 3 as viewed from the rear face side, in which a fixing member is omitted.

As can be seen from FIGS. 5 and 6, on a rear face of the panel body 10, there is provided a panel side power supply portion 22.

The panel side power supply portion 22 is a part to be electrically connected to the organic EL element inside the panel body 10, and extends in a tongue shape from near an end of the panel body 10. That is, the panel side power supply portion 22 is supported in a cantilever manner from near an edge of the panel body 10, and has a panel side connector portion 23 at a distal end thereof.

As can be seen from FIG. 6, the panel side connector portion 23 is a connector that is connected to a panel connector portion 33 of the circuit board 11, to electrically connect the organic EL element of the panel body 10 to the circuit board 11, when the organic EL panel 5 is assembled. Specifically, the panel side connector portion 23 is a male connector, and can be inserted into the panel connector portion 33 of the circuit board 11.

The circuit board 11 is a control board that controls dimming and the like for the organic EL element of the panel body 10. As shown in FIG. 6, the circuit board 11 includes a supporting substrate 30 having a plate shape and main component members thereon, such as connecting connector portions 31 and 32, the panel connector portion 33, a constant current generating element 35, and a control switching part 36.

The supporting substrate 30 is a printed circuit board, and formed with a printed wiring line (not shown).

The connecting connector portions 31 and 32 are connectors connectable to a connector portion 260 (see FIG. 3) of the cable member 7, and can externally receive a plurality of control signals and externally receive power by connecting to the connector portion 260 of the cable member 7. Specifically, both of the connecting connector portions 31 and 32 are female connectors having a shape identical to each other, and can be connected with the connector portion 260 of the cable member 7.

The connecting connector portions 31 and 32 have common terminals for at least two positive and negative power sources. The connecting connector portions 31 and 32 each of this embodiment are provided with common terminals for two signals in addition to the positive common terminal and the negative common terminal. Various common terminals of the connecting connector portion 31 and various common terminals of the corresponding connecting connector portion 32 are respectively short-circuited.

Figure 8:
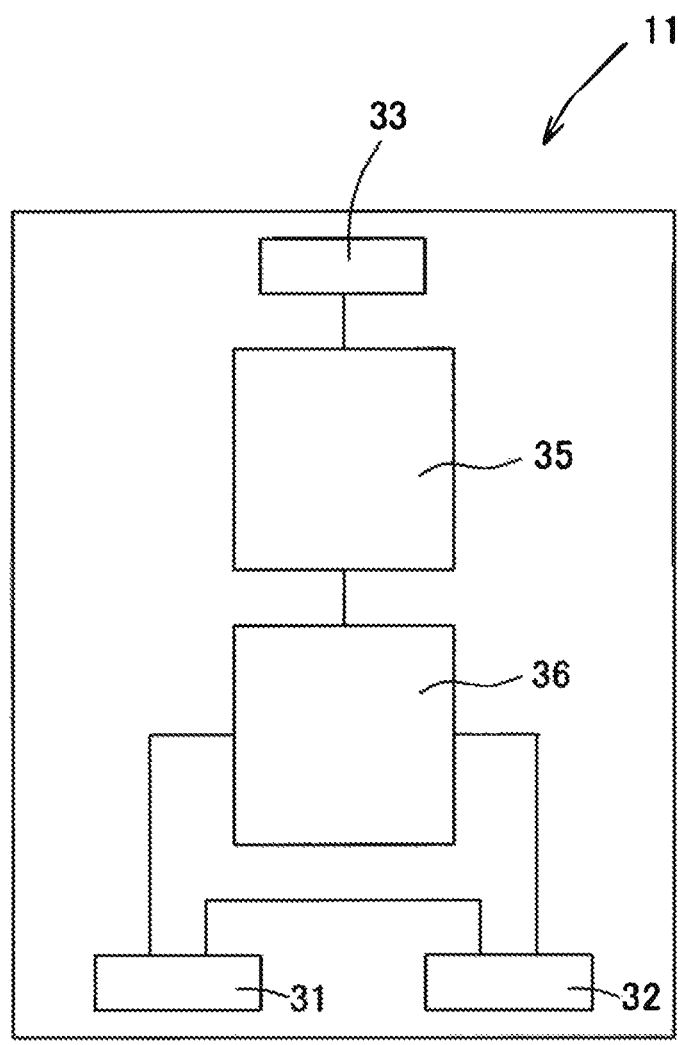
FIG. 8 is a block diagram schematically showing an electric circuit of a circuit board of FIG. 5.

As seen from another viewpoint, the circuit board 11 includes a connection circuit connected to the panel connector portion 33 from the connecting connector portions 31 and 32 as shown in FIG. 8, and a detour circuit that directly connects the connecting connector portions 31 and 32 without being connected to the panel connector portion 33, and these circuits are independent of each other.

The panel connector portion 33 is a power supply connector that supplies power to the panel body 10. Specifically, as shown in FIG. 6, the panel connector portion 33 is a female connector, and can be inserted the panel side connector portion 23 thereinto.

The constant current generating element 35 is a control element that performs control to supply a constant current to the organic EL element of the panel body 10. That is, the circuit board 11 is capable of supplying a constant current to the panel body 10 via the constant current generating element 35.

The control switching part 36 is a switch to select and switch a plurality of types of control signals input from the connecting connector portion 31 or the connecting connector portion 32. The control switching part 36 of the present embodiment can switch two types of control signals.

A positional relationship and a connection relationship of individual parts of the circuit board 11 will be described.

In the circuit board 11, as shown in FIG. 6, the connecting connector portions 31 and 32, the panel connector portion 33, the constant current generating element 35, and the control switching part 36 are individually mounted on one side of the supporting substrate 30.

The connecting connector portions 31 and 32 are arranged aligned at or near an end of the supporting substrate 30, along one side. The panel connector portion 33 is disposed at or near an end of the supporting substrate 30 and on an opposite side to the connecting connector portions 31 and 32. Each of the connector portions 31, 32, and 33 has its opening facing outward when the supporting substrate 30 is viewed in a plan view, and the openings of the connecting connector portions 31 and 32 and the opening of the panel connector portion 33 are directed away from each other.

As shown in FIG. 8, the panel connector portion 33 is electrically connected to the connecting connector portions 31 and 32 via the constant current generating element 35 and the control switching part 36. In addition, the connecting connector portions 31 and 32 are electrically connected without passing through the panel connector portion 33.

As shown in FIG. 5, the protective member 12 is a protective case to protect a peripheral end of the panel body 10 and its vicinity, and is an insulating case having an electrical insulation property. The electrical resistivity of the protective member 12 is preferably 1 Ωcm or more, and more preferably $10^6$ Ωcm or more.

As shown in FIG. 5, the protective member 12 is composed of a light-emitting side cover 50, an end face side cover 51, and a protection side fixing piece 52.

As shown in FIG. 4, the light-emitting side cover 50 is a part covering a part of a front face of the panel body 10 (the emission surface 16 side), and is a part covering the casing region 21 of the panel body 10 in this embodiment. The light-emitting side cover 50 annularly extends along an edge of the light-emitting region 20 and forms one opening portion 43. That is, light emitted from the light-emitting region 20 can pass through the opening portion 43 to be externally taken out.

The end face side cover 51 is a part covering a part or whole of an end face of the panel body 10, and is a wall part provided upright in a thickness direction of the organic EL panel 5 from an outer end of the light-emitting side cover 50 in a front view.

As can be seen from FIG. 5, the protection side fixing piece 52 (52a to 52h) is a locking piece to be attached to the fixing member 15, and is bent inward from an end of the end face side cover 51 (an end on a side opposite to the light-emitting side cover 50).

In the protective member 12, the protection side fixing pieces 52a and 52b are arranged aligned along one lateral side with an interval in a rear view, while the protection side fixing pieces 52f and 52e are arranged aligned along another lateral side with an interval. The protection side fixing pieces 52a and 52b and the protection side fixing pieces 52f and 52e extend in directions respectively approaching each other. Similarly, in the protective member 12, the protection side fixing pieces 52c and 52d are arranged aligned along one vertical side with an interval, while the protection side fixing pieces 52h and 52g are arranged aligned along another vertical side with an interval. The protection side fixing pieces 52c and 52d and the protection side fixing pieces 52h and 52g extend in directions respectively approaching each other.

As can be seen from FIGS. 4 and 5, the fixing member 15 is a protective case to protect the panel body 10 and the circuit board 11 together with the protective member 12, and is an insulating case having an electrical insulation property. The electrical resistivity of the fixing member 15 is preferably 1 Ωcm or more, and more preferably $10^6$ Ωcm or more.

Figure 10:
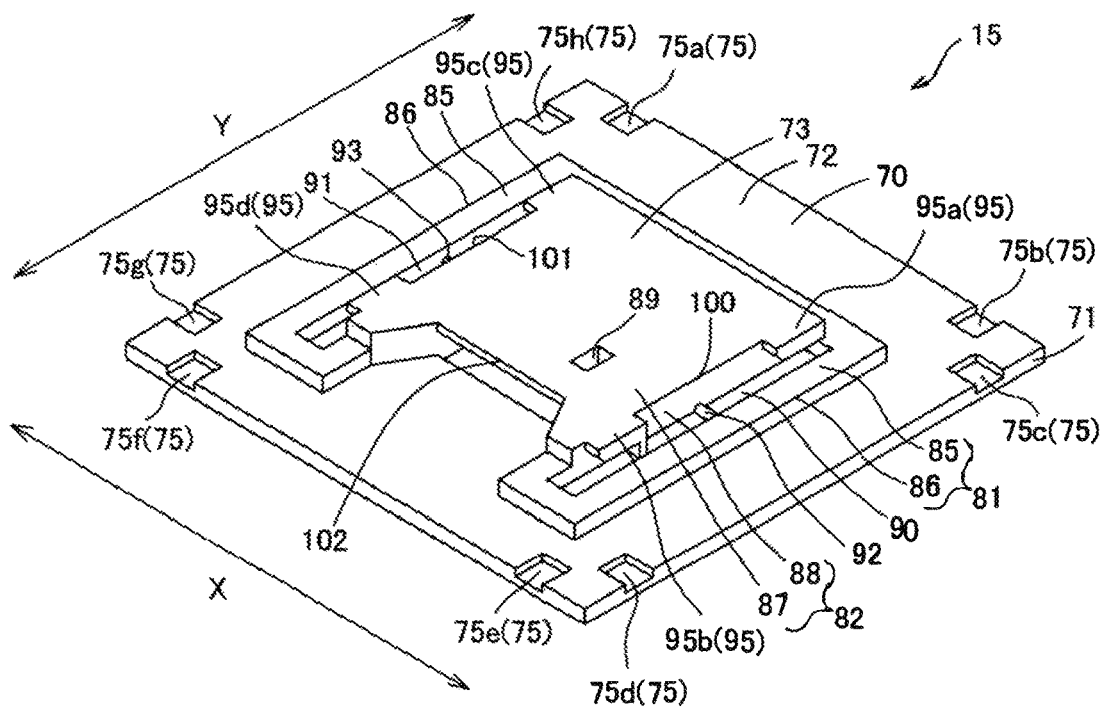
FIG. 10 is a perspective view of the fixing member of FIG. 4, as viewed from the rear face side.

The fixing member 15 can be fixed to the attachment unit 3, and includes a rear face side cover 70 and an end face side cover 71, as shown in FIG. 10.

The rear face side cover 70 is a plate-shaped part covering the rear face side of the panel body 10 and the circuit board 11. The rear face side cover 70 is a quadrangular shape in a rear view, and has a substantially convex shape in which a substantially central part protrudes toward the rear face side in a side view. As shown in FIG. 10, the rear face side cover 70 includes a main body 72 and a base part 73 (raised part).

Figure 9:
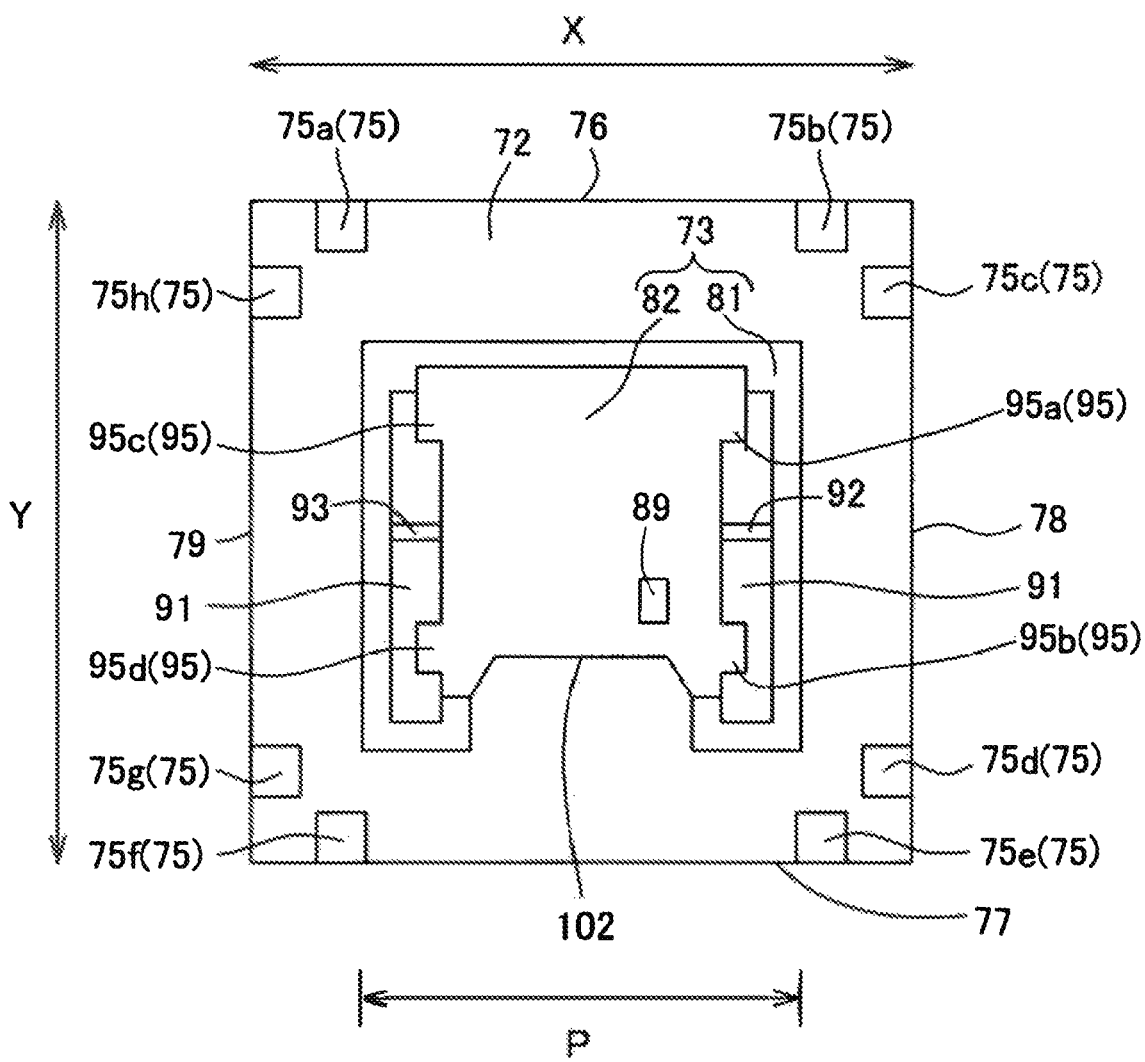
FIG. 9 is a rear view of the fixing member in FIG. 4.

The main body 72 is a part that mainly protects and supports the panel body 10, and has a fixing recess 75 (75a to 75h) at each of sides 76 to 79 as shown in FIG. 9.

The fixing recesses 75a to 75h are engageable with the protection side fixing pieces 52a to 52h (see FIG. 5) of the protective member 12, and are groove-shaped recessed sections extending from the respective sides 76 to 79 toward a center in a rear view. The fixing recesses 75a to 75h are provided at positions corresponding to the protection side fixing pieces 52a to 52h. That is, the fixing recesses 75a and 75b are arranged aligned along one lateral side 76 with an interval, while the fixing recesses 75f and 75e are arranged aligned along another lateral side 77 with an interval. Similarly, the fixing recesses 75c and 75d are arranged aligned along one vertical side 78 with an interval, while the fixing recesses 75h and 75g are arranged aligned along another vertical side 79 with an interval.

The base part 73 is a part that stores and protects the circuit board 11, and can be attached to the attachment unit 3. The base part 73 forms a step with respect to the main body 72, which is another part of the rear face side cover 70, and the base part 73 is a raised part convexly raised. When the organic EL panel 5 is assembled, the base part 73 protrudes toward the rear face side so as to avoid the circuit board 11. That is, as shown in FIG. 4, the base part 73 is formed with a storage recess 80 capable of housing the circuit board 11 as viewed from a front face side, and protrudes from the main body 72 toward the rear face side by a recessed amount of the storage recess 80.

As seen from another viewpoint, the base part 73 includes a first raised part 81 and a second raised part 82 as shown in FIG. 10, and is raised from the main body 72 stepwise toward the rear face side.

The first raised part 81 is a part that is raised with respect to the main body 72, and is substantially U-shaped in a rear view. As shown in FIG. 10, the first raised part 81 includes a first rear face side wall part 85 and a first connecting wall part 86.

The first rear face side wall part 85 is a wall part located on the rear face side with respect to the main body 72, and has a plane surface substantially without unevenness.

The term "plane surface substantially without unevenness" as used herein means a surface having no unevenness to a degree not to engage with another member due to unevenness, including a surface with fine unevenness that does not engage with another member due to unevenness.

The first connecting wall part 86 is a wall part standing upright from the main body 72, and connecting the main body 72 and an outer peripheral edge of the first rear face side wall part 85.

The second raised part 82 is a part further raised with respect to the first raised part 81, and is a part overlapping with most or whole of the circuit board 11 in a rear view and covering the circuit board 11. As shown in FIG. 10, the second raised part 82 includes a second rear face side wall part 87 and a second connecting wall part 88.

The second rear face side wall part 87 is a wall part located on the rear face side with respect to the first rear face side wall part 85, and has a plane surface substantially without unevenness. The second rear face side wall part 87 includes a switching hole 89 into which the control switching part 36 of the circuit board 11 can be inserted. The switching hole 89 is a switching through hole penetrating the second rear face side wall part 87 in a member thickness direction, and is an operation hole that exposes the control switching part 36 when the organic EL panel 5 is assembled.

The second connecting wall part 88 is a wall part standing upright with respect to the first rear face side wall part 85, and connecting the first rear face side wall part 85 and an outer peripheral edge of the second rear face side wall part 87.

As shown in FIG. 10, the base part 73 includes slide grooves 90 and 91 at a boundary portion between the first raised part 81 and the second raised part 82 in a lateral direction X.

The slide grooves 90 and 91 are bottomed grooves having a depth in a thickness direction and linearly extending in a vertical direction Y, and are guide grooves to regulate a movement of a holder side engagement part 182 (see FIG. 16) at a time of assembly. The first raised part 81 and the second raised part 82 each are partially cut out, so that the slide grooves 90 and 91 are formed across the first raised part 81 and the second raised part 82.

On bottom parts of the slide grooves 90 and 91, fixing-side locking pieces 92 and 93 (panel side locking pieces) are provided in a middle section in the vertical direction Y.

The fixing-side locking pieces 92 and 93 are parts that regulate a movement of the organic EL module 2 in the vertical direction Y with respect to the attachment unit 3, by engaging with holder side locking pieces 183 and 184 of the attachment unit 3 when assembled. The fixing-side locking pieces 92 and 93 are protrusions protruding from the bottom parts of the slide grooves 90 and 91 toward the rear face side. The fixing-side locking pieces 92 and 93 extend in a direction orthogonal to an extending direction of the slide grooves 90 and 91.

As shown in FIG. 10, the base part 73 includes a raised-side engagement part 95 (95a to 95d) standing upright with respect to the second connecting wall part 88.

Figure 11:
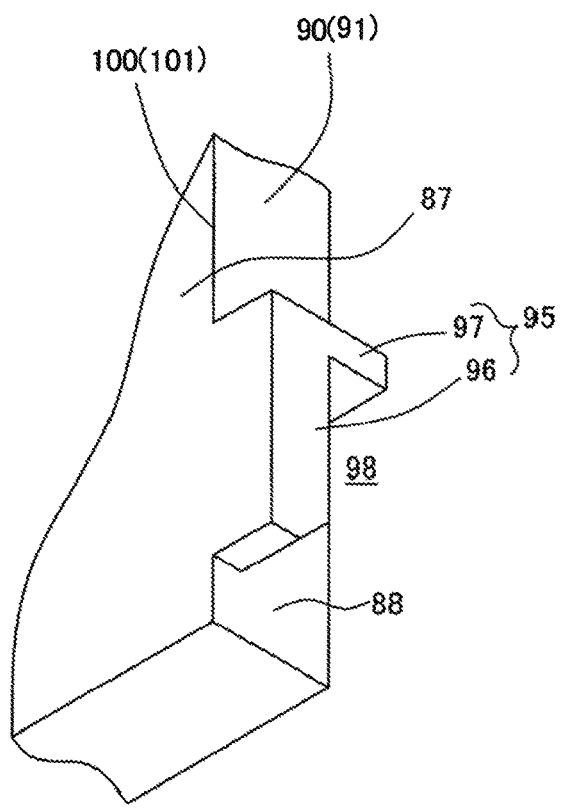
FIG. 11 is an enlarged view of a main part of the fixing member in FIG. 3.

The raised-side engagement part 95 is an engaging piece protruding in a direction orthogonal to a raised direction of the base part 73. As shown in FIG. 11, the raised-side engagement part 95 is substantially L-shaped in a side view and includes a first engagement part 96 and a second engagement part 97 crossing each other, and an insertion space 98 is formed between the first engagement part 96 and the main body 72. As seen from another viewpoint, the raised-side engagement part 95 is an overhanging piece standing upright with respect to the second connecting wall part 88 and projecting toward the slide grooves 90 and 91, and is located on a projection surface in the thickness direction of the slide grooves 90 and 91.

As shown in FIG. 11, the first engagement part 96 is a part extending in the vertical direction Y along vertical sides 100 and 101 of the second rear face side wall part 87 in a side view, and projects outward from the second connecting wall part 88 continuously to the second rear face side wall part 87 in a rear view. That is, the first engagement part 96 can also be considered as an extension part of the second rear face side wall part 87, protruding like eaves from the second rear face side wall part 87.

The second engagement part 97 is a part extending in a member thickness direction from one end (upper end) of the first engagement part 96 in the vertical direction Y in a side view, and projects outward from the second connecting wall part 88 in a rear view.

As can be seen from FIG. 10, the raised-side engagement parts 95a and 95b are provided along one vertical side 100 of the second rear face side wall part 87 in a rear view, and are arranged with an interval in the vertical direction Y. Specifically, the raised-side engagement part 95a is provided near an upper end of the vertical side 100, and the raised-side engagement part 95b is provided near a lower end of the vertical side 100.

Similarly to the raised-side engagement parts 95a and 95b, the raised-side engagement parts 95c and 95d are provided along another vertical side 101 of the second rear face side wall part 87, and arranged with an interval in the vertical direction Y.

The raised-side engagement parts 95a and 95b are arranged at positions corresponding to the raised-side engagement parts 95c and 95d in the lateral direction X. Specifically, as can be seen from FIG. 10, the raised-side engagement parts 95a and 95b extend toward the right side in a rear view, while the raised-side engagement parts 95c and 95d extend toward the left side in a rear view. That is, the raised-side engagement parts 95a and 95b and the raised-side engagement parts 95c and 95d project in directions away from each other.

The base part 73 includes a connector notch 102 extending in the vertical direction Y from the lower end of the first raised part 81.

The connector notch 102 is a cutout to connect the connector portion 260 or the connector portion 261 of the cable member 7 to the connecting connector portions 31 and 32 of the circuit board 11, and is a cutout across the first raised part 81 and the second raised part 82. That is, the connector notch 102 includes an opening through which the connector portion 260 or the connector portion 261 can pass through.

The end face side cover 71 is a wall part rising along each side of the rear face side cover 70, and is a part covering the end face of the panel body 10.

A positional relationship of individual parts of the organic EL panel 5 will be described.

Figure 12:
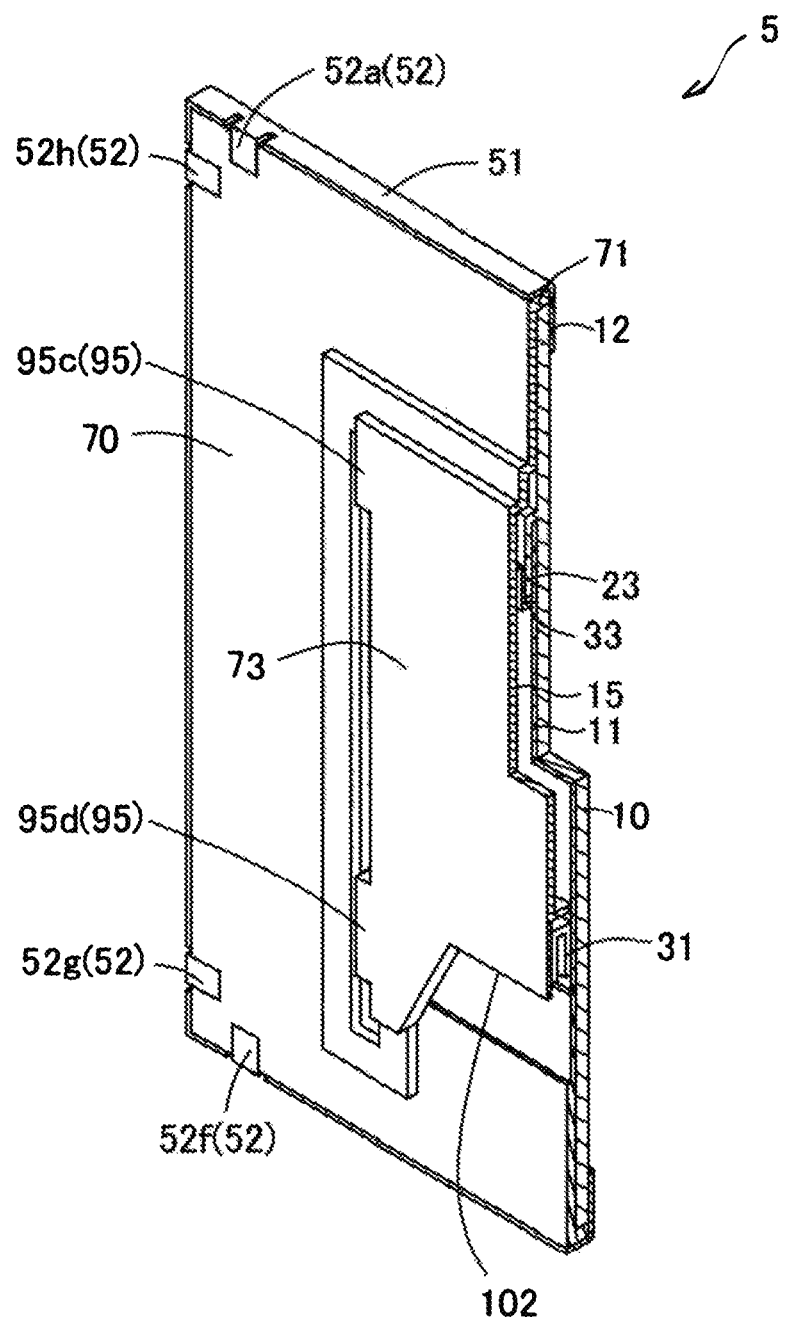
FIG. 12 is a cross-sectional perspective view of the organic EL panel of FIG. 3.

In the organic EL panel 5, as can be seen from FIGS. 6 and 12, the circuit board 11 is disposed on the rear face side of the panel body 10, and the panel side connector portion 23 is inserted to be connected to the panel connector portion 33. The panel body 10 and the circuit board 11 are sandwiched between the protective member 12 and the fixing member 15, and the protection side fixing piece 52 of the protective member 12 engages with the fixing recess 75 of the fixing member 15. That is, the fixing member 15 covers a rear face of the circuit board 11, and the storage recess 80 stores the connector portions 31 to 33 on the supporting substrate 30, the constant current generating element 35, the control switching part 36, and the like.

The connecting connector portions 31 and 32 are located near the connector notch 102, and insertion openings of the connecting connector portions 31 and 32 are exposed from the connector notch 102 of the fixing member 15. Therefore, the connecting connector portions 31 and 32 each can be inserted with the connector portion 260 or the connector portion 261 (see FIG. 3) of the cable member 7, from the rear face side of the fixing member 15.

An operation part of the control switching part 36 of the circuit board 11 is in an exposed location from the switching hole 89 of the fixing member 15, enabling switching operation of the control switching part 36 from the rear face side of the fixing member 15 by using a predetermined jig.

When a length of the panel body 10 in the lateral direction X shown in FIG. 7 is W (mm), a length of the casing region 21 in the lateral direction X is w (mm), and a length of the base part 73 in the lateral direction X shown in FIG. 9 is P (mm), then the following Expression (1) is preferably satisfied.

$$-10 \text{ (mm)} < W - 2w - P < 10 \text{ (mm)} \tag{1}$$

That is, a difference between lengths (W−2w−P) of the light-emitting region 20 and the base part 73 in the lateral direction X is preferably more than −10 mm and less than 10 mm.

Figure 13:
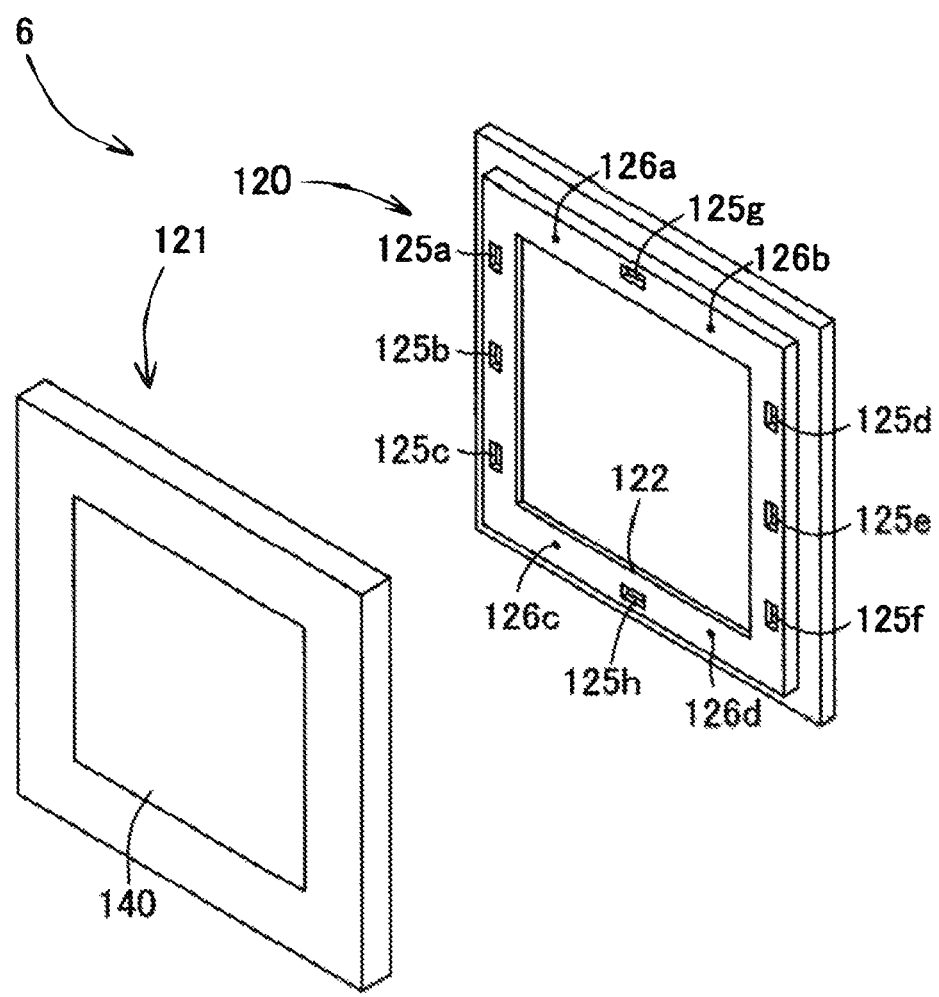
FIG. 13 is an exploded perspective view of a decorative member of FIG. 3.

As shown in FIG. 13, the decorative member 6 includes a frame part 120 and a decorative part 121.

Figure 14:
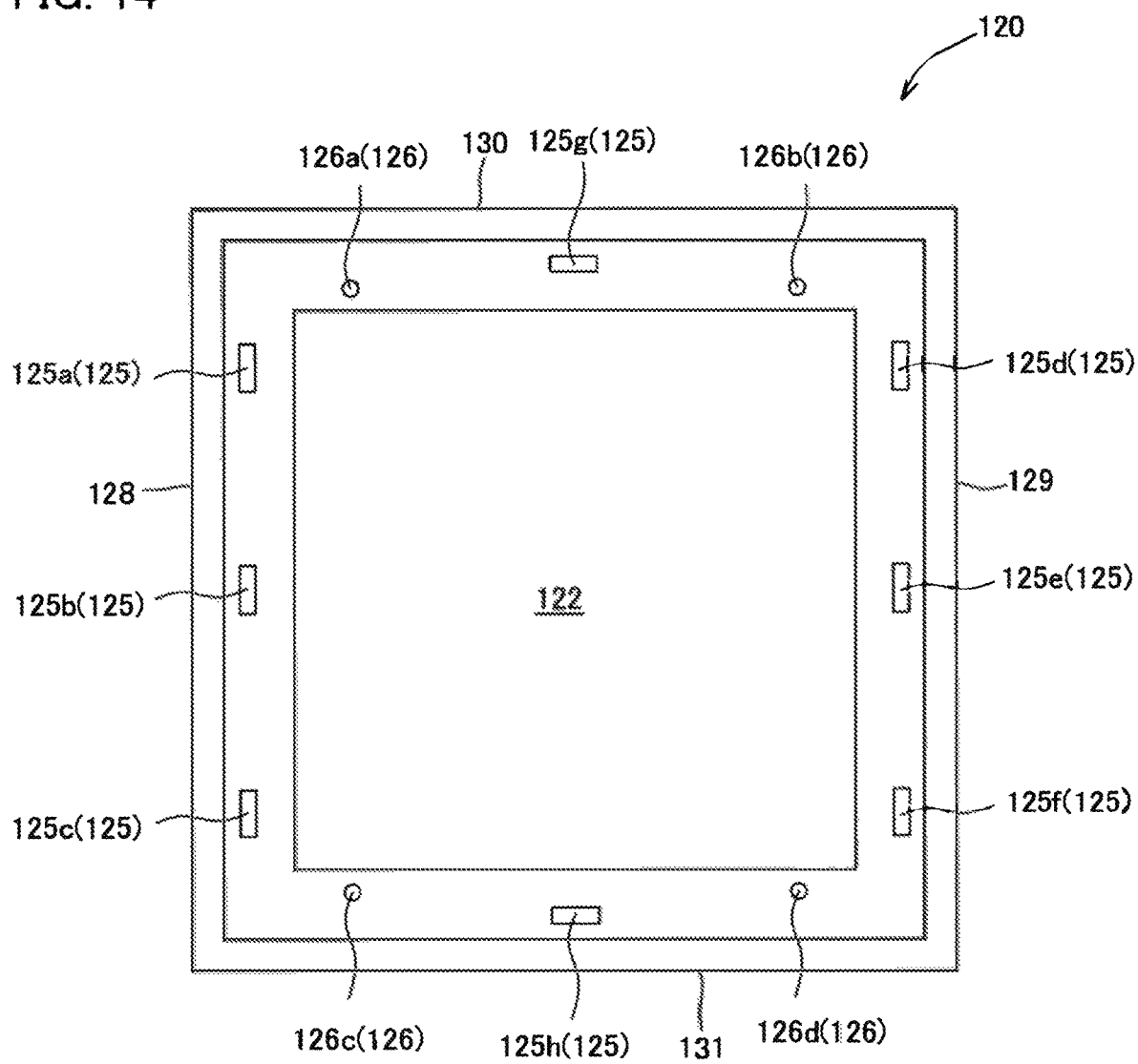
FIG. 14 is a front view of a frame part of FIG. 13.

As shown in FIG. 14, the frame part 120 is a frame-shaped member having an opening 122 in a center in a front view, and is a member to fix the decorative part 121. As can be seen from FIGS. 13 and 14, the frame part 120 includes a plurality of locking opening portions 125 (125a to 125h) and a plurality of insertion holes 126 (126a to 126d).

Each of the locking opening portions 125 is an opening that can be inserted with a locking claw 142 of the decorative part 121, and can engage with the locking claw 142 by inserting the locking claw 142. The locking opening portions 125a to 125c are arranged aligned along one vertical side 128 with a predetermined interval, while the locking opening portions 125*d* to 125*f* are arranged aligned along another vertical side 129 with a predetermined interval. The remaining locking opening portions 125*g* and 125*h* are provided on lateral sides 130 and 131, respectively.

Figure 21:
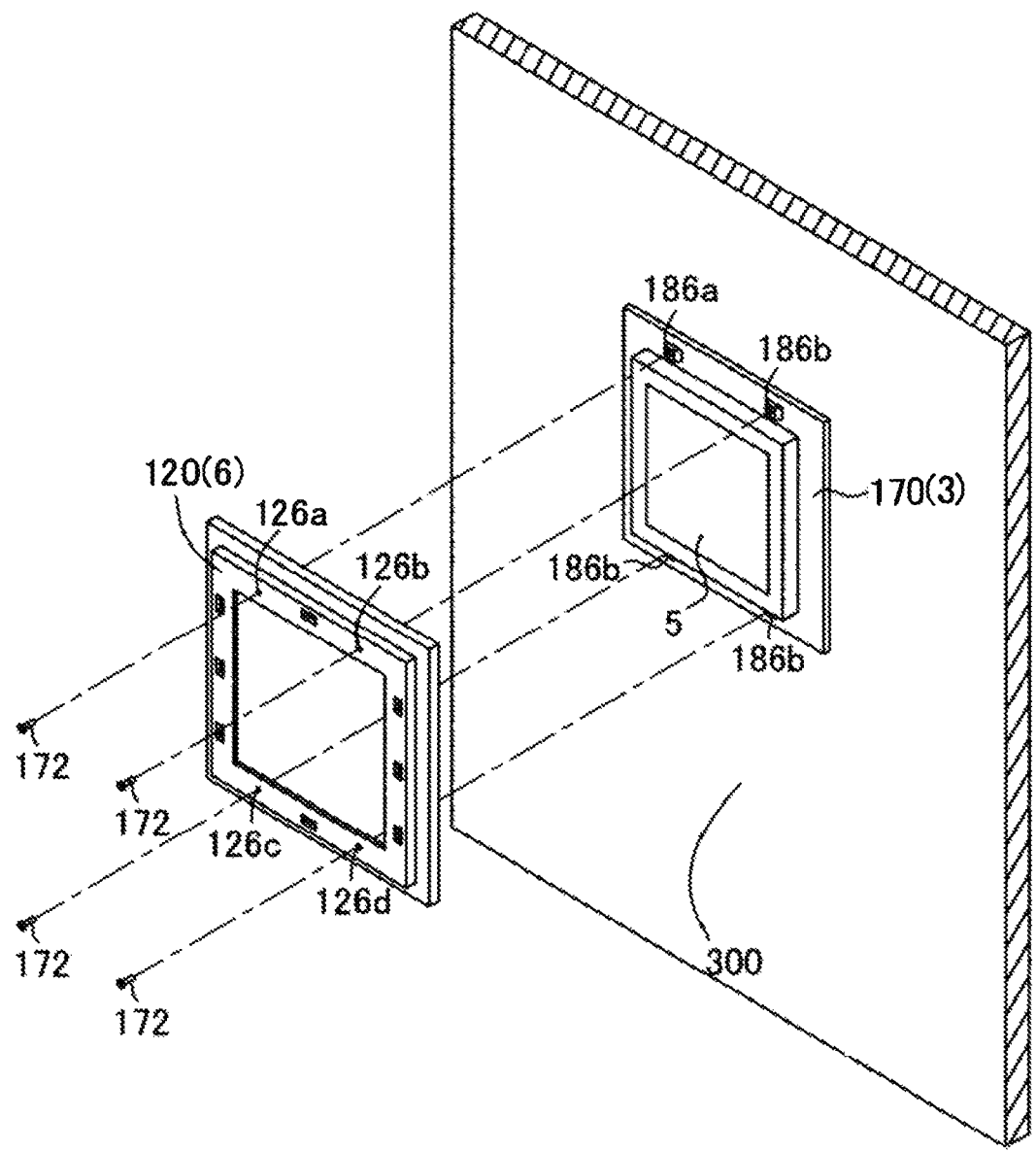
FIG. 21 is a perspective view showing attachment of the frame part to the attachment unit.

Each of the insertion holes 126 is a hole that can be inserted with a fastening element 172 such as a screw shown in FIG. 21, and is a through hole penetrating in a member thickness direction. As shown in FIG. 14, the insertion holes 126*a* and 126*b* are located inward from the locking opening portion 125*g* in a front view, and are provided along the lateral side 130 with an interval. The insertion holes 126*c* and 126*d* are located inward from the locking opening portion 125*h* in a front view, and are provided along the lateral side 131 with an interval.

Figure 15:
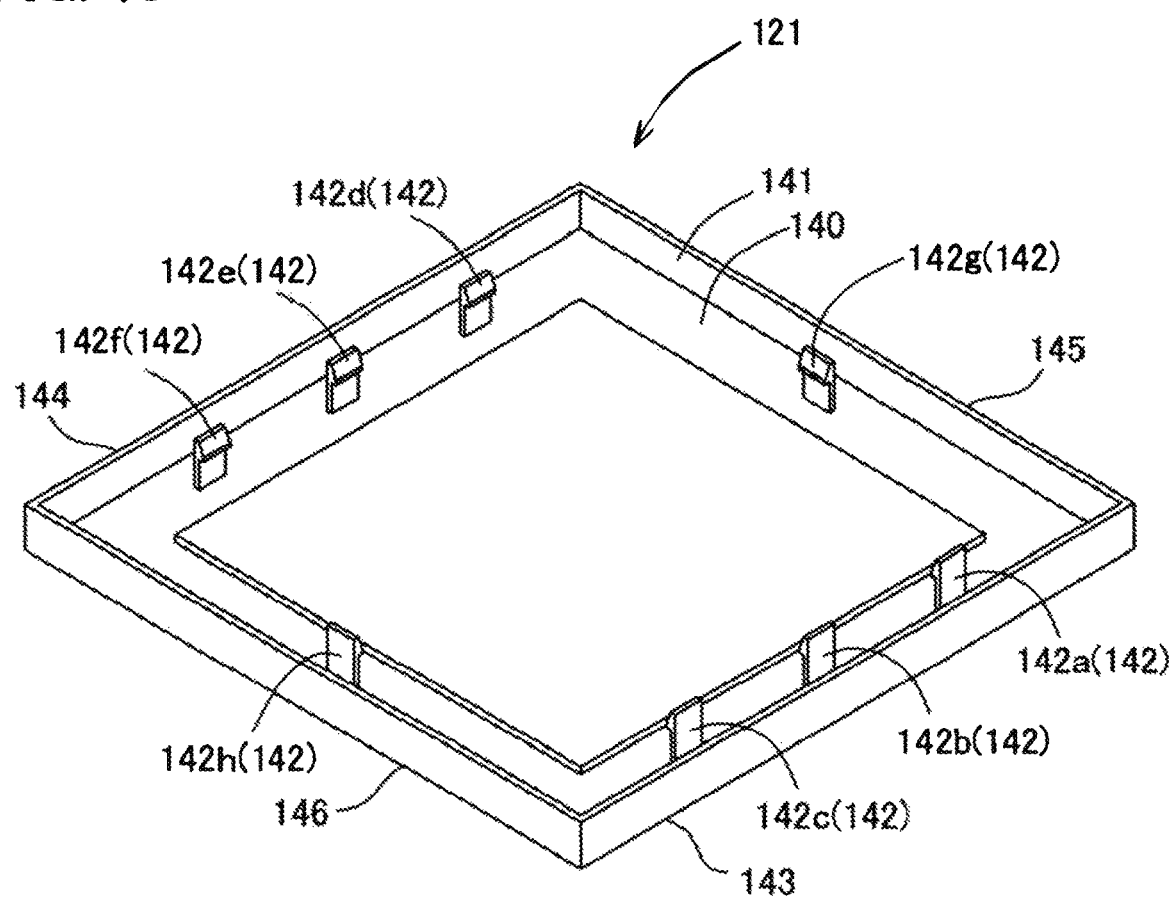
FIG. 15 is a perspective view of a decorative part of FIG. 2, as viewed from the rear face side.

The decorative part 121 is a member to suppress luminance unevenness while protecting the emission surface 16 of the organic EL panel 5, and includes a front face forming part 140 and a side face forming part 141 as shown in FIG. 15.

The front face forming part 140 is a quadrangular part forming a front face of the organic EL module 2, and has the locking claw 142 (142*a* to 142*h*) provided on a rear face.

The locking claw 142 is a claw standing upright from a rear face of the front face forming part 140, and can attach the decorative part 121 to the frame part 120. The locking claws 142*a* to 142*c* are provided corresponding to the locking opening portions 125*a* to 125*c* of the frame part 120 and are arranged along a vertical side 143 of the front face forming part 140. The locking claws 142*d* to 142*f* are provided corresponding to the locking opening portions 125*d* to 125*f* of the frame part 120 and are arranged along a vertical side 144 of the front face forming part 140. The remaining locking claws 142*g* and 142*h* are provided corresponding to the locking opening portions 125*g* and 125*h* of the frame part 120 and are arranged along lateral sides 145 and 146 of the front face forming part 140.

The side face forming part 141 is a part forming a side surface of the organic EL module 2, and rises from the front face forming part 140 toward the rear face side.

The cable member 7 is a cable to electrically connect the organic EL panel 5 with an external power source, or the organic EL panel 5 with an organic EL panel of another organic EL module, and is a linear connecting member. As shown in FIG. 3, the cable member 7 is provided with the connector portions 260 and 261 at its ends in a longitudinal direction, respectively. Specifically, the cable member 7 is a four-core cable, and has two power feeder lines and two signal lines.

Figure 16:
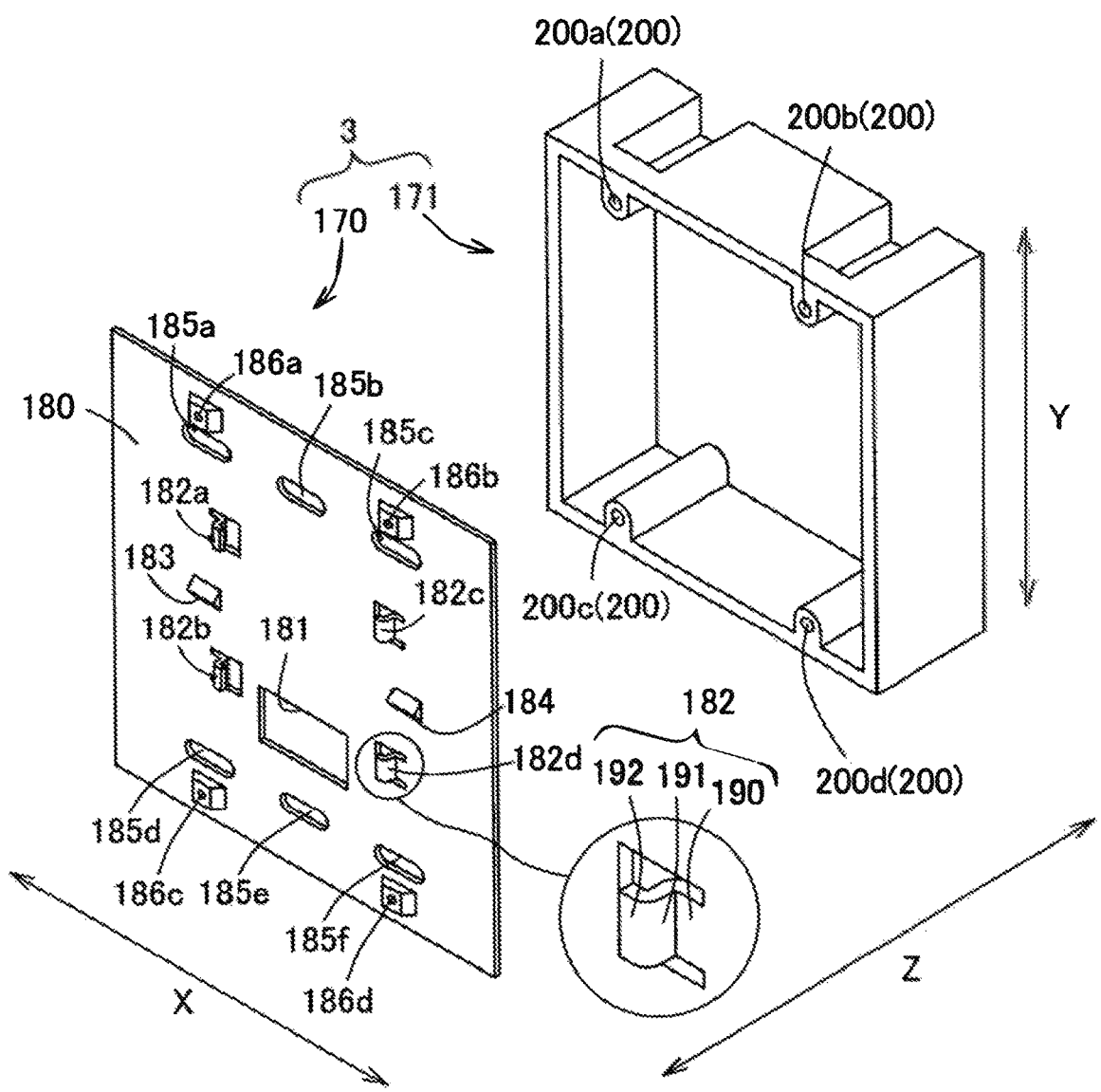
FIG. 16 is an exploded perspective view of a mounting member of FIG. 2.

The attachment unit 3 is a member to attach the organic EL module 2 to the opening portion 301 of the wall surface 300, and includes a holder member 170 (mounting member) and a box member 171 as main component members as shown in FIG. 16.

Figure 17:
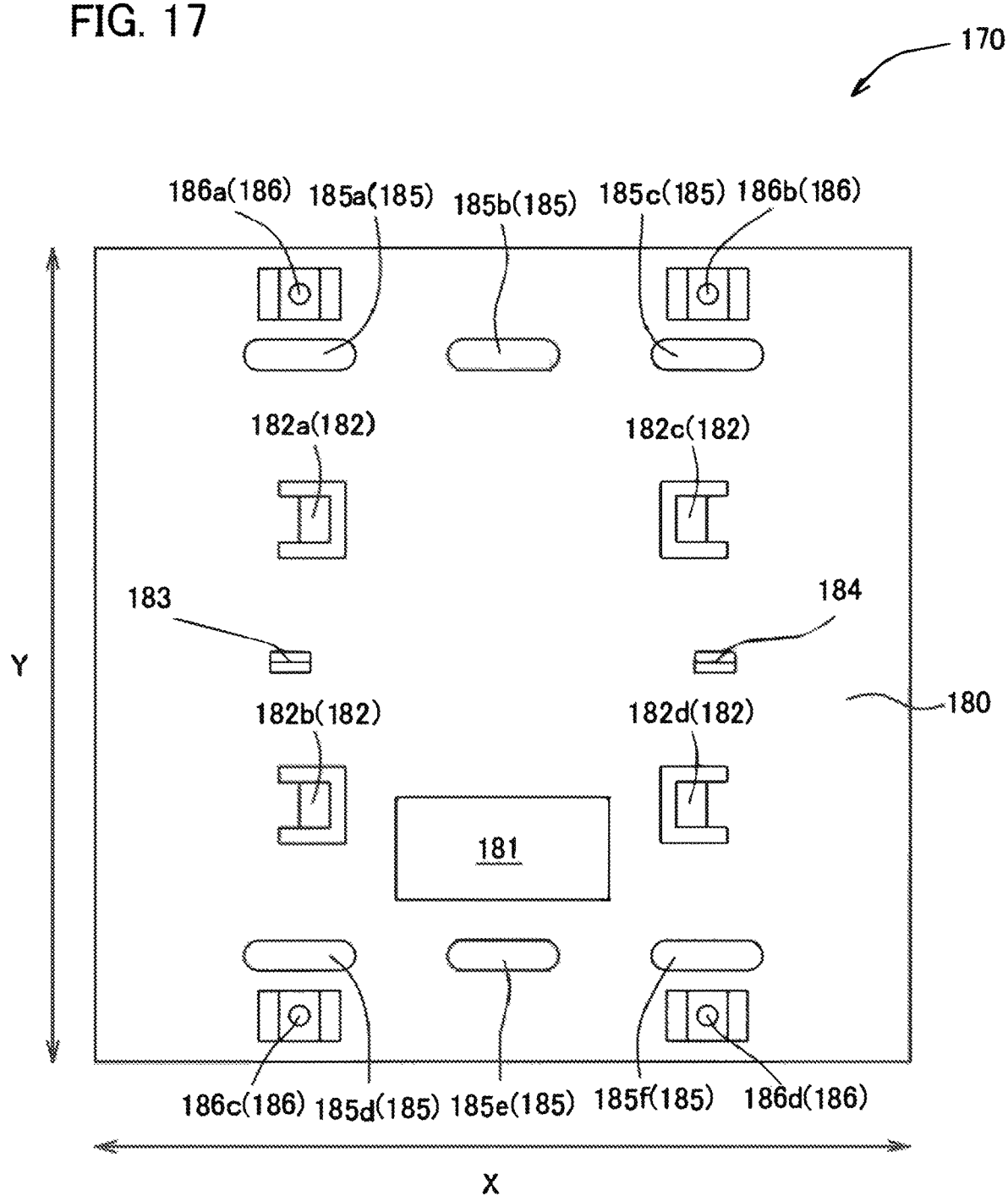
FIG. 17 is a front view of a holder member of FIG. 16.

As shown in FIGS. 16 and 17, the holder member 170 includes: a holder main body 180 (attachment side main body); a cable connection hole 181; the holder side engagement part 182 (182*a* to 182*d*) (attachment side engagement part); the holder side locking pieces 183 and 184 (attachment side locking pieces); a box mounting hole 185 (185*a* to 185*f*); and a frame fastening hole 186 (186*a* to 186*d*).

The holder main body 180 is a plate-shaped member provided with the cable connection hole 181 that is a through opening in a center in the lateral direction X, and the holder main body 180 has a quadrangular shape in a front view. The holder main body 180 has a flat front face, and is substantially smooth without unevenness.

The cable connection hole 181 is an opening that can be inserted with the cable member 7, and is a through hole penetrating in a member thickness direction of the holder member 170.

The holder side engagement part 182 can engage with the raised-side engagement part 95 of the fixing member 15, and is a protruding piece protruding toward the front face side with respect to the holder main body 180. The holder side engagement part 182 is supported in a cantilever manner from the holder main body 180, and formed by bending a part of the holder member 170. As shown in an enlarged view of FIG. 16, the holder side engagement part 182 is composed of a connecting wall part 190, a vertical wall part 191, and a locking wall part 192.

The connecting wall part 190 is a wall part extending from the holder main body 180, and is stepwise continuous with the locking wall part 192 via the vertical wall part 191.

The vertical wall part 191 is a wall part bent toward the front face side from an end in an extending direction of the connecting wall part 190, and rising with respect to the connecting wall part 190.

The locking wall part 192 is a wall part that is bent in the lateral direction X from an end in a rising direction of the vertical wall part 191, and is parallel to the connecting wall part 190. The locking wall part 192 is connected to the holder main body 180 with a step in a thickness direction Z (front-rear direction).

The holder side locking pieces 183 and 184 are parts that regulate a movement of the organic EL module 2 in a sliding direction (vertical direction Y) with respect to the attachment unit 3, by engaging with the fixing-side locking pieces 92 and 93. The holder side locking pieces 183 and 184 are upright pieces rising from the holder main body 180 toward the front face side, and are orthogonal to the holder main body 180.

Figure 18:
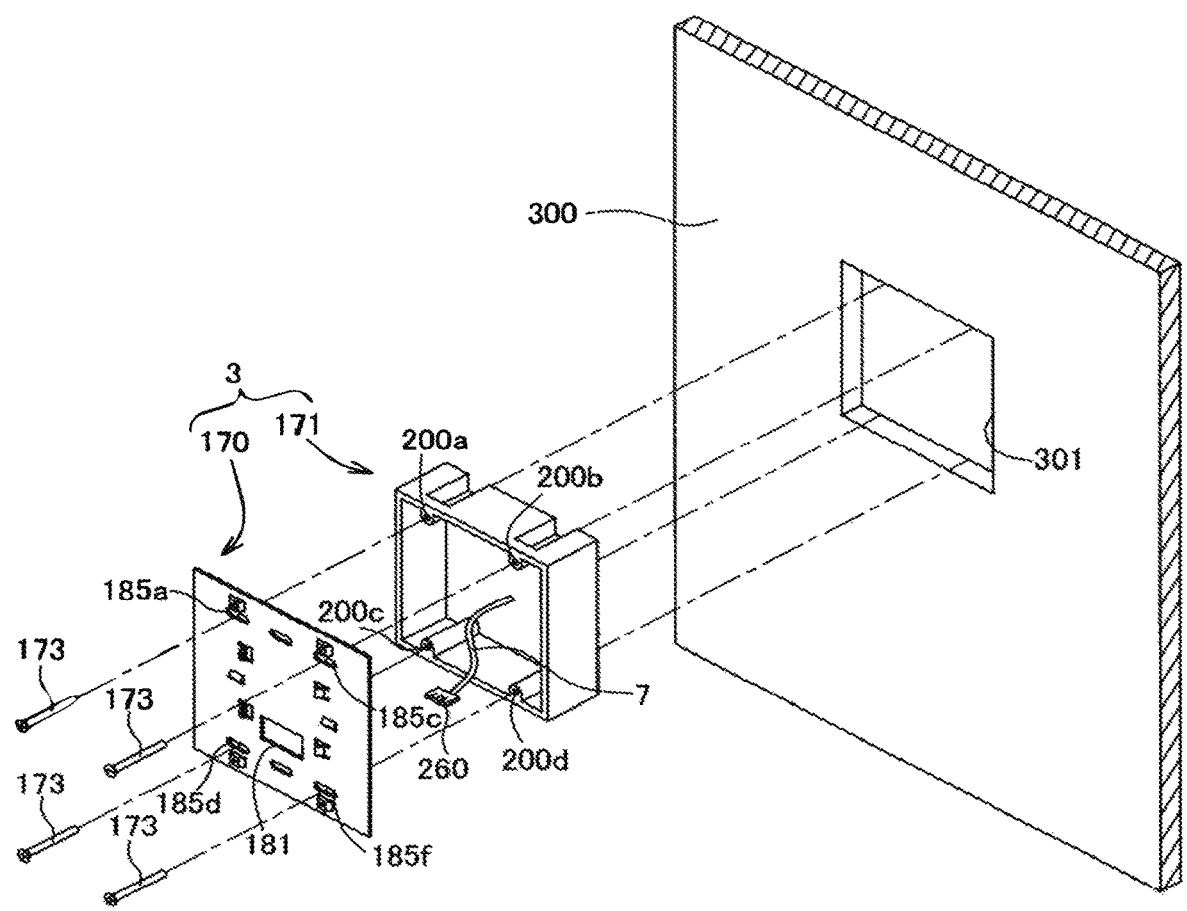
FIG. 18 is a perspective view showing attachment of an attachment unit to a wall surface.

As shown in FIG. 18, the box mounting hole 185 is a mounting hole to attach the holder member 170 to the box member 171 by a fastening element 173, and is an insertion hole through which the fastening element 173 can be inserted. The box mounting hole 185 is an elongated hole extending in the lateral direction X, and is a through hole penetrating in the member thickness direction of the holder member 170.

As shown in FIG. 21, the frame fastening hole 186 is a mounting hole to attach the frame part 120 by the fastening element 172, and is a fastening hole that can be fastened to the fastening element 172. That is, the frame fastening hole 186 has a threaded inner surface and can engage with the fastening element 172.

A positional relationship of individual parts of the holder member 170 will be described.

As shown in FIG. 17, the holder member 170 is provided with the cable connection hole 181 in a center in the lateral direction X, and the holder side engagement parts 182*a* and 182*b* and the holder side engagement parts 182*c* and 182*d* are provided outward from the cable connection hole 181. The cable connection hole 181 is located between the holder side engagement parts 182*b* and 182*d*. The holder side engagement parts 182*a* and 182*b* and the holder side engagement parts 182*c* and 182*d* extend in a direction orthogonal to the sliding direction of the organic EL panel 5 (lateral direction X), and in directions respectively approaching each other (inward direction). Specifically, the holder side engagement parts 182*a* and 182*b* extend toward the right side in a rear view, and the holder side engagement parts 182*c* and 182*d* extend toward the left side in a rear view.

The holder member 170 is provided with the holder side locking pieces 183 and 184 in a substantially center in the vertical direction Y, and the holder side engagement parts 182a and 182b and the holder side engagement parts 182c and 182d are provided outward from the holder side locking pieces 183 and 184. The box mounting holes 185a to 185c are located outward (upper side) from the holder side engagement parts 182a and 182c, while the frame fastening holes 186a and 186b are located further outward (upper side) from the box mounting holes 185a to 185c. Similarly, the box mounting holes 185d to 185f are located outward (lower side) from the holder side engagement parts 182b and 182d, while the frame fastening holes 186c and 186d are located further outward (lower side) from the box mounting holes 185d to 185f.

The box member 171 functions as a switching box and is a casing opened toward the front face side as shown in FIG. 16, and has a plurality of box side fixing holes 200 (200a to 200d).

As shown in FIG. 18, each of the box side fixing holes 200 is a mounting hole to attach the holder member 170 by the fastening element 173 such as a screw, and is a fastening hole that can be fastened to the fastening element 173. That is, the box side fixing hole 200 has a threaded inner surface and can engage with the fastening element 173. The box side fixing holes 200a and 200b are arranged aligned along one lateral side of the box member 171 in a front view, and the box side fixing holes 200c and 200d are arranged aligned on another lateral side of the box member 171.

Next, a positional relationship of individual members will be described according to an assembling procedure of the illumination device 1 of the first embodiment of the present invention.

First, the connector portion 261 of the cable member 7 is connected to a connector portion (not shown) of the box member 171 in advance, the box member 171 and the holder member 170 are stacked and inserted into the opening portion 301 of the wall surface 300 as shown in FIG. 18, and the holder member 170 and the box member 171 are fixed to the wall surface 300 in a vertical orientation by the fastening element 173.

Figure 19:
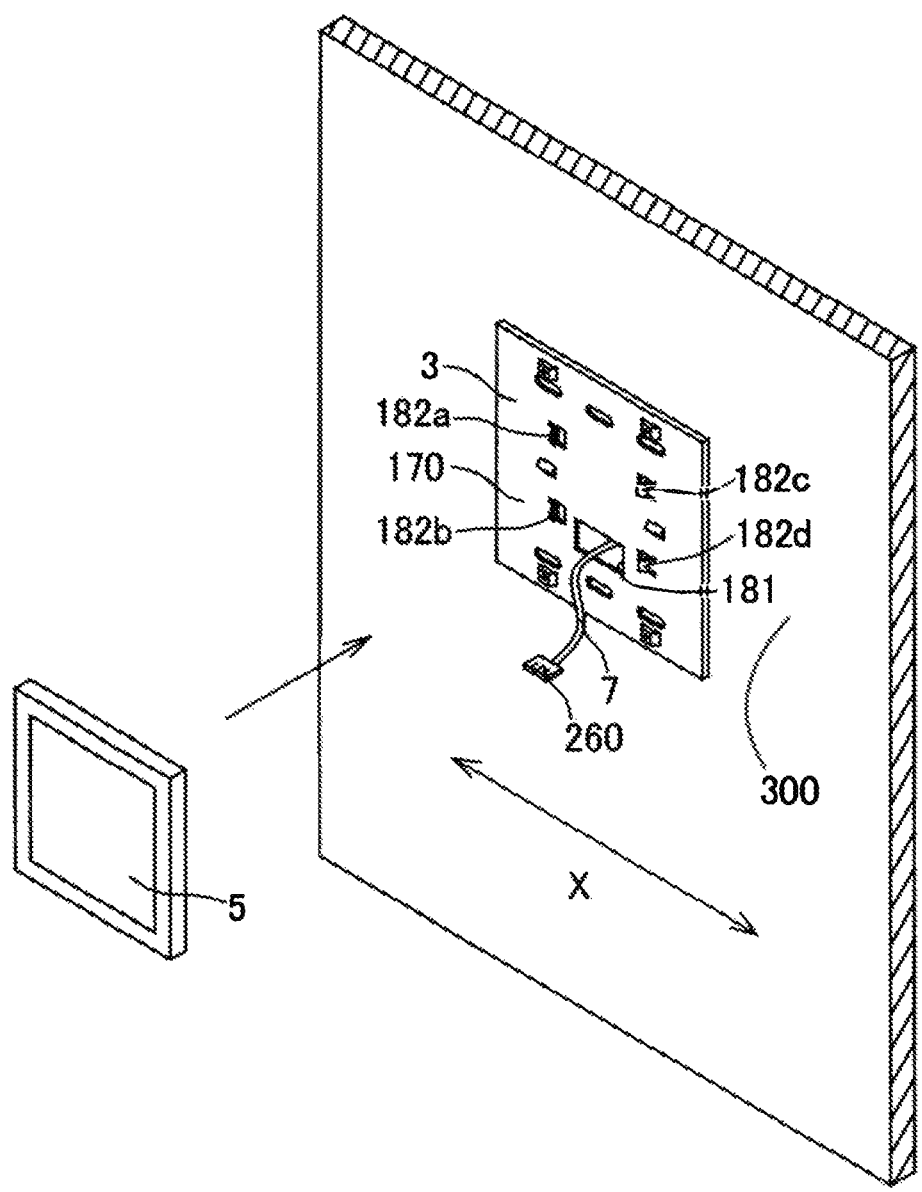
FIG. 19 is a perspective view showing attachment of an organic EL panel to the attachment unit.

At this time, the fastening element 173 passes through the box mounting hole 185 of the holder member 170 to engage with the box side fixing hole 200 of the box member 171, and is fastened to a fastening hole (not shown) in the opening portion 301 of the wall surface 300. As shown in FIG. 19, the cable member 7 passes through the cable connection hole 181 of the holder member 170 from inside the box member 171, and the connector portion 260 is exposed to outside the holder member 170. The holder side engagement part 182 of the holder member 170 extends in the lateral direction X.

Thereafter, the connector portion 260 of the cable member 7 in an exposed location from the cable connection hole 181 is connected by inserting the connector portion 260 into any given connecting connector portion 31 (or the connecting connector portion 32) of the organic EL panel 5 assembled in a separate process. Then, the organic EL panel 5 is slid in a spreading direction of the emission surface 16 and attached to the holder member 170. Specifically, while the first rear face side wall part 85 of the base part 73 of the organic EL panel 5 is brought into contact with the holder main body 180, the organic EL panel 5 is slid to the lower side in the vertical direction Y, and the raised-side engagement parts 95a to 95d are engaged with the holder side engagement parts 182a to 182d of the holder member 170.

Figure 20A:
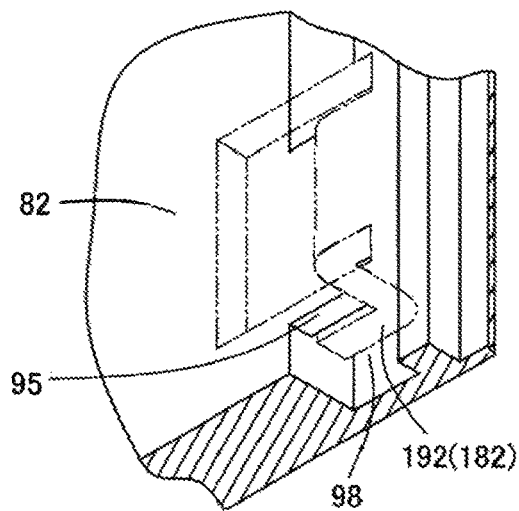
Figure 20B:
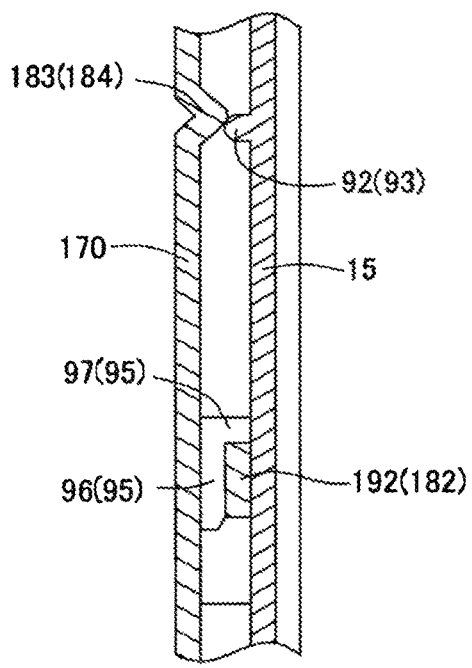
Figure 20C:
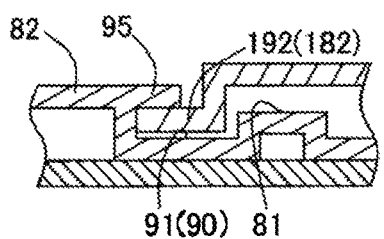

At this time, as can be seen from FIGS. 20A and 20B, the locking wall part 192 of the holder side engagement part 182 is inserted into the insertion space 98 surrounded by the raised-side engagement part 95, and the locking wall part 192 of the holder side engagement part 182 regulates a movement of the organic EL panel 5 in an overlapping direction (thickness direction) and the sliding direction (vertical direction Y) with respect to the holder member 170. The holder side locking pieces 183 and 184 are engaged with the fixing-side locking pieces 92 and 93 of the organic EL panel 5, and the movement in the sliding direction is regulated. As shown in FIG. 20C, the locking wall part 192 of the holder side engagement part 182 is located in the slide grooves 90 and 91, which is disposed at a position (bottom part side) lower than the first raised part 81. That is, the holder side engagement part 182 is sandwiched between inner walls of the slide grooves 90 and 91, and a movement in the direction orthogonal to the sliding direction (lateral direction X) is restricted.

Subsequently, as shown in FIG. 21, the frame part 120 is attached to the holder member 170, and the frame part 120 is fixed by the fastening element 172.

At this time, the fastening element 172 passes through each of the insertion holes 126 of the frame part 120, and is fastened to the frame fastening hole 186 of the holder member 170.

Figure 22:
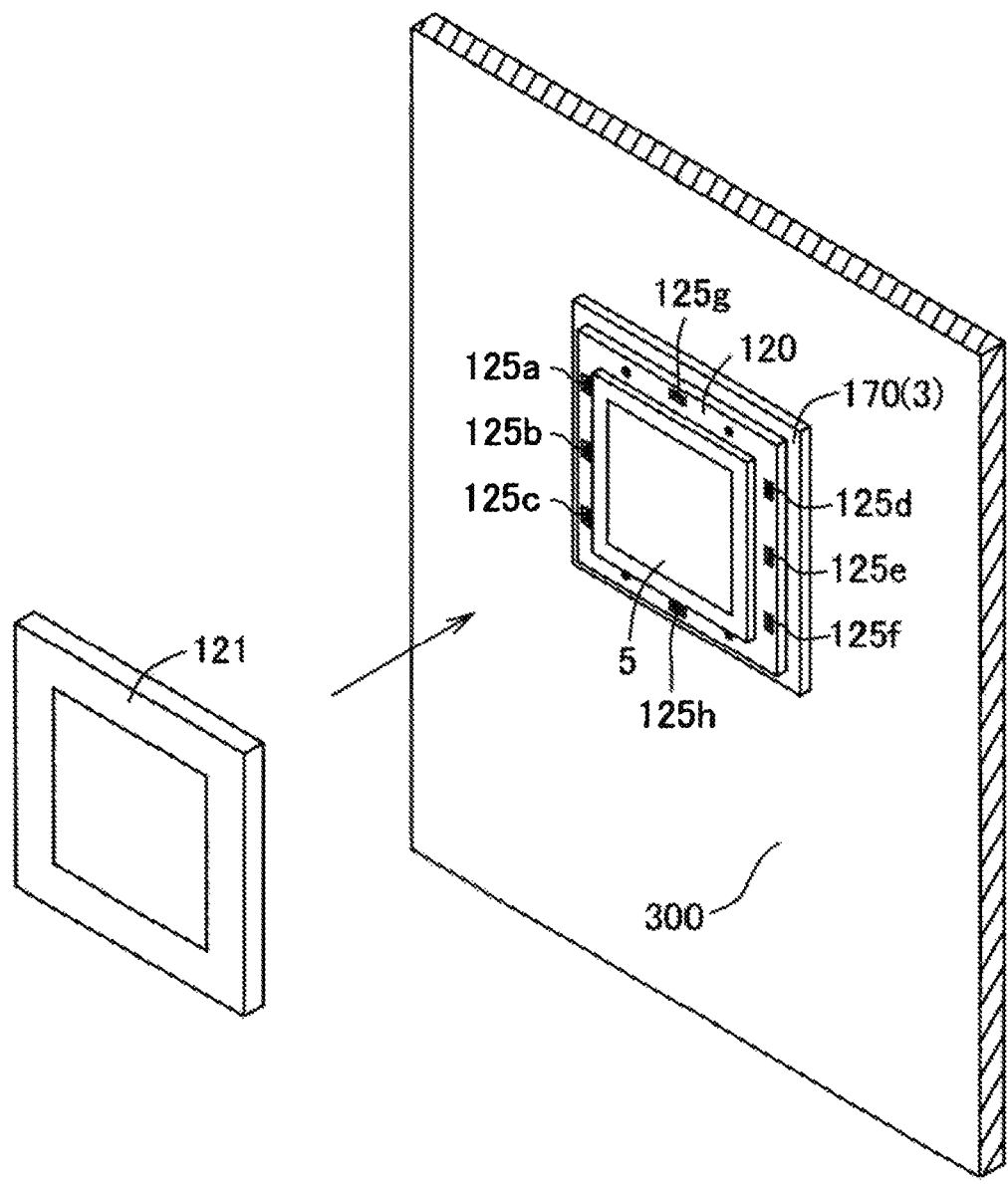
FIG. 22 is a perspective view showing attachment of the decorative part to the frame part.

Subsequently, as shown in FIG. 22, the decorative part 121 is attached to the frame part 120.

At this time, the locking claws 142a to 142h (see FIG. 15) of the decorative part 121 are inserted into and engaged with the locking opening portions 125a to 125h of the frame part 120 of the attachment unit 3. Therefore, a movement of the decorative part 121 on the front face side is regulated.

Next, a procedure for replacing a used organic EL panel 5 from the illumination device 1 with a new organic EL panel 5 according to the first embodiment of the present invention will be described.

The decorative part 121 is moved in a direction (thickness direction) orthogonal to the emission surface 16, and the decorative part 121 is detached from the frame part 120. Thereafter, the used organic EL panel 5 is slid to the upper side in the vertical direction, and the engagement state between the raised-side engagement parts 95a to 95d and the holder side engagement parts 182a to 182d of the holder member 170 is released.

Subsequently, the connector portion 260 of the cable member 7 of the used organic EL panel 5 is disconnected from the connecting connector portions 31 and 32 connected with the connector portion 260, and the connector portion 260 is connected to any given connecting connector portions 31 and 32 of the new organic EL panel 5.

Then, the new organic EL panel 5 is slid in the spreading direction of the emission surface 16 and attached to the holder member 170, and the decorative part 121 is attached to the frame part 120 again. That is, the new organic EL panel 5 is slid toward the lower side in the vertical direction and attached to the holder member 170, and the decorative part 121 is attached to the frame part 120 again.

According to the illumination device 1 of the first embodiment, since the organic EL panel 5 is detachable by sliding the organic EL panel 5 in the vertical direction Y relatively to the attachment unit 3, the organic EL panel 5 can be easily replaced in a state fixed to the wall surface 300.

According to the illumination device 1 of the first embodiment, since the fixing of the organic EL panel 5 is performed by engagement between the members, there is no need to prepare a jig such as a driver when the organic EL panel 5 is replaced, and it is easy to replace the organic EL panel.

According to the illumination device 1 of the first embodiment, since the raised-side engagement parts 95a to 95d of the organic EL panel 5 are engaged from the upper side in the vertical direction Y of the holder side engagement parts 182a to 182d of the attachment unit 3, the organic EL panel 5 is unlikely to depart due to gravity.

Next, an illumination device 250 of a second embodiment will be described. Note that similar reference numerals are given to configurations similar to those of the illumination device of the first embodiment, and the description thereof will be omitted. The same shall apply hereinafter.

Figure 23:
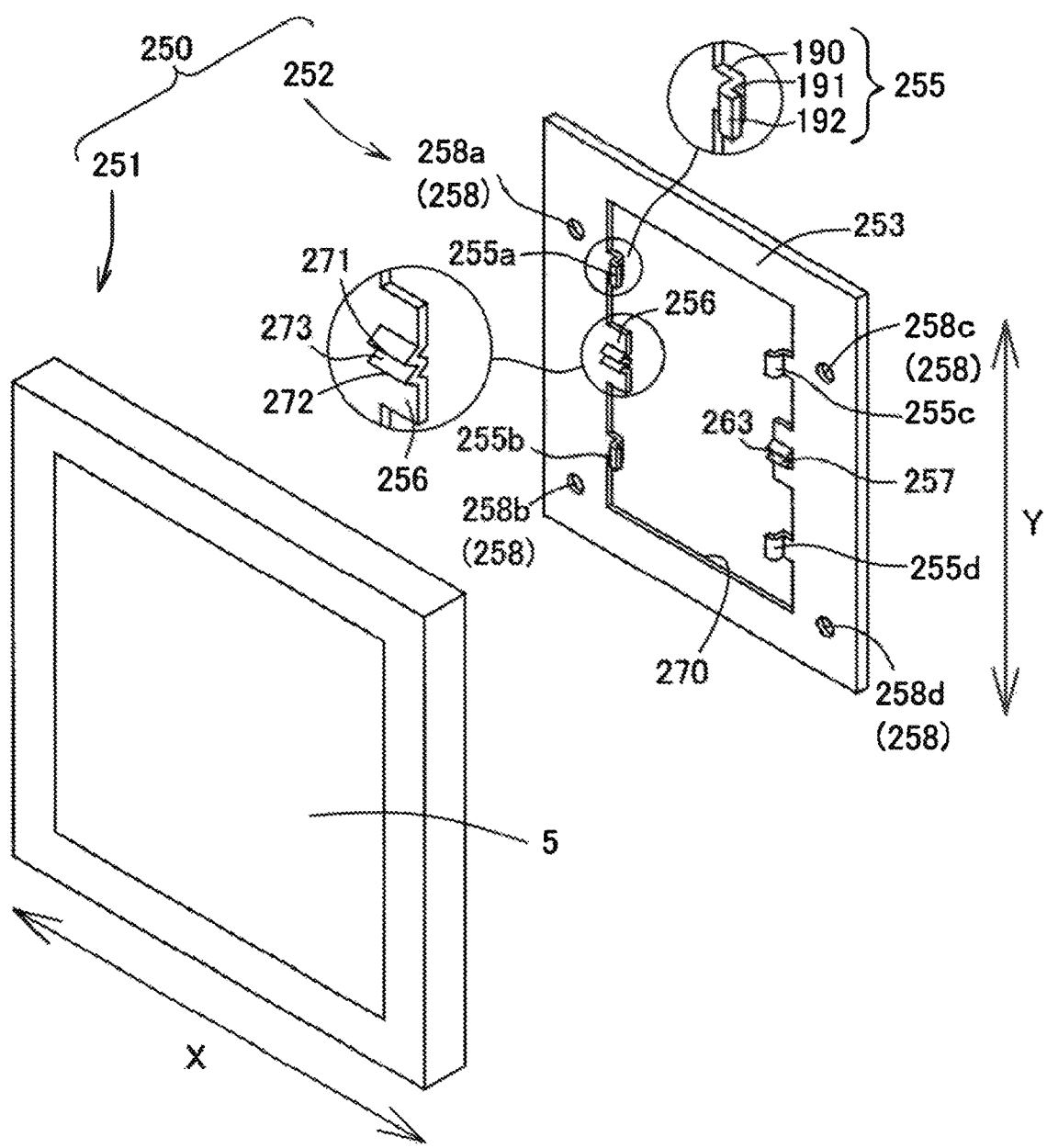
FIG. 23 is an exploded perspective view showing an illumination device according to a second embodiment of the present invention.

As shown in FIG. 23, the illumination device 250 of the second embodiment includes, as main component members, an organic EL module 251 with an organic EL panel 5, and a holder member 252 (mounting member).

As shown in FIG. 23, the holder member 252 includes a holder main body 253 (attachment side engagement part), a holder side engagement part 255 (255a to 255d) (attachment side engagement part), holder side locking pieces 256 and 257, and a mounting hole 258 (258a to 258d).

The holder main body 253 is a plate-shaped body having a through hole 270.

Figure 24:
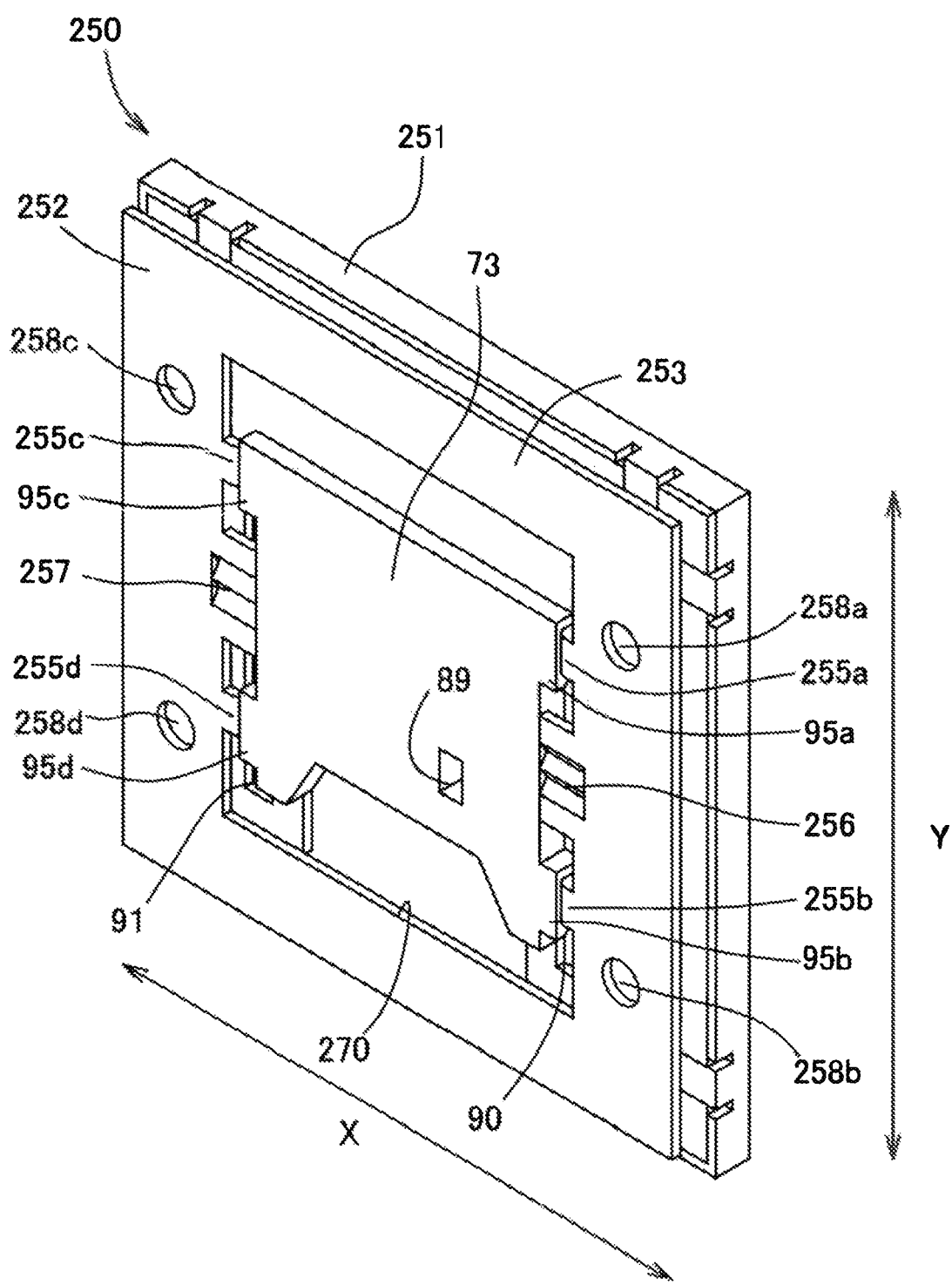
FIG. 24 is a perspective view of the illumination device of FIG. 23 as viewed from another angle.

As shown in FIG. 24, the through hole 270 is a through hole having a substantially quadrangular opening shape and penetrating in a member thickness direction, and is an insertion hole into which a base part 73 of the organic EL panel 5 can be inserted.

The holder side engagement part 255 is a locking piece engageable with a raised-side engagement part 95 of a fixing member 15, and a protruding piece protruding toward the front face side with respect to the holder main body 253. The holder side engagement part 255 is bent from an opening edge of the through hole 270 of the holder main body 253 to form a crank shape. The holder side engagement part 255 is supported in a cantilever manner from the opening edge of the through hole 270, and is also an overhanging piece projecting from the holder main body 253 toward the through hole 270.

Similarly to the holder side engagement part 182 of the first embodiment, the holder side engagement part 255 is composed of a connecting wall part 190, a vertical wall part 191, and a locking wall part 192, while the connecting wall part 190 and the locking wall part 192 are connected by the vertical wall part 191 with a step.

The holder side locking pieces 256 and 257 are parts to regulate a movement of the organic EL module 251 in the vertical direction Y with respect to the holder member 252, by engaging with fixing-side locking pieces 92 and 93 of the fixing member 15 of the organic EL panel 5. The holder side locking pieces 256 and 257 are supported in a cantilever manner from an opening edge of the holder main body 253, and are also overhanging pieces projecting from the holder main body 253 toward the through hole 270. The holder side locking pieces 256 and 257 are bent in a wave shape in the vertical direction Y, and provided with holder side protrusions 271 and 272 extending in the lateral direction X.

The holder side protrusions 271 and 272 are arranged aligned with a predetermined interval in a height direction, and side walls of the holder side protrusions 271 and 272 form a holder side recess 273. The holder side recess 273 is an engagement recess engageable with the fixing-side locking pieces 92 and 93.

The mounting hole 258 is an insertion hole through which a fastening element 265 such as a screw can be inserted.

A positional relationship of individual parts of the holder member 252 will be described.

As shown in FIG. 23, the holder member 252 has the through hole 270 formed in a center in the lateral direction X, and each of the mounting holes 258a and 258b and mounting holes 258c and 258d is disposed outward from the through hole 270. Each of the holder side engagement part 255 and the holder side locking pieces 256 and 257 extends from an edge of the through hole 270 toward a center side. Specifically, the holder side engagement parts 255a and 255b and the holder side engagement parts 255c and 255d extend in the lateral direction X and in directions respectively approaching each other (inward direction). Similarly, the holder side locking piece 256 and the holder side locking piece 257 extend in the lateral direction X and in directions approaching each other (inward direction).

The holder member 252 is provided with the holder side locking pieces 256 and 257 in a center in the vertical direction Y, while the holder side engagement parts 255a and 255c and holder side engagement parts 255b and 255d are provided outward from the holder side locking pieces 256 and 257. The holder member 252 is vertically symmetrical with respect to the holder side locking pieces 256 and 257. That is, a distance from the holder side engagement parts 255a and 255c to the holder side locking pieces 256 and 257 is equal to a distance from the holder side engagement parts 255b and 255d to the holder side locking pieces 256 and 257.

Next, a positional relationship of individual members will be described according to an assembling procedure of the illumination device 250 of the second embodiment of the present invention. For convenience of explanation, the description starts from a state in which a connector portion 261 of a cable member 7 is connected in advance to a connector portion (not shown) inside the wall surface 300, and a connector portion 260 of the cable member 7 is exposed from the wall surface 300.

Figure 25A:
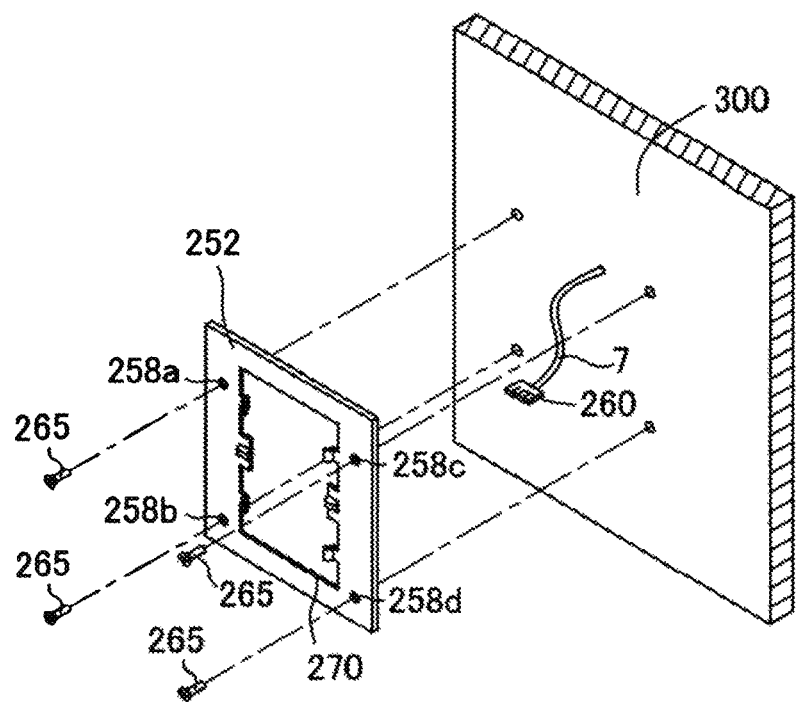
Figure 25B:
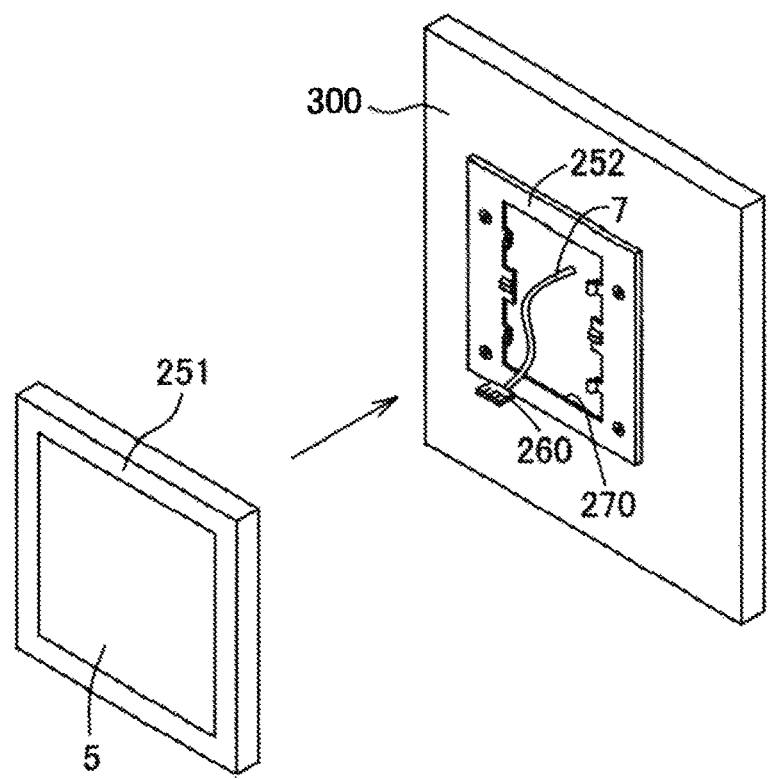

First, as can be seen from FIGS. 25A and 25B, the fastening element 265 is inserted through the mounting holes 258a to 258d, and the holder member 252 is attached to the wall surface 300.

At this time, the connector portion 260 of the cable member 7 passes through the through hole 270 and projects to the front face side.

Next, the base part 73 of the organic EL panel 5 is inserted into the through hole 270 and slid to the lower side in the vertical direction Y with the second raised part 82 fitted into the through hole 270, and raised-side engagement parts 95a to 95d are engaged with the holder side engagement parts 255a to 255d.

Figure 26:
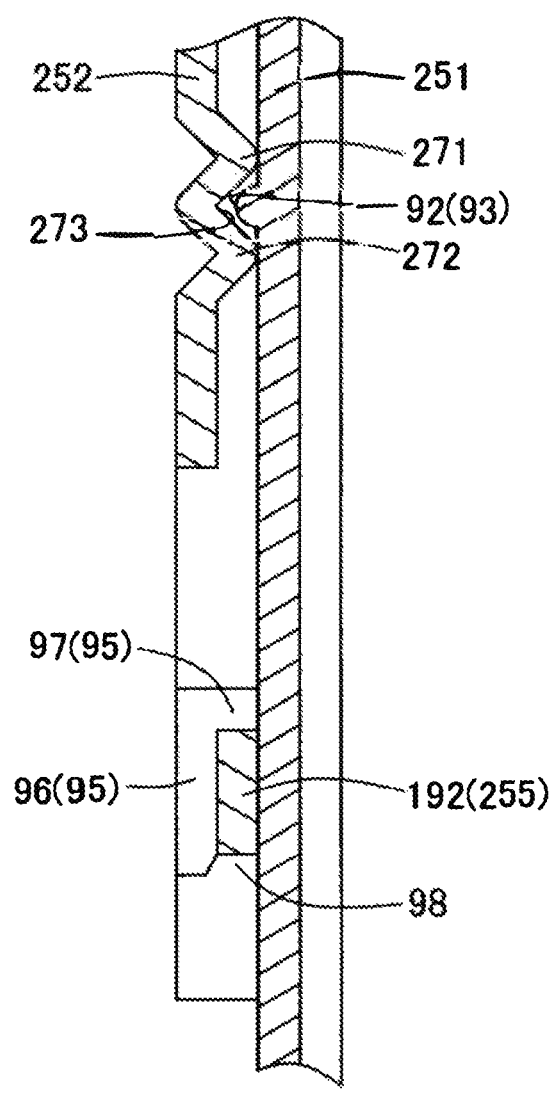
FIG. 26 is an explanatory view focusing on a relationship of a main part of the illumination device in FIG. 23, and is a cross-sectional view of the main part.

At this time, as shown in FIG. 26, the locking wall part 192 of the holder side engagement part 255 is inserted into an insertion space 98 of a rear face side cover 70, and the locking wall part 192 of the holder side engagement part 255 regulates a movement of the organic EL panel 5 in an overlapping direction (thickness direction) and a sliding direction (vertical direction) with respect to the holder member 252. The holder side locking pieces 256 and 257 are engaged with the fixing-side locking pieces 92 and 93 of the organic EL panel 5, and the movement in the sliding direction (vertical direction) is regulated. The fixing-side locking pieces 92 and 93 are fitted into the holder side recess 273, and sandwiched between the holder side protrusions 271 and 272 forming side walls of the holder side recess 273. Therefore, a movement of the fixing-side locking pieces 92 and 93 in the sliding direction is regulated by the holder side protrusions 271 and 272. When the holder member 252 is viewed from the front, the holder main body 253 is concealed by the organic EL panel 5, and the fastening element 265 is inoperable.

According to the illumination device 250 of the second embodiment, the base part 73 of the organic EL panel 5 is fitted into the through hole 270 of the holder member 252, enabling reduction of a projecting length of the organic EL panel 5 from the wall surface 300.

According to the illumination device 250 of the second embodiment, in attaching the organic EL module 251, since the organic EL module 251 is slid with the second raised part 82 fitted into the through hole 270 of the holder member 252, alignment is easy.

Next, an illumination device 280 of a third embodiment will be described.

The illumination device 280 of the third embodiment of the present invention includes an organic EL module 251 and a holder member 281 (mounting member).

Figure 27:
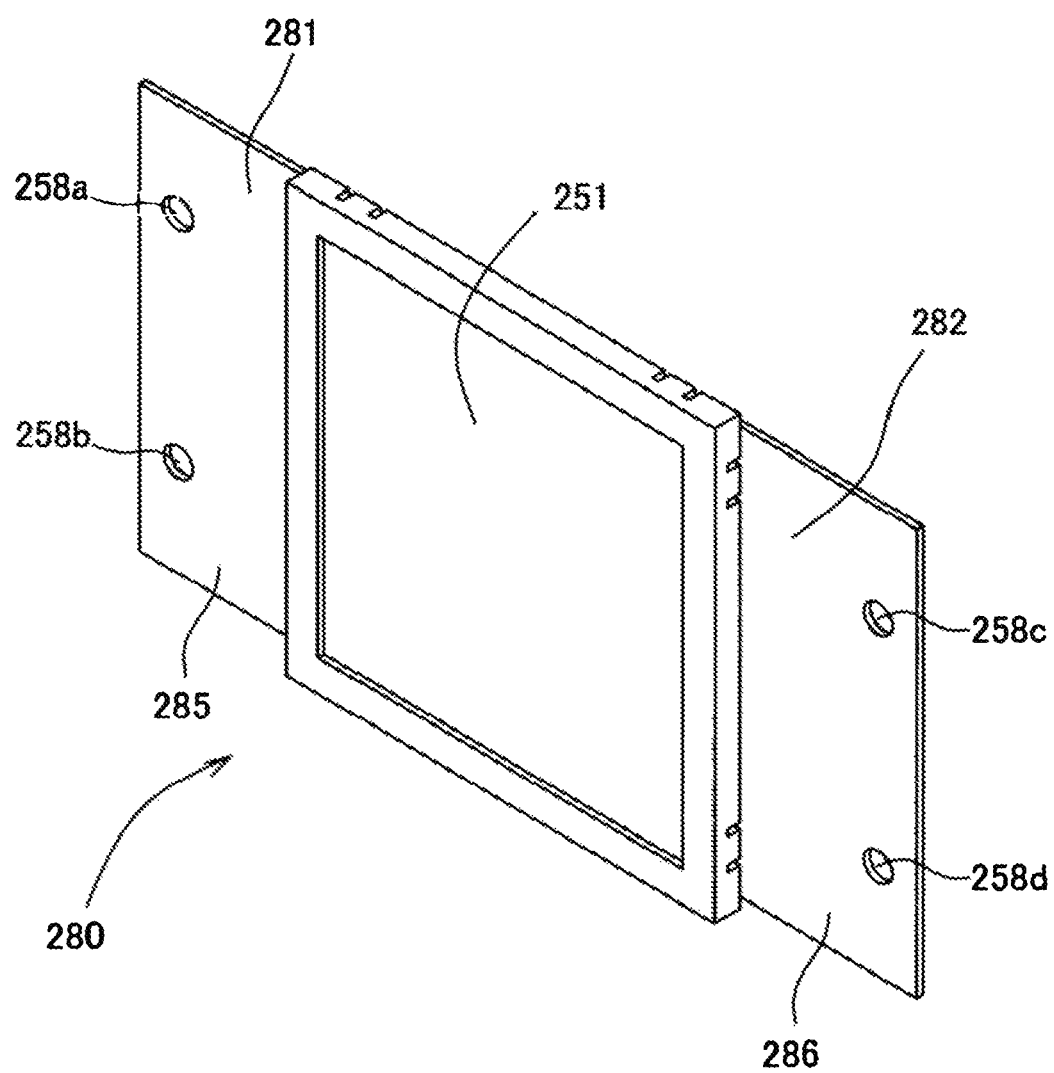
FIG. 27 is a perspective view of an illumination device according to a third embodiment of the present invention.
Figure 28:
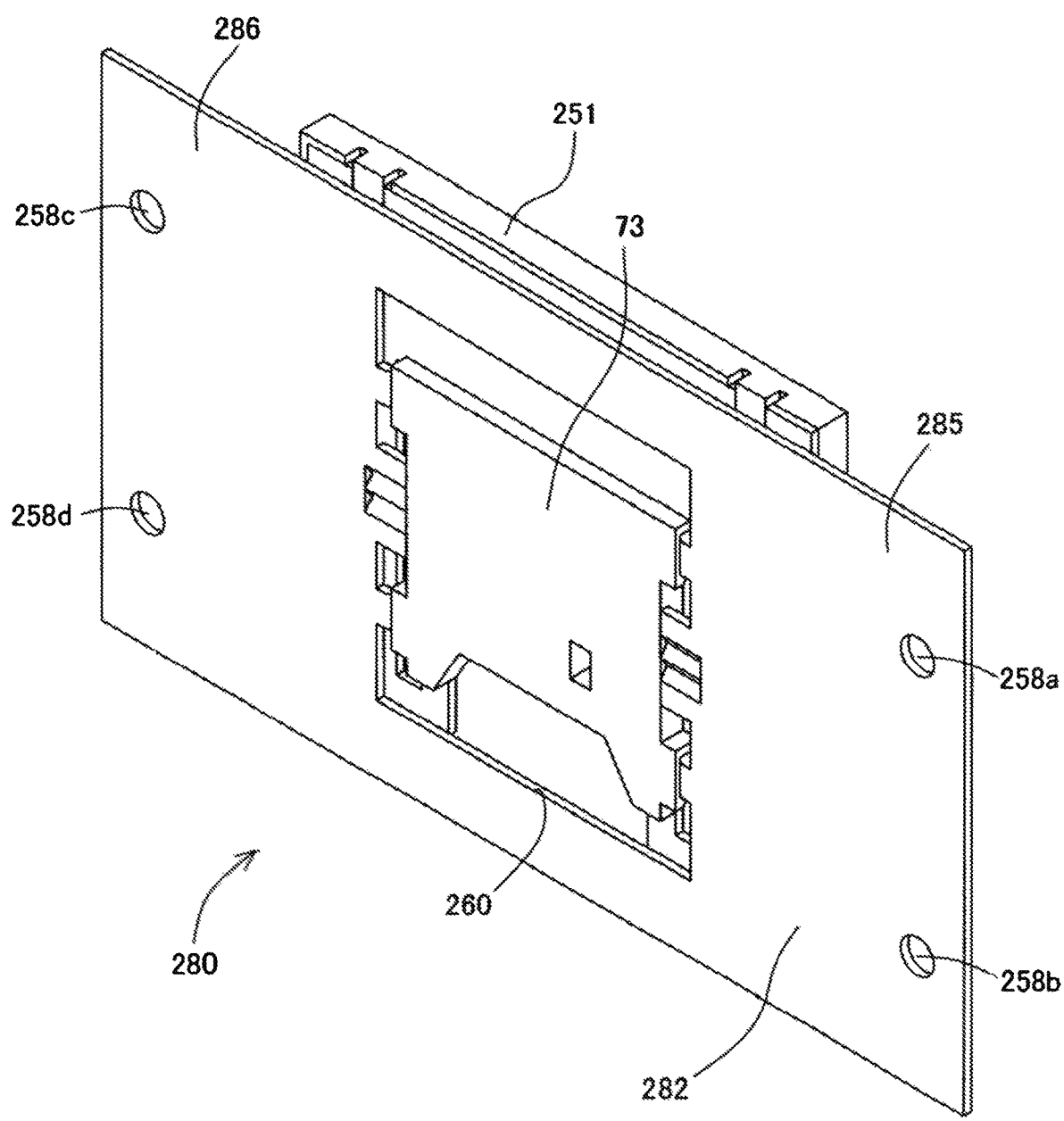
FIG. 28 is a perspective view of the illumination device of FIG. 27 as viewed from another angle.

As shown in FIGS. 27 and 28, the holder member 281 has a longer width of a holder main body 282 than the holder member 252 of the second embodiment does, and the holder main body 282 projects from the organic EL module 251. Then, the mounting holes 258a to 258d are provided in overhanging parts 285 and 286 of the holder main body 282, from the organic EL module 251.

According to the illumination device 280 of the third embodiment, when the organic EL module 251 is viewed from the front, since the holder member 281 is provided with the mounting hole 258 on the overhanging parts 285 and 286 from the organic EL module 251, the illumination device 280 can be fixed to the wall surface 300 in an assembled state.

Next, an illumination device 400 of a fourth embodiment will be described.

Figure 29:
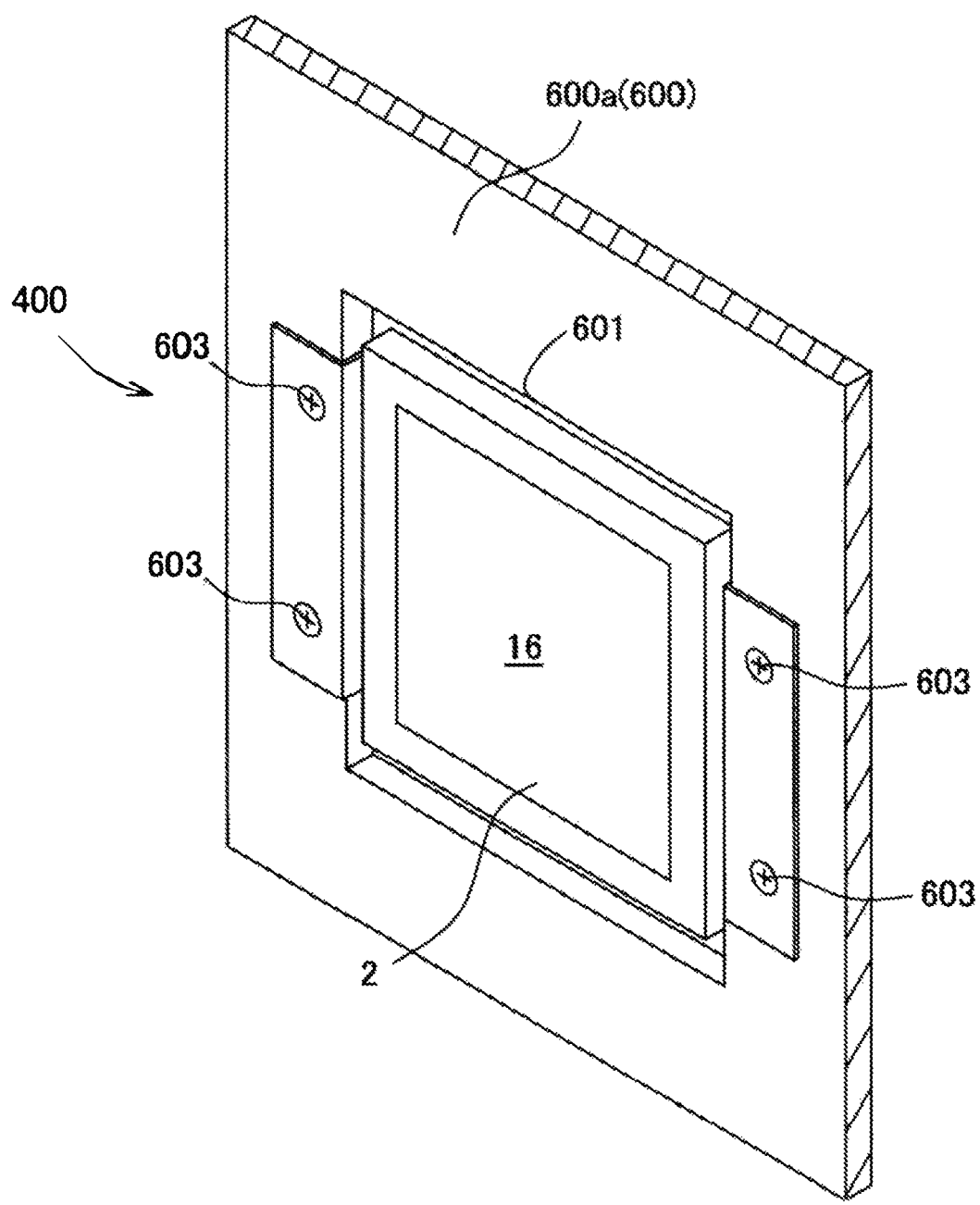
FIG. 29 is a perspective view schematically showing an application example of an illumination device of the present invention.
Figure 36:
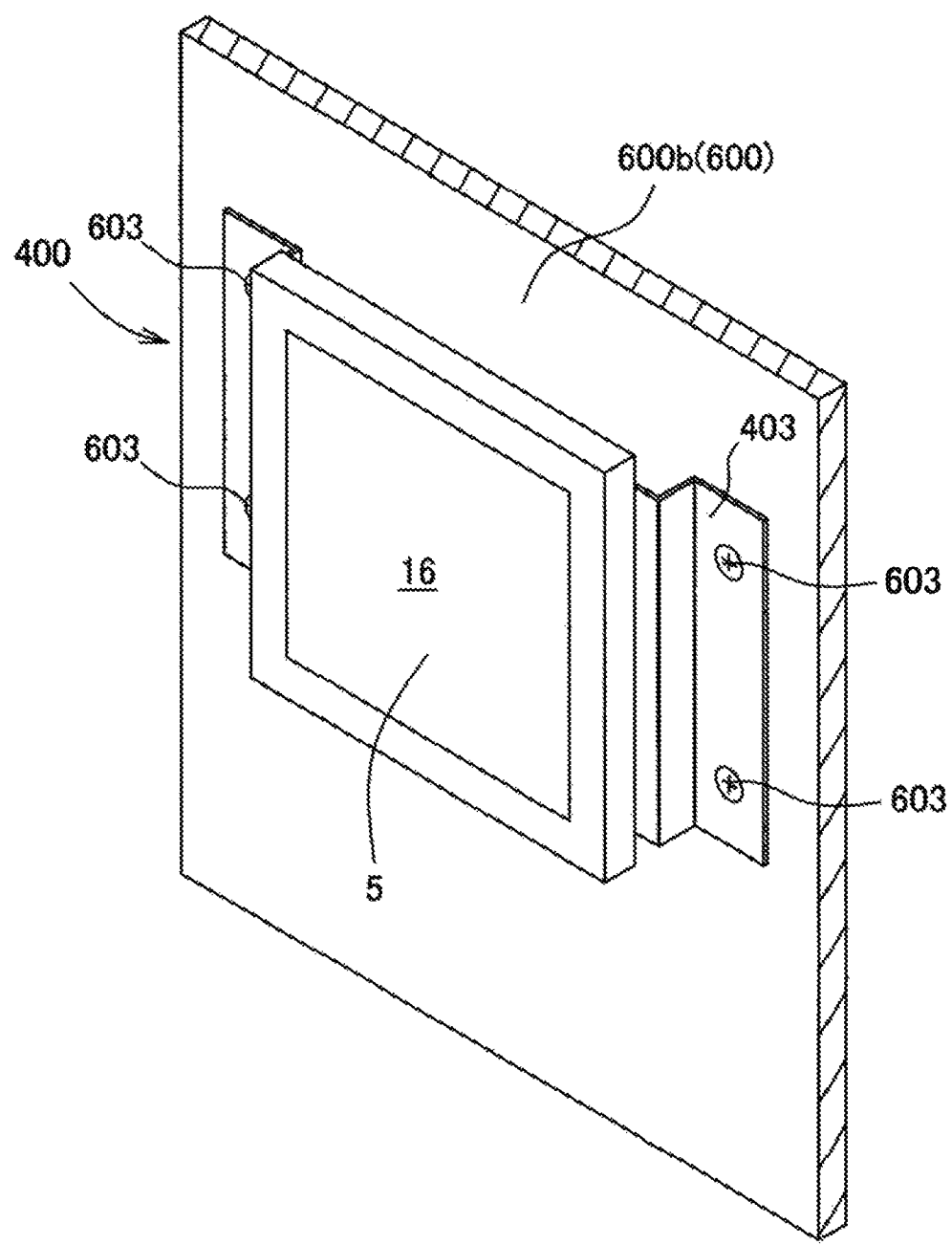
FIG. 36 is a perspective view in a case where the illumination device of FIG. 29 is attached to another wall surface different from that of FIGS. 33A and 33B.

As can be seen from FIGS. 29 and 36, the illumination device 400 according to the fourth embodiment of the present invention is to be attached to a wall surface 600 standing upright with respect to a floor surface, and can be installed on a wall surface 600a (see FIG. 29) having an opening portion 601 or a wall surface 600b (see FIG. 36) not having the opening portion 601.

Figure 30:
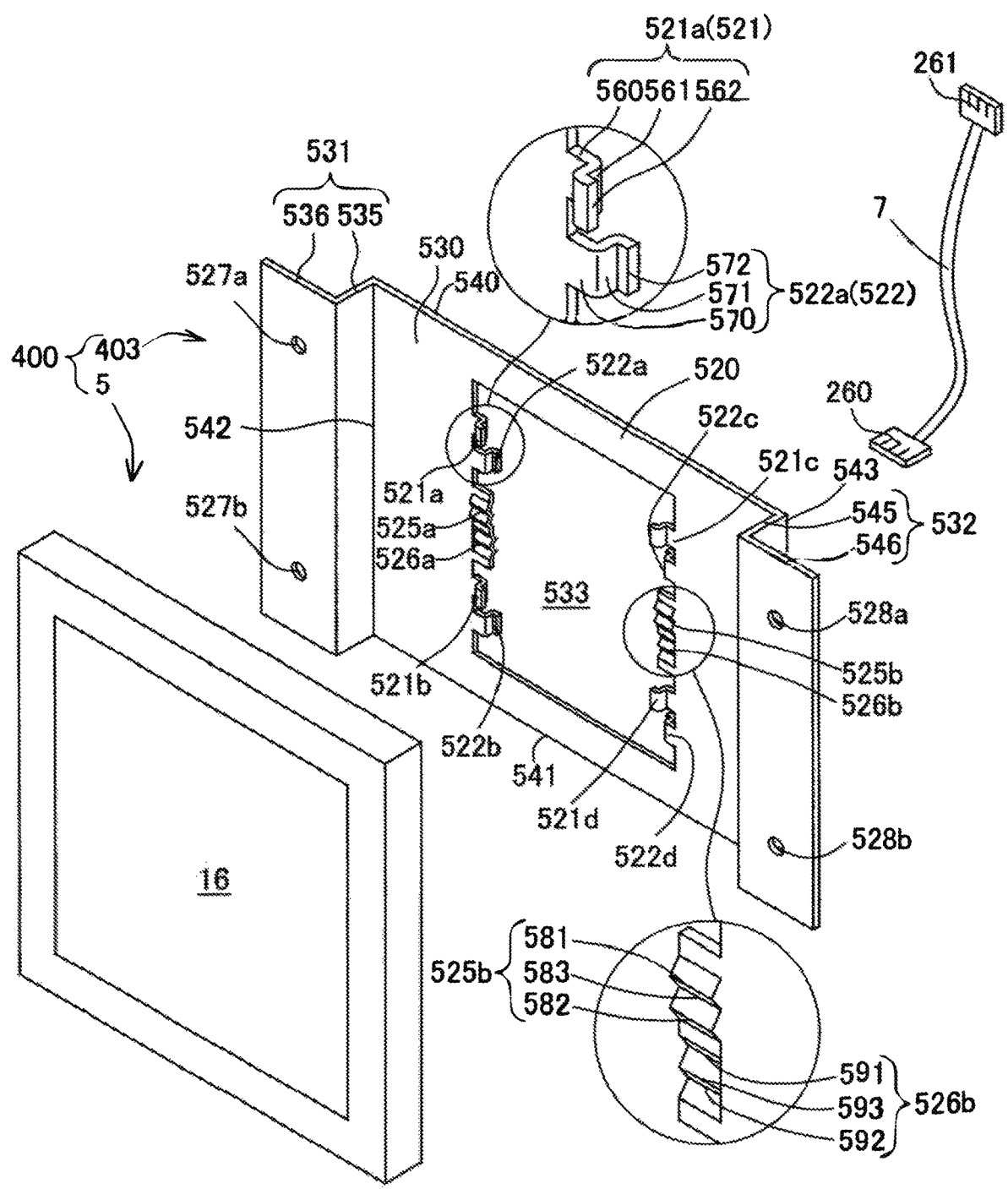
FIG. 30 is an exploded perspective view of the illumination device of FIG. 29.

As shown in FIG. 30, the illumination device 400 has an organic EL panel 5, a holder member 403, and a cable member 7, and the organic EL panel 5 and the holder member 403 are detachable from each other by relatively and sliding the organic EL panel 5 with the holder member 403 attached to the wall surface 600.

One feature of the illumination device 400 of the present embodiment is that the organic EL panel 5 can be attached to each of both front and rear faces of the holder member 403, and a surface of the organic EL panel 5 to be attached can be selected according to the type of the wall surface 600 to be installed with.

The holder member 403 is a mounting member to attach the organic EL panel 5 to the wall surface 600, and the organic EL panel 5 can be attached to both the front and rear faces of the holder member 403. That is, the organic EL panel 5 can be attached to both the front face side (one main surface side) and the rear face side (another main surface side) of the holder member 403 in FIG. 30.

Figure 31:
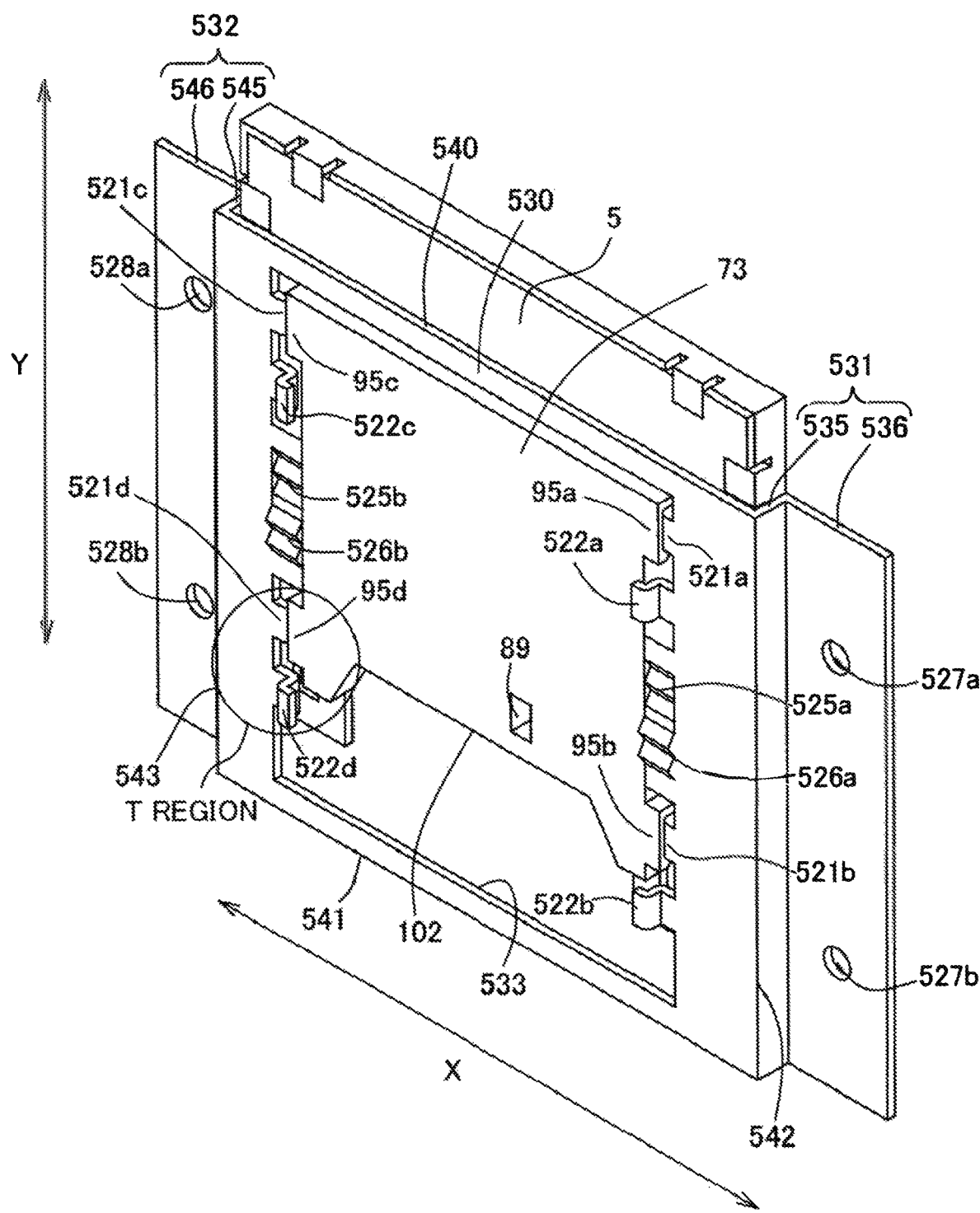
FIG. 31 is a perspective view of the illumination device of FIG. 29 as viewed from another angle.

As can be seen from FIGS. 30 and 31, as main component members, the holder member 403 includes: a holder main body 520; a first holder side engagement part 521 (521a to 521d) (attachment side engagement part); a second holder side engagement part 522 (522a to 522d) (attachment side engagement part); a first holder side locking piece 525 (525a and 525b) (attachment side locking piece); and a second holder side locking piece 526 (526a and 526b) (attachment side locking piece).

As can be seen from FIGS. 30 and 31, the holder main body 520 is a hat-shaped member in a side view, and includes a main body 530, a first fixing part 531, and a second fixing part 532.

The main body 530 is a plate-shaped body having a through hole 533, and has a quadrangular shape in a front view. That is, the main body 530 has two lateral sides 540 and 541 (two opposing sides) opposed to each other in the vertical direction Y, and two vertical sides 542 and 543 opposed to each other in the lateral direction X. In the main body 530, a front face as one main surface and a rear face as another main surface are both flat faces, and are smooth substantially without unevenness. The through hole 533 is a through hole having a quadrangular opening shape and penetrating in a member thickness direction, and is an insertion hole into which a base part 73 of the organic EL panel 5 can be inserted, as can be seen from FIGS. 31 and 37.

The first fixing part 531 is a part to fix the holder main body 520 to the wall surface 600, and forms a leg part of the holder main body 520. As shown in FIG. 30, the first fixing part 531 has an "L" shape in a side view, and is composed of a vertical wall part 535 and a fixing wall part 536.

The vertical wall part 535 is a connecting wall that is bent and stands upright from an end belonging to the vertical side 542 of the holder main body 520, and connects the holder main body 520 and the fixing wall part 536 stepwise.

The fixing wall part 536 is a plate-shaped wall part that is bent and stands upright from an end of the vertical wall part 535, and is parallel to the holder main body 520 in the thickness direction. The fixing wall part 536 has mounting holes 527a and 527b to attach the holder member 403 to the wall surfaces 600a and 600b. The mounting holes 527a and 527b are through holes penetrating in a member thickness direction, and are insertion holes into which a fastening element 603 such as a screw can be inserted, as can be seen from FIGS. 33A, 33B, 38A and 38B.

The second fixing part 532 is a part to fix the holder main body 520 to the wall surface 600 together with the first fixing part 531, and forms a leg part of the holder main body 520. As shown in FIG. 30, the second fixing part 532 is composed of a vertical wall part 545 and a fixing wall part 546.

The vertical wall part 545 is a connecting wall that is bent and stands upright from an end belonging to the vertical side 543 of the holder main body 520, and connects the holder main body 520 and the fixing wall part 546 stepwise.

The fixing wall part 546 is a plate-shaped wall part that is bent and stands upright from an end of the vertical wall part 545, and is parallel to the holder main body 520 in the thickness direction. The fixing wall part 546 has mounting holes 528a and 528b to attach the holder member 403 to the wall surfaces 600a and 600b. Similarly to the mounting holes 527a and 527b, the mounting holes 528a and 528b are through holes penetrating in a member thickness direction, and are insertion holes into which the fastening element 603 such as a screw can be inserted, as shown in FIGS. 33A, 33B, 38A, and 38B.

The first holder side engagement part 521 is a part similar to the holder side engagement part 255 of the second embodiment, is an engaging piece engageable with a raised-side engagement part 95 of a fixing member 15, and is a protruding piece protruding toward the front face side (one side in the thickness direction) with respect to the holder main body 520.

As shown in FIG. 30, the first holder side engagement part 521 is composed of a connecting wall part 560, a vertical wall part 561, and a locking wall part 562, while the connecting wall part 560 and the locking wall part 562 are connected by the vertical wall part 561 with a step.

The connecting wall part 560 is a wall part extending from an opening edge of the through hole 533 of the holder main body 520, and is stepwise continuous with the locking wall part 562 via the vertical wall part 561.

The vertical wall part 561 is a wall part that is bent from an end in an extending direction (thickness direction) of the connecting wall part 560 toward the front face side (one main surface side), and rises with respect to the connecting wall part 560.

The locking wall part 562 is a wall part that is bent in the lateral direction X from an end in a rising direction of the vertical wall part 561, and is parallel to the connecting wall part 560. The locking wall part 562 is connected to the holder main body 520 with a step in the thickness direction Z (front-rear direction).

The second holder side engagement part 522 is an engaging piece engageable with the raised-side engagement part 95 of the fixing member 15, and is a protruding piece protruding toward the rear face side (another side in the thickness direction) with respect to the holder main body 520. The second holder side engagement part 522 is bent from the opening edge of the through hole 533 of the holder main body 520 toward a side opposite to the first holder side engagement part 521, to form a crank shape. That is, the second holder side engagement part 522 is supported in a cantilever manner from the opening edge of the through hole 533, and is also an overhanging piece projecting like eaves from the holder main body 520 toward a center of the through hole 533.

As shown in FIG. 30, the second holder side engagement part 522 is composed of a connecting wall part 570, a vertical wall part 571, and a locking wall part 572, while the connecting wall part 570 and the locking wall part 572 are connected by the vertical wall part 571 with a step.

The connecting wall part 570 is a wall part extending from the opening edge of the through hole 533 of the holder main body 520, and is stepwise continuous with the locking wall part 572 via the vertical wall part 571.

The vertical wall part 571 is a wall part that is bent from an end in an extending direction (thickness direction) of the connecting wall part 570 toward the rear face side (another main surface side), and rises with respect to the connecting wall part 570.

The locking wall part 572 is a wall part that is bent in the lateral direction X from an end in a rising direction of the vertical wall part 571, and is parallel to the connecting wall part 570. The locking wall part 572 is connected to the holder main body 520 with a step in the thickness direction Z (front-rear direction).

The first holder side locking pieces 525a and 525b are parts similar to the holder side locking pieces 256 and 257 of the second embodiment, are supported in a cantilever manner from the opening edge of the through hole 533 of the holder main body 520, and are also overhanging pieces projecting from the holder main body 520 toward a center of the through hole 533. The first holder side locking pieces 525a and 525b are bent in a wave shape in the vertical direction Y, and include holder side protrusions 581 and 582 extending in the lateral direction X. The holder side protrusions 581 and 582 are protrusions protruding toward the front face side (one main surface side), and are arranged aligned with a predetermined interval in the height direction, and side walls of the holder side protrusions 581 and 582 form a holder side recess 583. The holder side recess 583 is an engagement recess engageable with fixing-side locking pieces 92 and 93.

The second holder side locking pieces 526a and 526b are parts that are paired with the first holder side locking pieces 525a and 525b, and regulate a movement of the organic EL panel 5 in a sliding direction with respect to the holder member 403 by engaging with the fixing-side locking pieces 92 and 93. The second holder side locking pieces 526a and 526b are supported in a cantilever manner from the opening edge of the through hole 533 of the holder main body 520, and are also overhanging pieces projecting from the holder main body 520 toward a center of the through hole 533. The second holder side locking pieces 526a and 526b are bent in a wave shape in the vertical direction Y, and formed with holder side protrusions 591 and 592 extending in the lateral direction X.

The holder side protrusions 591 and 592 are protrusions protruding toward the rear face side (another main surface side), and are arranged aligned with a predetermined interval in the height direction, and side walls of the holder side protrusions 591 and 592 form a holder side recess 593. The holder side recess 593 is an engagement recess engageable with the fixing-side locking pieces 92 and 93.

A positional relationship of individual parts of the holder member 403 will be described.

Figure 32:
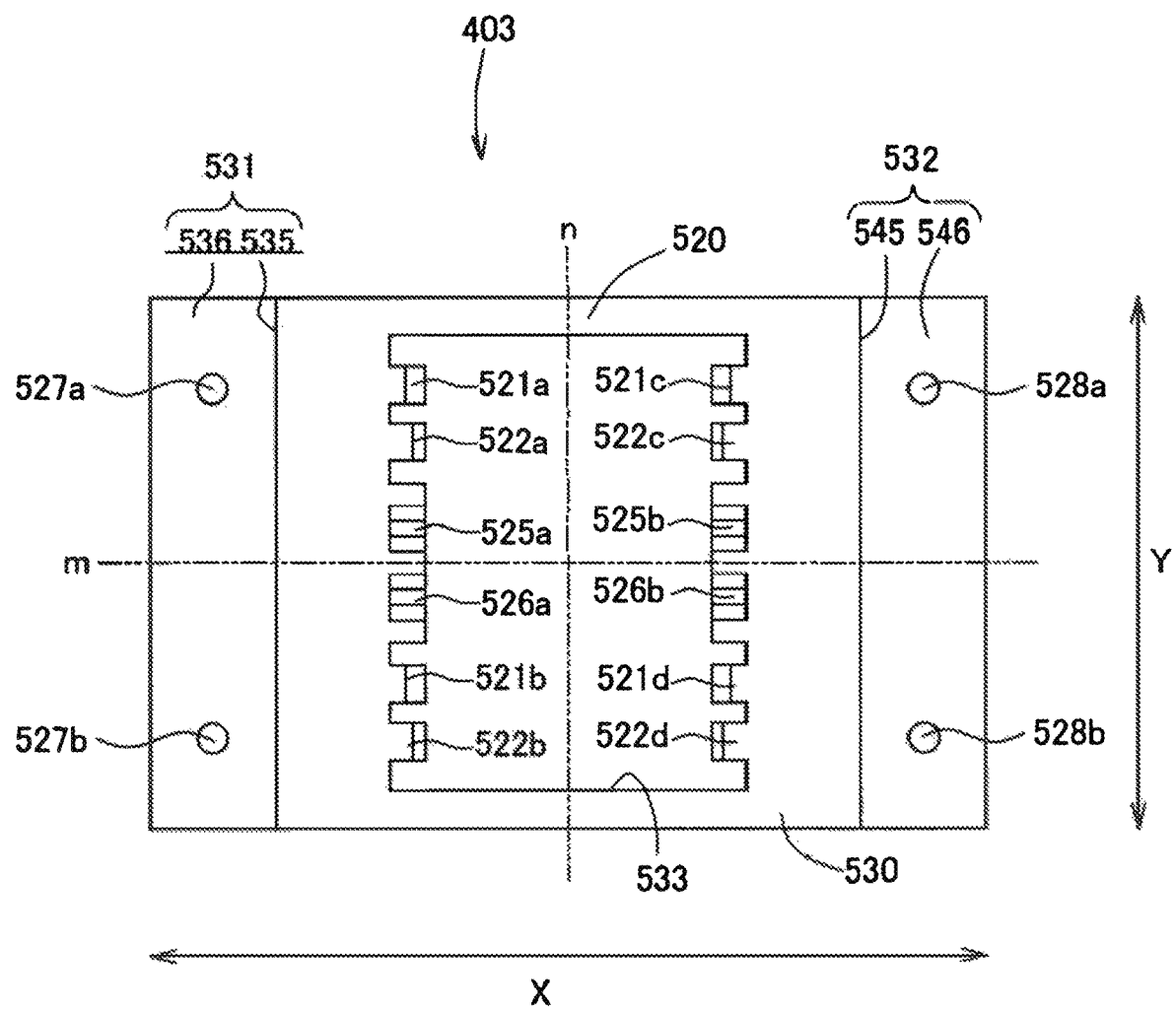
FIG. 32 is a front view of a holder member of FIG. 29.

As shown in FIG. 32, the holder member 403 has the through hole 533 formed in a center of the holder main body 520 in the lateral direction X, and each of mounting holes 527a and 527b and mounting holes 528a and 528b is disposed outward from the through hole 533.

Each of the holder side engagement parts 521 and 522 and the holder side locking pieces 525 and 526 extends from an edge of the opening edge of the through hole 533 toward a center in the lateral direction X. Specifically, the first holder side engagement parts 521a and 521b and the first holder side engagement parts 521c and 521d extend in directions respectively approaching each other (inward direction) in the lateral direction X on the front face side, while the second holder side engagement parts 522a and 522b and the second holder side engagement parts 522c, 522d extend in directions respectively approaching each other (inward direction) on the rear face side. Similarly, the first holder side locking pieces 525a and 525b extend in directions approaching each other (inward direction) in the lateral direction X on the front face side, while the second holder side locking pieces 526a and 526b extend in directions approaching each other (inward direction) on the rear face side.

In the holder member 403, the holder side locking pieces 525 and 526 are provided in a center in the vertical direction Y, and the first holder side locking piece 525a and the second holder side locking piece 526a are arranged adjacent to each other in a center, while the first holder side locking piece 525b and the second holder side locking piece 526b are arranged adjacent to each other in a center. The first holder side engagement parts 521a to 521d and the second holder side engagement parts 522a to 522d are both provided outward from the first holder side locking pieces 525a and 525b and the second holder side locking pieces 526a and 526b, and are alternately arranged in the vertical direction Y.

Specifically, in the holder member 403, at the opening edge on one side in the lateral direction X of the through hole 533, the first holder side engagement part 521a, the second holder side engagement part 522a, the first holder side locking piece 525a, the second holder side locking piece 526a, the first holder side engagement part 521b, and the second holder side engagement part 522b are arranged in this order from one side (upper side) toward another side (lower side) in the vertical direction Y. Similarly, in the holder member 403, at an opening edge on an opposite side in the lateral direction X of the through hole 533, the first holder side engagement part 521c, the second holder side engagement part 522c, the first holder side locking piece 525b, the second holder side locking piece 526b, the first holder side engagement part 521d, and the second holder side engagement part 522d are arranged in this order from one side (upper side) toward another side (lower side) in the vertical direction Y.

In a front view, the holder member 403 is vertically line-symmetrical with respect to a virtual line m passing through the center in the vertical direction Y, as a reference. That is, a distance from the first holder side engagement parts 521a and 521b to the first holder side locking piece 525a is equal to a distance from the second holder side engagement parts 522a and 522b to the second holder side locking piece 526a. A distance from the first holder side engagement parts 521c and 521d to the first holder side locking piece 525b is equal to a distance from the second holder side engagement parts 522c and 522d to the second holder side locking piece 526b. In a front view, the holder member 403 is laterally line-symmetrical with respect to a virtual line n passing through the center in the lateral direction X, as a reference.

Next, a positional relationship of individual members will be described according to an assembling procedure of the illumination device 400 of the fourth embodiment of the present invention. First, for convenience of explanation, a case of installation to the wall surface 600a having the opening portion 601 as shown in FIG. 29 will be described.

Figure 33A:
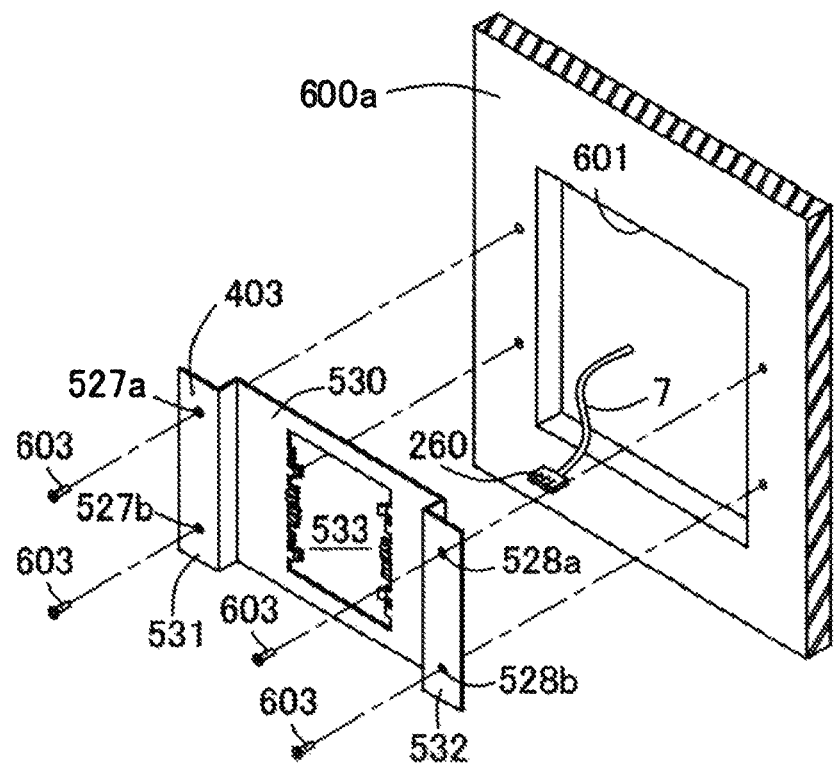
Figure 33B:
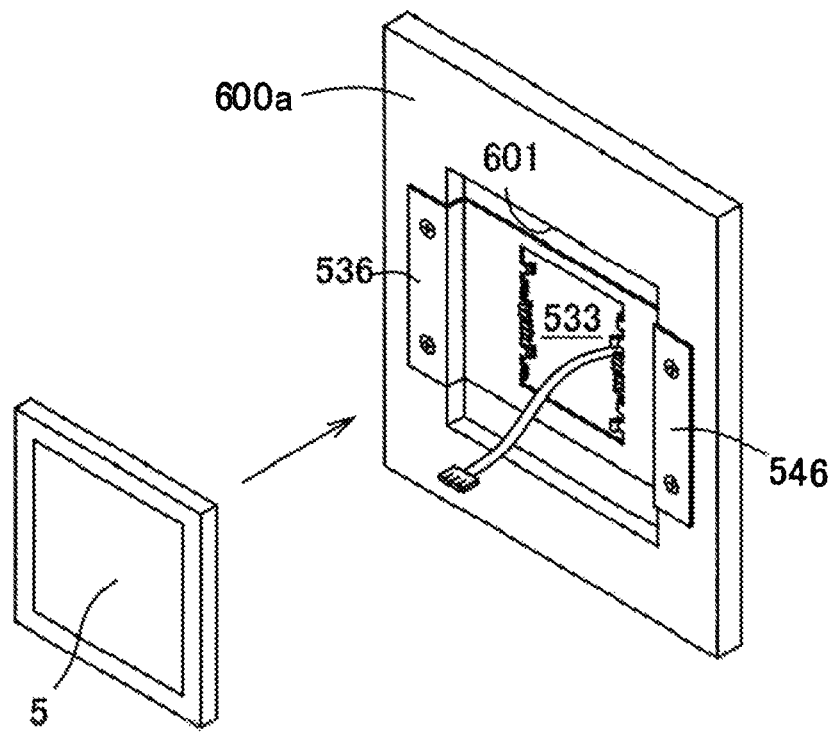

As can be seen from FIGS. 33A and 33B, the fastening element 603 is inserted from the front face side of the mounting holes 527 and 528, to attach the holder member 403 to the opening portion 601 of the wall surface 600a.

At this time, a connector portion 260 of the cable member 7 is passing through the through hole 533 and projects to the front face side. The main body 530 of the holder member 403 is recessed inside the opening portion 601 and enters the rear face side with respect to the wall surface 600a. Fixing wall parts 536 and 546 of the holder member 403 are in surface contact with the wall surface 600a. A length in the vertical direction of the holder member 403 is smaller than a length in the vertical direction of the opening portion 601.

Next, the base part 73 is inserted into the through hole 533 and slid to the lower side in the vertical direction Y, which is one direction of the spreading direction of the emission surface 16, with the second raised part 82 fitted into the through hole 533, and the raised-side engagement part 95 is engaged with the first holder side engagement part 521.

Figure 34A:
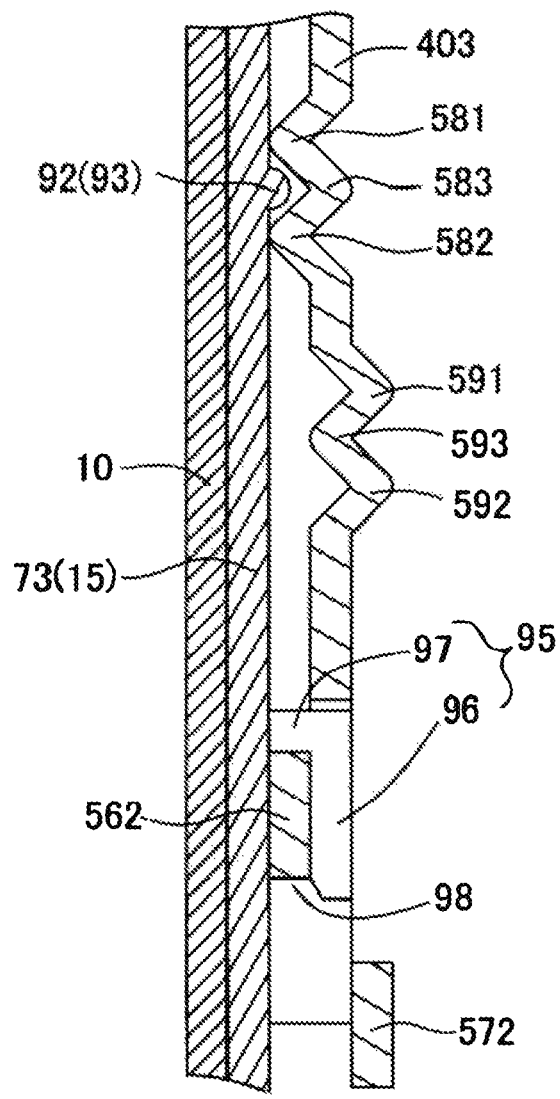
Figure 34B:
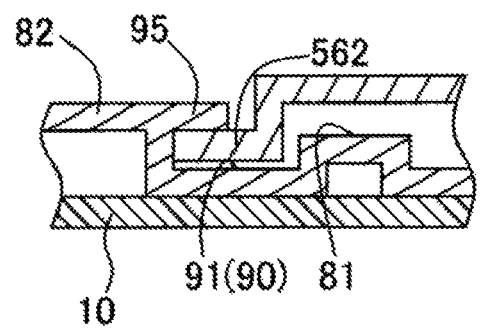
Figure 35:
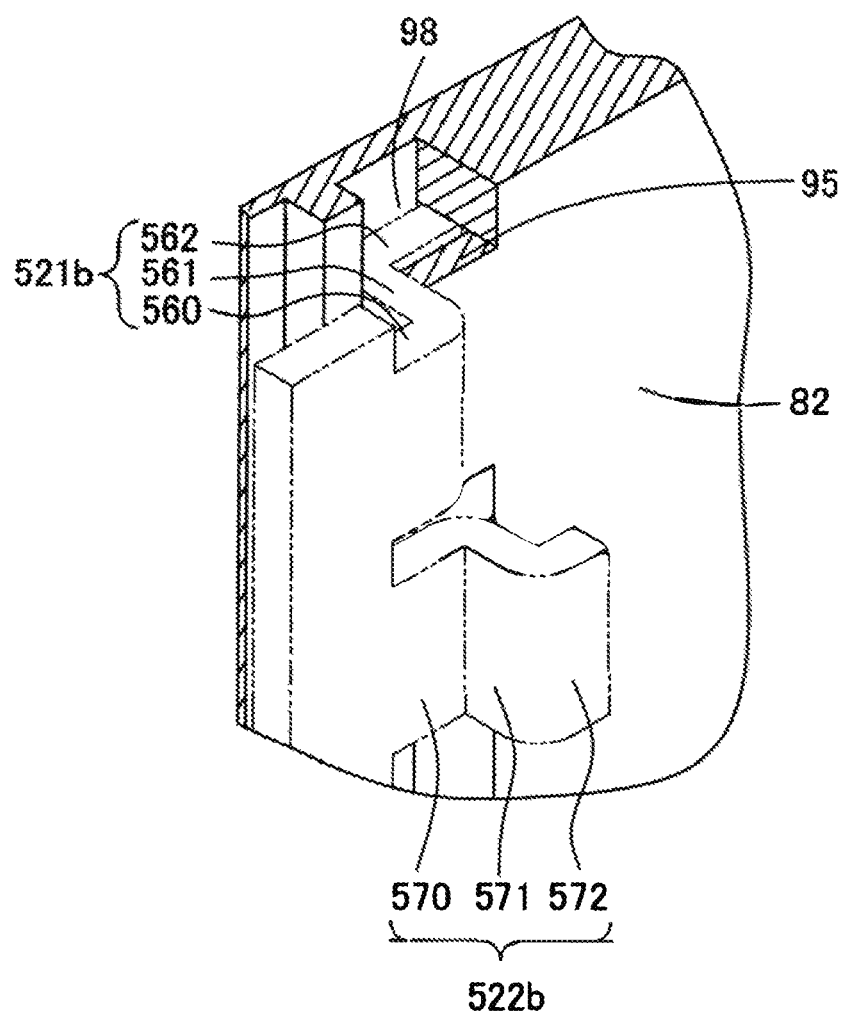
FIG. 35 is a partially broken perspective view focusing on a T region of FIG. 31.

At this time, as can be seen in FIGS. 34A, 34B, and 35, the locking wall part 562 of the first holder side engagement part 521 is inserted into an insertion space 98 of a rear face side cover 70, and each locking wall part 562 regulates a movement of the organic EL panel 5 in an overlapping direction (thickness direction) and the sliding direction (vertical direction) with respect to the holder member 403. The first holder side locking pieces 525a and 525b of the holder member 403 are engaged with the fixing-side locking pieces 92 and 93 of the organic EL panel 5, and the movement in the sliding direction is regulated. That is, the fixing-side locking pieces 92 and 93 are fitted into the holder side recess 583 of the first holder side locking pieces 525a and 525b, and sandwiched between the holder side protrusions 581 and 582 forming side walls of the holder side recess 583. Therefore, a movement of the fixing-side locking piece 92 (93) in the sliding direction is regulated by the holder side protrusions 581 and 582.

A surface of the organic EL panel 5 on the emission surface 16 side is flush with the front face (a surface not touching the wall surface 600a) of the fixing wall parts 536 and 546 of the holder member 403, and forms a virtual plane identical to a front face of the fixing wall parts 536 and 546.

As can be seen from FIG. 31, in the holder member 403, the lateral sides 540 and 541 of the main body 530 are concealed by overlapping with the organic EL panel 5 in a front view. That is, the overall length in the vertical direction of the organic EL panel 5 is longer than the overall length in the vertical direction of the holder member 403, and both ends of the organic EL panel 5 in the vertical direction project from the main body 530 of the holder member 403. On the other hand, a part of the fixing wall parts 536 and 546 of the fixing parts 531 and 532 is in an exposed location from the organic EL panel 5, and the fastening element 603 is exposed to outside. That is, the illumination device 400 can be detached from the wall surface 600a with the organic EL panel 5 attached to the holder member 403.

For detaching the organic EL panel 5, the organic EL panel 5 is slid to the upper side in the vertical direction Y with respect to the holder member 403 and detached. That is, by sliding the organic EL panel 5 in the direction opposite to that at a time of attachment to the holder member 403, releasing the engagement state between the first holder side engagement parts 521a to 521d and raised-side engagement parts 95a to 95d, and pulling out the base part 73 from the through hole 533, the organic EL panel 5 is detached from the holder member 403.

Next, a case of installation to the wall surface 600b not having the opening portion 601 as shown in FIG. 36 will be described.

Figure 38A:
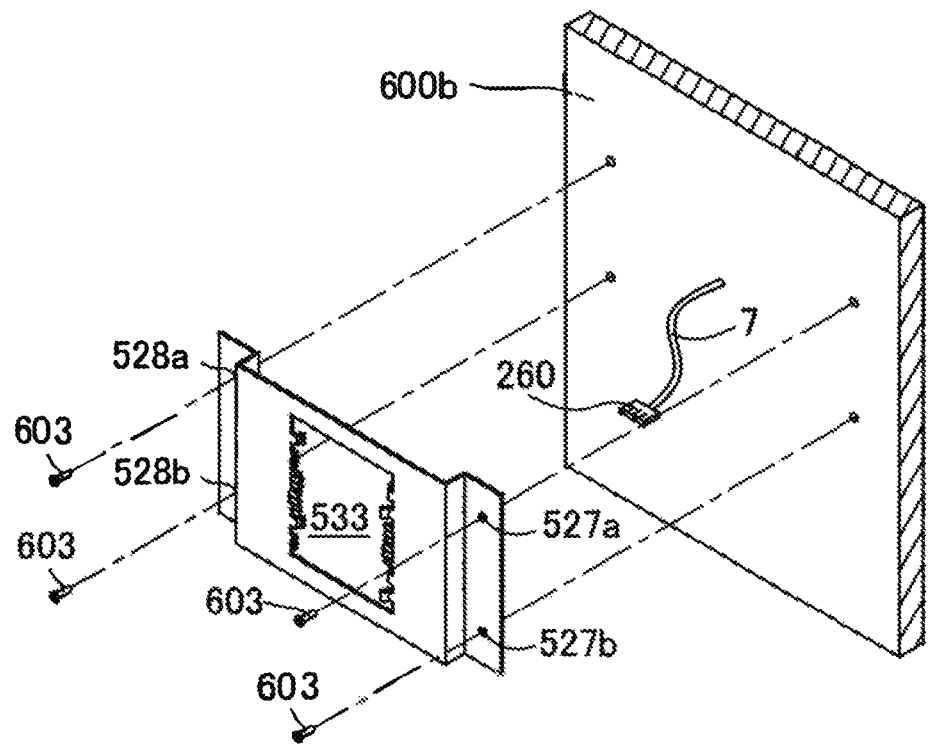
Figure 38B:
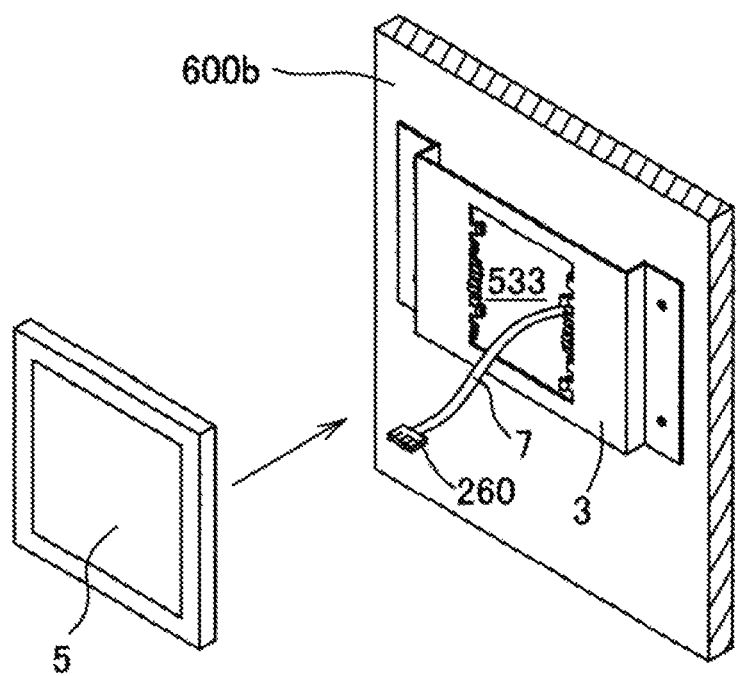

First, as can be seen from FIGS. 38A and 38B, the fastening element 603 is inserted through the mounting holes 527 and 528, and the holder member 403 is attached to the wall surface 600b.

At this time, the main body 530 of the holder member 403 protrudes with a step with respect to the wall surface 600b, and is parallel to the wall surface 600b.

Next, the base part 73 is inserted into the through hole 533 and slid to the lower side in the vertical direction Y with the second raised part 82 fitted into the through hole 533, and the raised-side engagement part 95 is engaged with the second holder side engagement part 522.

Figure 37:
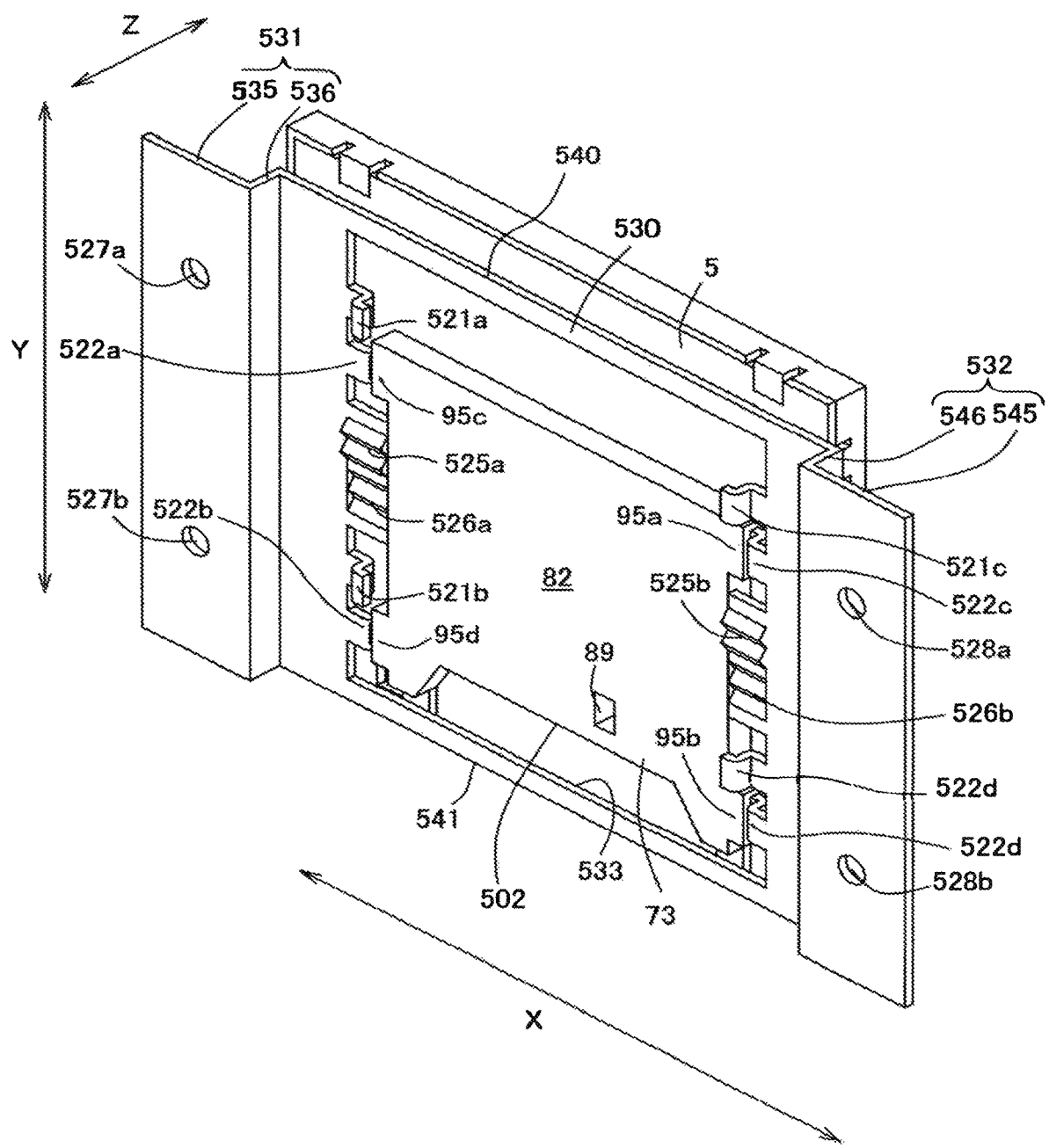
FIG. 37 is a perspective view of the illumination device of FIG. 36 as viewed from another angle.
Figure 39:
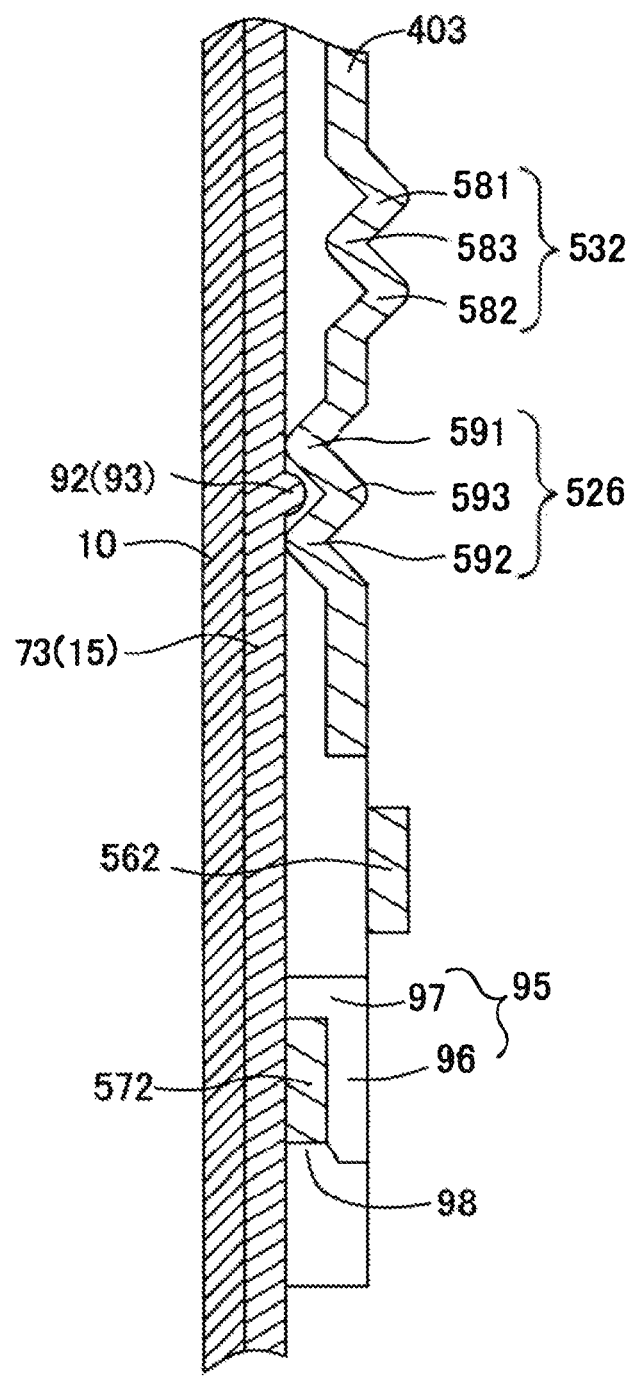
FIG. 39 is an explanatory view focusing on a relationship of a main part of the illumination device in FIG. 36, and is a cross-sectional view of the main part.

At this time, as can be seen in FIGS. 37 and 39, the locking wall part 572 of the second holder side engagement part 522 is inserted into the insertion space 98 of the rear face side cover 70, and each locking wall part 572 regulates a movement of the organic EL panel 5 in an overlapping direction (thickness direction) and a sliding direction (vertical direction) with respect to the holder member 403. The second holder side locking pieces 526a and 526b of the holder member 403 are engaged with the fixing-side locking pieces 92 and 93 of the organic EL panel 5, and the movement in the sliding direction (vertical direction) is regulated. The fixing-side locking pieces 92 and 93 are fitted into each holder side recess 593 and are sandwiched between the holder side protrusions 591 and 592 forming side walls of the holder side recess 593. Therefore, a movement of the fixing-side locking pieces 92 and 93 in the sliding direction is regulated by the holder side protrusions 591 and 592.

As shown in FIG. 36, in the holder member 403, the lateral sides 540 and 541 of the main body 530 are concealed by overlapping with the organic EL panel 5 in a front view. In other words, both ends of the organic EL panel 5 in the vertical direction project from the main body 530 of the holder member 403.

A part or whole of the fixing wall parts 536 and 546 of the fixing parts 531 and 532 is in an exposed location from the organic EL panel 5, and the fastening element 603 is exposed to outside. That is, the illumination device 400 can be detached from the wall surface 600b with the organic EL panel 5 attached to the holder member 403.

According to the illumination device 400 of the present embodiment, by engaging the raised-side engagement part 95 of the organic EL panel 5 with the first holder side engagement part 521 of the holder member 403, the organic EL panel 5 can be fixed to one main surface side of the main body 530 of the holder member 403. On the other hand, by engaging the raised-side engagement part 95 of the organic EL panel 5 with the second holder side engagement part 522, the organic EL panel 5 can be fixed to another main surface side of the main body 530 of the holder member 403. That is, the organic EL panel 5 can be attached to each of the front face side and the rear face side of the holder member 403, and the organic EL panel 5 can be installed even on the wall surface 600a having the opening portion 601 or on the wall surface 600b not having the opening portion 601.

In the first embodiment described above, the box member 171 is inserted into and fixed to the opening portion 301 of the wall surface 300, but the present invention is not limited thereto. The organic EL module 2 may be fixed to the wall surface 300 by directly fixing the holder member 170 to the wall surface 300 with the fastening element as in the illumination device of the second embodiment.

Figure 40:
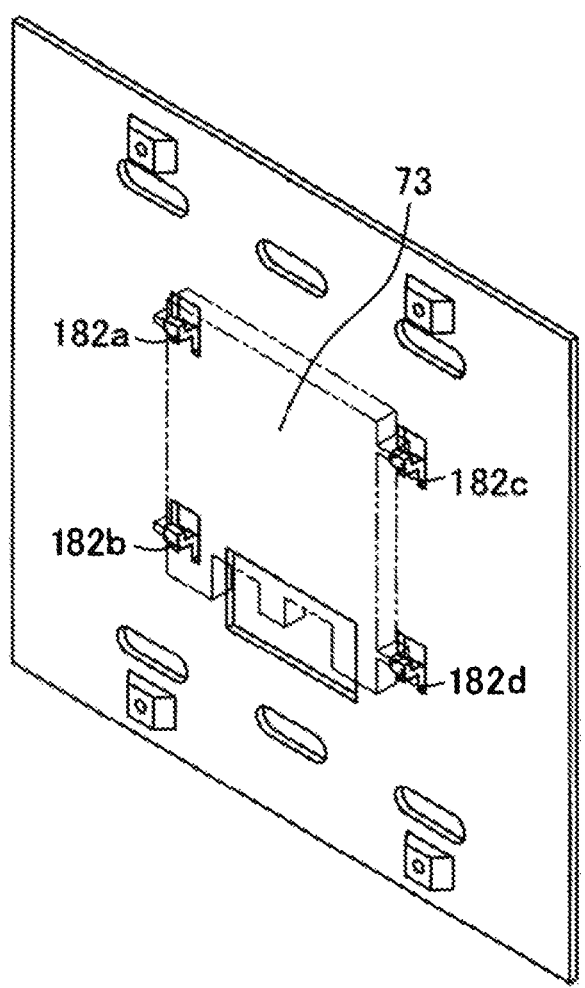
FIG. 40 is a perspective view showing an application example of another embodiment of the present invention.

In the first embodiment described above, the holder side engagement parts 182a to 182d extend inward in the lateral direction in a rear view, but the present invention is not limited thereto. As shown in FIG. 40, the holder side engagement parts 182a to 182d may extend in the vertical direction Y.

In the embodiment described above, the connector notch 102 is provided in the base part 73 to expose the connecting connector portions 31 and 32 to outside the base part 73, but the present invention is not limited thereto. A connector through hole may be provided in the base part 73 so as to expose the connecting connector portions 31 and 32 to outside the base part 73.

In the embodiment described above, the illumination device is attached to the wall surface 300 of the wall standing upright with respect to a floor surface, but the present invention is not limited thereto. The wall surface 300 may be a wall surface forming a floor or may be a wall surface forming a ceiling.

In the embodiment described above, the raised-side engagement parts 95a to 95d and the holder side engagement parts 182a to 182d are engaged in the vertical direction to attach the organic EL panel 5 to the attachment unit 3, but the present invention is not limited thereto. The raised-side engagement parts 95a to 95d and the holder side engagement parts 182a to 182d may be engaged in the lateral direction to attach the organic EL panel 5 to the attachment unit 3.

Figure 41:
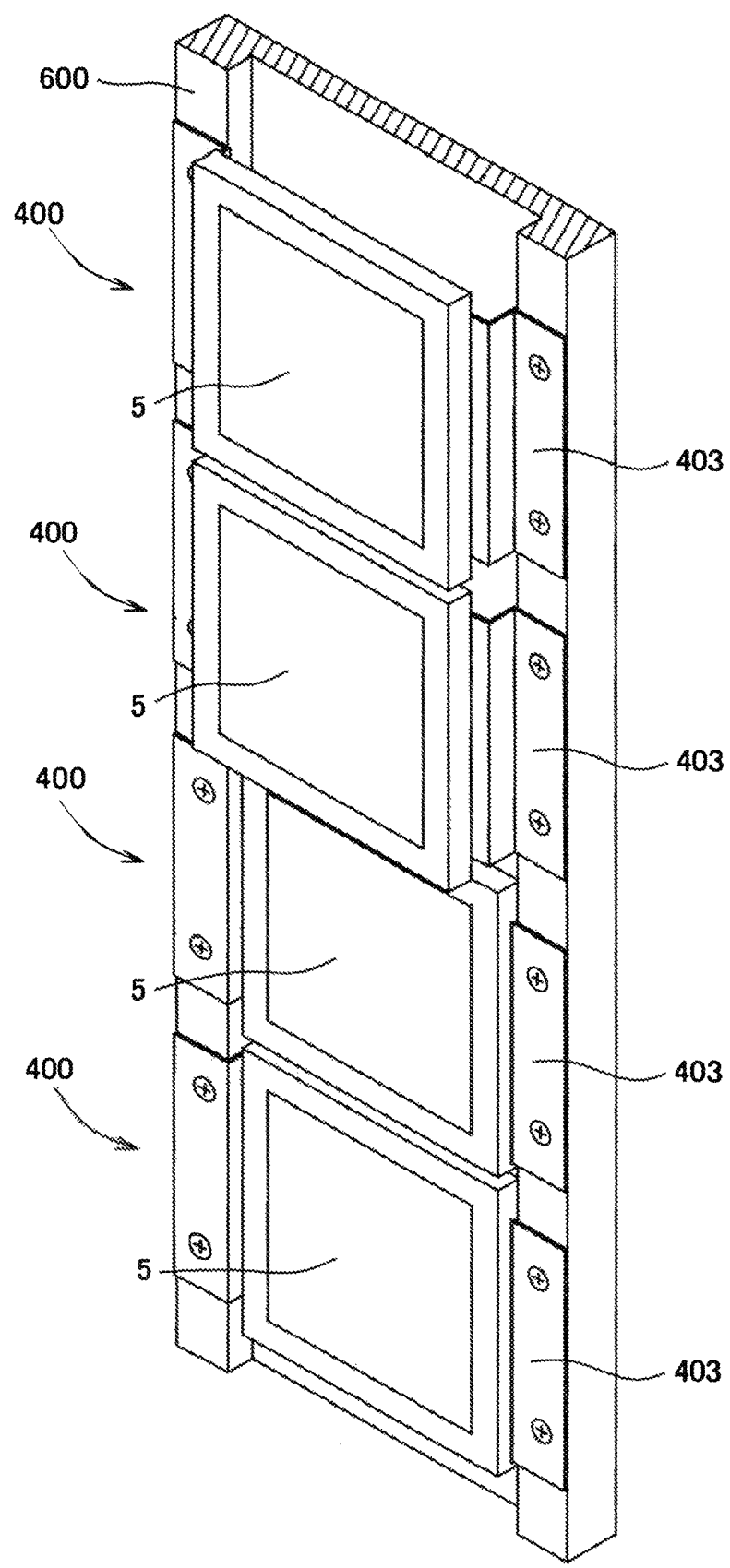
FIG. 41 is a perspective view showing an application example of another embodiment of the present invention.
Figure 42:
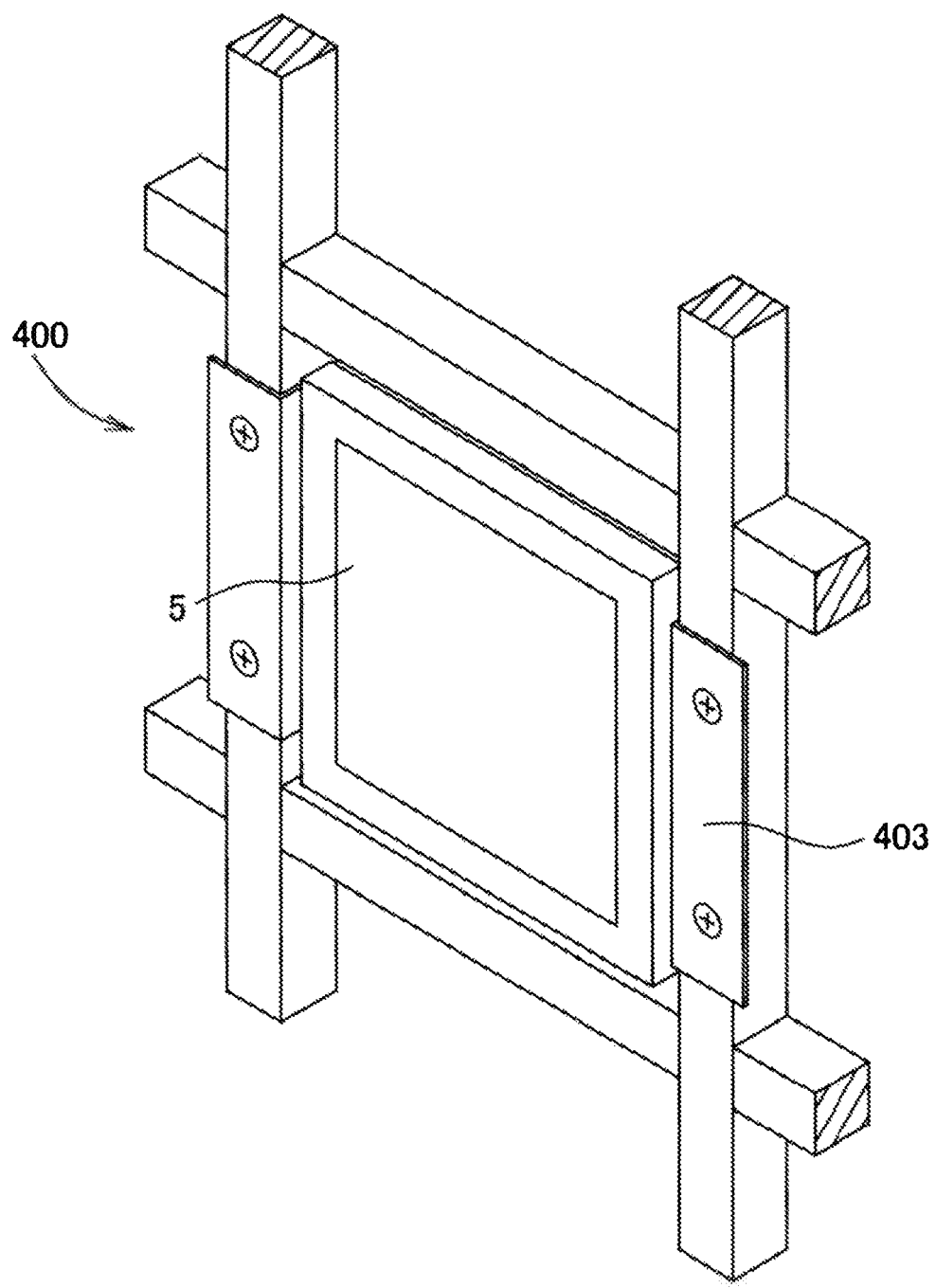
FIG. 42 is a perspective view showing a main part of another embodiment of the present invention.
Figure 43A:
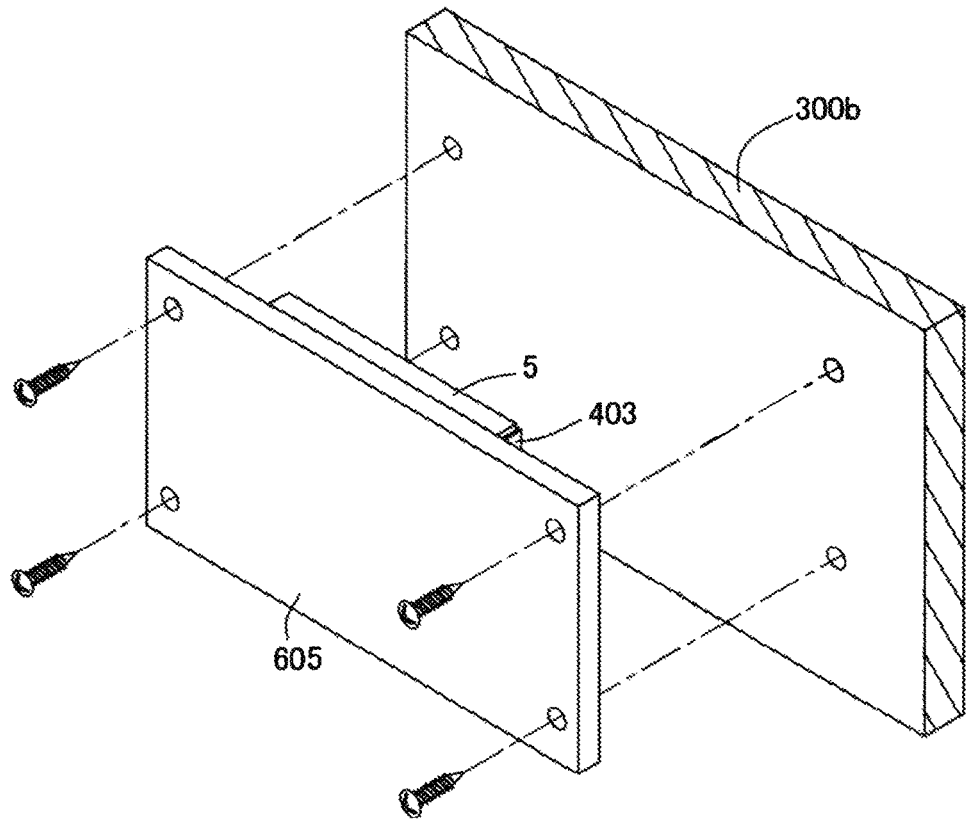
Figure 43B:
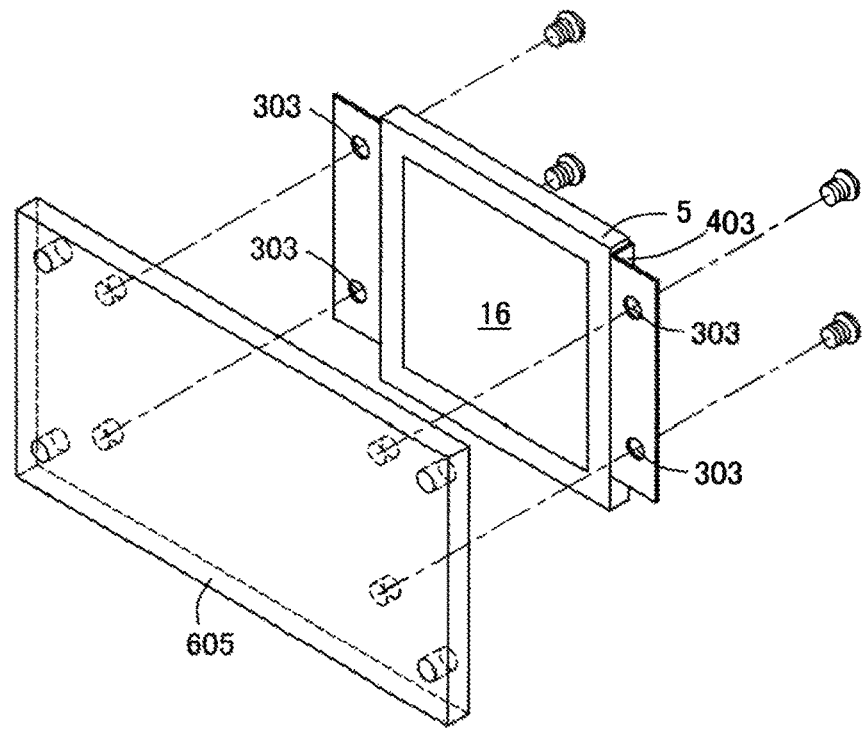

In the fourth embodiment described above, a case where the illumination device 400 is attached to the quadrangular opening portion is described, but the present invention is not limited thereto. The illumination device 400 may be attached to a groove part as shown in FIG. 41. In this case, a plurality of illumination devices 400 are preferably arranged aligned along the groove part. Further, as shown in FIG. 42, the illumination device 400 may be attached to a crosspiece arranged in a lattice pattern. Further, as shown in FIGS. 43A and 43B, it is possible to provide a decorative plate 605 having light transmittance in a light emission direction, attach an illumination device to the decorative plate 605, and attach the illumination device to the wall surface 300b via the decorative plate 605. In this case, light emitted from the organic EL panel 5 passes through the decorative plate 605 to be emitted outwards.

In each of the above-described embodiments, each component member can be freely exchanged or added between the individual embodiments within the technical scope of the present invention.

EXPLANATION OF REFERENCE CHARACTERS 1, 250, 280, 400: illumination device
5: organic EL panel
10: panel body
11: circuit board
15: fixing member
16: emission surface
31, 32: connecting connector portion
36: control switching part
72, 530: main body
73: base part (raised part)
81: first raised part
82: second raised part
89: switching hole (switching through hole)
90, 91: slide groove
92, 93: fixing-side locking piece (panel side locking piece)
95, 95a to 95d: raised-side engagement part
102: connector notch
170, 252, 281, 403: holder member (mounting member)
180, 253, 282, 520: holder main body (attachment side main body)
182, 182a to 182d, 255, 255a to 255d: holder side engagement part (attachment side engagement part)
183, 184, 256, 257: holder side locking piece (attachment side locking piece)
270, 533: through hole
300, 600, 600a, 600b: wall surface
521a to 521d: first holder side engagement part (attachment side engagement part)
522a to 522d: second holder side engagement part (attachment side engagement part)
525a, 525b: first holder side locking piece (attachment side locking piece)
526a, 526b: second holder side locking piece (attachment side locking piece)
535, 545: vertical wall part
536, 546: fixing wall part
540, 541: lateral side (two opposing sides)

The invention claimed is:
1. An illumination device comprising:
an organic EL panel; and
a mounting member configured to attach the organic EL panel to a wall surface,
the organic EL panel being attachable to and detachable from the mounting member, wherein the organic EL panel comprises:
a panel body having an emission surface on its front face side and a circuit board on its rear face side; and
a fixing member having a rear face side cover, the rear face side cover including a main body and a raised part,
wherein a central part of the rear face side cover including the raised part protrudes toward the rear face side in a side view,
wherein the raised part is disposed on the rear face side of the organic EL panel and raised from the main body to circumvent the circuit board and to protect a part or whole of the circuit board,
wherein the raised part includes at least two raised-side engagement parts protruding in a direction crossing a raised direction of the raised part, the two raised-side engagement parts protruding in a direction away from each other,
wherein the mounting member includes:
an attachment side main body; and
at least a first attachment side engagement part and a second attachment side engagement part extending from the attachment side main body to form a step with respect to the attachment side main body, the first attachment side engagement part and the second attachment side engagement part extending in a direction approaching each other, and
wherein when the organic EL panel is attached to the mounting member, the organic EL panel is configured to be slid relatively to the mounting member in a spreading direction of the emission surface, with the raised part between the first attachment side engagement part and the second attachment side engagement part, to engage the two raised-side engagement parts with the first attachment side engagement part and the second attachment side engagement part.

2. The illumination device according to claim 1,
wherein the mounting member includes: the attachment side main body; and at least first attachment side engagement part and the second attachment side engagement part,
the first attachment side engagement part extending from the attachment side main body to form a step on a first main surface side of the attachment side main body,
the second attachment side engagement part extending from the attachment side main body to form a step on a second main surface side of the attachment side main body,
wherein the two raised-side engagement parts comprise a first raised-side engagement part and a second raised-side engagement part, and
wherein the mounting member engages the first raised-side engagement part with the first attachment side engagement part to fix the organic EL panel to the first main surface side whereas the mounting member engages the second raised-side engagement part with the second attachment side engagement part to fix the organic EL panel to the second main surface side.

3. The illumination device according to claim 1,
wherein the raised part includes: a first raised part and a second raised part; and a slide groove,
the first raised part being stepwise continuous with the second raised part,
the slide groove being at a boundary portion between the first raised part and the second raised part,
wherein the two raised-side engagement parts project from the second raised part toward the slide groove, and
wherein when the organic EL panel is attached to the mounting member, a part of the attachment side engagement part is disposed in the slide groove to move along the slide groove.

4. The illumination device according to claim 2, wherein when the organic EL panel is fixed to the first main surface side of the attachment side main body, the organic EL panel is slid relatively to the mounting member in the spreading direction of the emission surface to engage the first raised-side engagement part with the first attachment side engagement part.

5. The illumination device according to claim 1,
wherein the mounting member includes an attachment side locking piece,
wherein the raised part includes a slide groove having a panel side locking piece that extends in a direction crossing an extending direction of the slide groove, and
wherein the attachment side locking piece engages with the panel side locking piece to regulate a movement of the organic EL panel in the extending direction of the slide groove.

6. The illumination device according to claim 1,
wherein the circuit board includes a control switching part having a function of switching at least two types of control signals,
wherein the raised part includes a switching through hole, and
wherein the control switching part is in an exposed location from the switching through hole to allow switching of the two types of control signals from outside the organic EL panel.

7. The illumination device according to claim 1,
wherein the raised part includes at least two of the raised-side engagement parts,
wherein the mounting member includes at least the first attachment side engagement part and the second attachment side engagement part,
wherein the attachment side main body includes a first through hole,
wherein the first attachment side engagement part and the second attachment side engagement part are provided along an opening of the first through hole, and extend from the opening of the first through hole to an inside thereof when the opening of the first through hole is viewed in a plan view, and
wherein the raised part is inserted into the first through hole while the first [attachment side engagement part and the second attachment side engagement part are engaged with the two raised-side engagement parts.

8. The illumination device according to claim 1, wherein the raised part includes at least two of the raised-side engagement parts, the two raised-side engagement parts being parallel to the emission surface.

9. The illumination device according to claim 1, wherein the fixing member has an electrical insulation property.

10. The illumination device according to claim 1,
wherein the organic EL panel includes an organic EL element,
wherein the circuit board includes a connector portion electrically connected to the organic EL element,
wherein the raised part includes a connector notch or a connector through hole, and wherein the connector portion is in an exposed location from the connector notch or an opening of the connector through hole, the connector notch or the opening of the connector through hole being located on the raised part.

11. The illumination device according to claim 1,
wherein the attachment side main body has two sides, the two sides facing to each other in a sliding direction of the organic EL panel, and
wherein when the organic EL panel is viewed in a front view with the raised-side engagement parts engaged with the first attachment side engagement part and the second attachment side engagement part, the two sides overlap with the organic EL panel.

12. The illumination device according to claim 1,
wherein the mounting member includes: the attachment side main body; a vertical wall part; and a fixing wall part,
wherein the attachment side main body has a plate shape,
wherein the fixing wall part is provided on a first main surface side of the attachment side main body, the fixing wall part being continuous with the attachment side main body through a step composed of the vertical wall part, and
wherein when the organic EL panel is fixed to the first main surface side, the fixing wall part forms a virtual plane identical to a surface on a side of the emission surface of the organic EL panel.

13. An illumination device comprising:
an organic EL panel; and
a mounting member configured to attach the organic EL panel to a wall surface,
   the organic EL panel being attachable to and detachable from the mounting member,
   wherein the organic EL panel comprises:
      a panel body having an emission surface on its front face side and a circuit board on its rear face side; and
      a fixing member having a main body and a raised part,
      wherein the raised part is disposed on a rear face side of the organic EL panel and raised from the main body to circumvent the circuit board and to protect a part or whole of the circuit board,
      wherein the raised part includes a raised-side engagement part protruding in a direction crossing a raised direction,
      wherein the mounting member includes:
         an attachment side main body; and
         an attachment side engagement part extending from the attachment side main body to form a step with respect to the attachment side main body, and
         wherein the raised-side engagement part is engaged with the attachment side engagement part when the organic EL panel is attached to the mounting member,
wherein the circuit board includes a control switching part having a function of switching at least two types of control signals,
wherein the raised part includes a switching through hole, and
wherein the control switching part is in an exposed location from the switching through hole to allow switching of the two types of control signals from outside the organic EL panel.

14. An illumination device comprising:
an organic EL panel; and
a mounting member configured to attach the organic EL panel to a wall surface,
   the organic EL panel being attachable to and detachable from the mounting member,
   wherein the organic EL panel comprises:
      a panel body having an emission surface on its front face side and a circuit board on its rear face side; and
      a fixing member having a main body and a raised part,
      wherein the raised part is disposed on a rear face side of the organic EL panel and raised from the main body to circumvent the circuit board and to protect a part or whole of the circuit board,
      wherein the raised part includes a raised-side engagement part protruding in a direction crossing a raised direction,
      wherein the mounting member includes:
         an attachment side main body; and
         an attachment side engagement part extending from the attachment side main body to form a step with respect to the attachment side main body, and
         wherein the raised-side engagement part is engaged with the attachment side engagement part when the organic EL panel is attached to the mounting member,
wherein the attachment side main body has two sides, the two sides facing to each other in a sliding direction of the organic EL panel, and
wherein when the organic EL panel is viewed in a front view with the raised-side engagement part engaged with the attachment side engagement part, the two sides overlap with the organic EL panel.

* * * * *